US009260290B2

(12) United States Patent
Quevy et al.

(10) Patent No.: US 9,260,290 B2
(45) Date of Patent: Feb. 16, 2016

(54) TECHNIQUE FOR FORMING A MEMS DEVICE

(71) Applicant: Silicon Laboratories Inc., Austin, TX (US)

(72) Inventors: Emmanuel P. Quevy, El Cerrito, CA (US); Carrie W. Low, Union City, CA (US); Jeremy Ryan Hui, Mountain View, CA (US); Zhen Gu, Cupertino, CA (US)

(73) Assignee: Silicon Laboratories Inc., Austin, TX (US)

( * ) Notice: Subject to any disclaimer, the term of this patent is extended or adjusted under 35 U.S.C. 154(b) by 8 days.

(21) Appl. No.: 14/494,688

(22) Filed: Sep. 24, 2014

(65) Prior Publication Data
US 2015/0008545 A1 Jan. 8, 2015

Related U.S. Application Data

(62) Division of application No. 13/075,800, filed on Mar. 30, 2011, now Pat. No. 8,852,984.

(51) Int. Cl.
*B81B 3/00* (2006.01)
*B81C 1/00* (2006.01)
*G01C 19/5712* (2012.01)

(52) U.S. Cl.
CPC ........... *B81B 3/0062* (2013.01); *B81C 1/00246* (2013.01); *G01C 19/5712* (2013.01);
(Continued)

(58) Field of Classification Search
CPC ............... B82B 3/0002; B82B 3/0062; B82B 2207/015; B82B 2201/9235; B82B 2201/0242; B82B 2203/0735; B82B 2201/0228; B82C 2203/0735; B82C 1/00246
USPC .......................................................... 438/50
See application file for complete search history.

(56) References Cited

U.S. PATENT DOCUMENTS 6,210,988 B1  4/2001  Howe et al.
7,104,129 B2  9/2006  Nasiri et al.
(Continued)

OTHER PUBLICATIONS

Bernstein, Jonathan, "An Overview of MEMS Inertial Sensing Technology," Sensors Magazine, Feb. 1, 2003, 6 pages, downloaded Oct. 21, 2010 from URL: <http://www.sensorsmag.com/sensors/acceleration-vibration/an-overview-mems-inertial-sensing-technology-970>.

(Continued)

*Primary Examiner* — Savitr Mulpuri
(74) *Attorney, Agent, or Firm* — Abel Law Group, LLP

(57) ABSTRACT

An apparatus is formed on a substrate including at least one semiconductor device. The apparatus includes a microelectromechanical system (MEMS) device comprising at least one of a portion of a first structural layer and a portion of a second structural layer formed above the first structural layer. The second structural layer has a thickness substantially greater than a thickness of the first structural layer. In at least one embodiment, the MEMS device includes a first portion of the second structural layer and a second portion of the second structural layer. In at least one embodiment, the MEMS device further comprises a gap between the first portion of the second structural layer and the second portion of the second structural layer. In at least one embodiment, the gap has a width at least one order of magnitude less than the thickness of the second structural layer.

19 Claims, 48 Drawing Sheets

(52) U.S. Cl.
CPC . *B81B2201/0235* (2013.01); *B81B 2201/0242* (2013.01); *B81B 2207/015* (2013.01); *B81C 2203/0735* (2013.01)

(56) References Cited

U.S. PATENT DOCUMENTS

| | | | |
|---|---|---|---|
| 7,211,926 | B2 | 5/2007 | Quevy et a |
| 7,482,193 | B2 | 1/2009 | DCamp et al. |
| 7,514,760 | B1 | 4/2009 | Quevy |
| 7,514,853 | B1 | 4/2009 | Howe et al. |
| 7,591,201 | B1 | 9/2009 | Bernstein et al. |
| 7,595,209 | B1 | 9/2009 | Monadgemi et al. |
| 7,615,395 | B2 | 11/2009 | Heuvelman |
| 7,639,104 | B1 | 12/2009 | Quevy et al. |
| 7,659,150 | B1 | 2/2010 | Monadgemi et al. |
| 7,704,774 | B2 | 4/2010 | Mayer et al. |
| 7,736,929 | B1 | 6/2010 | Monadgemi et al. |
| 7,876,167 | B1 | 1/2011 | McCraith et al. |
| 7,923,790 | B1 | 4/2011 | Quevy et al. |
| 7,956,517 | B1 | 6/2011 | Motiee et al. |
| 8,129,803 | B2 | 3/2012 | Martin et al. |
| 8,216,882 | B2 | 7/2012 | Lin et al. |
| 8,227,286 | B2 | 7/2012 | Nunan et al. |
| 8,273,594 | B2 | 9/2012 | Quevy et al. |
| 8,288,835 | B2 | 10/2012 | Quevy et al. |
| 8,313,970 | B2 | 11/2012 | Quevy et al. |
| 2005/0229704 | A1 | 10/2005 | Murata et al. |
| 2008/0178674 | A1 | 7/2008 | Walmsley |
| 2010/0050776 | A1 | 3/2010 | Fuhrmann et al. |
| 2010/0203664 | A1 | 8/2010 | Tsai et al. |
| 2010/0307246 | A1 | 12/2010 | Fujii et al. |
| 2011/0074517 | A1 | 3/2011 | McCraith et al. |
| 2011/0095835 | A1 | 4/2011 | McCraith et al. |
| 2011/0111545 | A1 | 5/2011 | El-Gamal |
| 2011/0126632 | A1 | 6/2011 | McNeil et al. |
| 2012/0229220 | A1 | 9/2012 | Quevy et al. |
| 2013/0002363 | A1 | 1/2013 | Motiee et al. |

OTHER PUBLICATIONS

Wikipedia, "Accelerometer," downloaded Oct. 21, 2010 from URL: <http://en.wikipedia.org/wiki/Accelerometer>, 11 pages.

Wikipedia, "Vibrating Structure Gyroscope," downloaded Oct. 21, 2010 from URL: <http://en.wikipedia.org/wiki/Vibrating_structure_gyroscope>, 6 pages.

U.S. Appl. No. 13/075,806, filed Mar. 30, 2011, entitled "Technique for Forming a MEMS Device Using Island STructures," naming inventors Emmanuel P. Quevy and Carrie W. Low.

Low, Carrie Wing-Zin, "Novel Processes for Modular Integration of Silicon-Germanium MEMS with CMOS Electronics," Technical Report No. UCB/EECS-2007-31, Electrical Engineering and Computer Sciences, University of California at Berkeley, Feb. 28, 2007, URL: <http:/www.eecs.berkeley.edu/Pubs/TechRpts/2007/EECS-2007-31.html>, 267 pages.

Gianachandani et al. "A MEM-first fabrication process for integrating CMOS circuits with Polysilicon Microstructures," 0-7803-4412-X/98 (1998ITEEE).

TECHNIQUE FOR FORMING A MEMS DEVICE

CROSS REFERENCE TO RELATED APPLICATIONS

This application is a divisional of U.S. patent application Ser. No. 13/075,800, filed on Mar. 30, 2011, which is incorporated herein by reference.

BACKGROUND

1. Field of the Invention

The invention is related to microelectromechanical systems (MEMS) and more particularly to manufacturing MEMS structures.

2. Description of the Related Art

In general, microelectromechanical systems (MEMS) are very small mechanical devices driven by electricity. Typical MEMS devices include sensors and actuators, which may be used in various applications, e.g., accelerometers, gyroscopes, and pressure sensors. Although a MEMS device may be manufactured using various materials and manufacturing techniques (e.g. silicon, polymers, metals), manufacturing a MEMS device on a semiconductor substrate provides the ability to incorporate an integrated circuit into the manufactured device. For example, a complementary metal-oxide-semiconductor (CMOS) integrated circuit may be formed on the silicon substrate in conjunction with the MEMS device. However, a manufactured CMOS integrated circuit will irreversibly degrade at temperatures above a threshold temperature (e.g., 450° C.). That temperature threshold limits the materials and semiconductor manufacturing techniques that may be used to fabricate a MEMS device on the same substrate as the manufactured CMOS integrated circuit.

SUMMARY

In at least one embodiment of the invention, a method of manufacturing an integrated circuit including a microelectromechanical system (MEMS) device includes forming a first structural layer above at least one semiconductor device formed on a substrate. The method includes forming a second structural layer above the first structural layer. The second structural layer has a thickness substantially greater than a thickness of the first structural layer. The MEMS device comprises at least one portion of at least one of the first and second structural layers. In at least one embodiment of the invention, the method is carried out at one or more temperatures less than a tolerable threshold temperature for the at least one semiconductor device.

In at least one embodiment of the invention, an apparatus is formed on a substrate including at least one semiconductor device. The apparatus includes a microelectromechanical system (MEMS) device comprising at least one of a portion of a first structural layer and a portion of a second structural layer formed above the first structural layer. The second structural layer has a thickness substantially greater than a thickness of the first structural layer. In at least one embodiment, the MEMS device includes a first portion of the second structural layer and a second portion of the second structural layer. In at least one embodiment, the MEMS device further comprises a gap between the first portion of the second structural layer and the second portion of the second structural layer. In at least one embodiment, the gap has a width at least one order of magnitude less than the thickness of the second structural layer.

In at least one embodiment of the invention, an apparatus includes an electrode of a microelectromechanical system (MEMS) device formed above a substrate including a semiconductor device. The apparatus includes a member of the MEMS device. The member is formed above the substrate and is electrostatically coupled to the electrode. The member includes a portion of a first structural layer and a portion of a second structural layer formed above the first structural layer. The portion of the second structural layer has a higher mass than the portion of the first structural layer.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
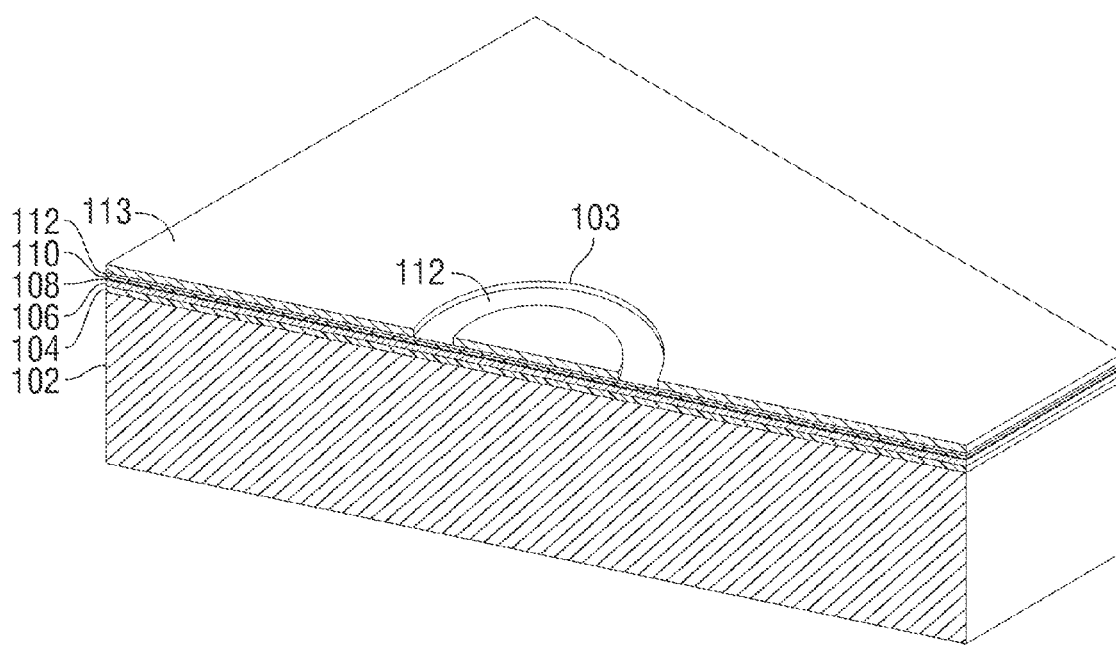
FIGS. 1-47 illustrate a perspective, cross-sectional view of a manufacturing sequence for fabricating a MEMS structure consistent with at least one embodiment of the invention.

A technique for manufacturing a MEMS structure forms a MEMS device including at least one structural layer. As referred to herein, a structural layer is a layer of a particular material that is later patterned and at least partially released to form at least a portion that is free to mechanically move or be deflected in at least one directional plane with respect to a surface of a substrate. As referred to herein, a release of a structure or a portion of a structural layer frees that structure or portion of the structural layer to have a portion that is free to mechanically move or be deflected in at least one directional plane with respect to the substrate. As referred to herein, a release layer is a layer of material that, when removed, releases at least a portion of the structure or structural layer. In at least one embodiment of the manufacturing technique, the release occurs towards the end of manufacture to maintain integrity of the released structures.

In at least one embodiment of the manufacturing technique, the structural layer is layered, i.e., includes a stack of independently-formed layers of the particular material without intervening layers of other material. In at least one embodiment of the manufacturing technique, individual layers of the stack of independently-formed layers may each include an interface (e.g., formed by breaking a vacuum in between depositions of the material or formed by oxidation of the layer prior to forming the next individual layer in the stack). In at least one embodiment, a particular structural layer is non-layered, i.e., includes a singularly formed layer of the particular material.

In at least one embodiment of a MEMS system, multiple structural layers are formed one above another, i.e., individual structural layers are vertically displaced from each other with respect to a surface of the substrate. An intervening release layer is formed between formation of the individual structural layers. Released portions of each structural layer can mechanically move independently from released portions of other structural layers. Multiple structural layers may be used to form a single MEMS device, multiple MEMS devices stacked on top of each other, or multiple MEMS devices displaced vertically and horizontally from each other with respect to a surface of the substrate, i.e., using portions of different structural layers and horizontally displaced from each other with respect to the surface of the substrate.

In at least one embodiment, the MEMS device is a capacitive inertial sensor (e.g., accelerometer or gyroscope). The inertial sensor includes a mass that is electrostatically coupled (i.e., capacitively coupled) to one or more electrodes. In operation, the capacitive inertial sensor behaves as a damped mass on a spring. When the sensor experiences an acceleration, the mass is displaced from a neutral position to the point that the spring is able to accelerate the mass at the same rate as the casing. The displacement of the mass is sensed based on a corresponding change in the width of the gap between the mass and an electrode. That change in width changes the capacitance between the mass and one or more electrodes. The change in capacitance is measured and used to determine acceleration (e.g., by one or more semiconductor devices in a substrate on which the MEMS device is formed).

A technique for manufacturing a MEMS structure (e.g., an inertial sensor) forms a MEMS device on a substrate including at least one manufactured semiconductor (e.g., CMOS) device. The manufacturing technique includes forming at least one structural layer and at least one release layer on the substrate above the manufactured semiconductor device. A layer formed above one of the at least one structural layers is substantially thicker (e.g., is at least five times thicker) than another structural layer. Portions of each of the plurality of structural layers are electrically coupled to form a MEMS device.

Figure 47:
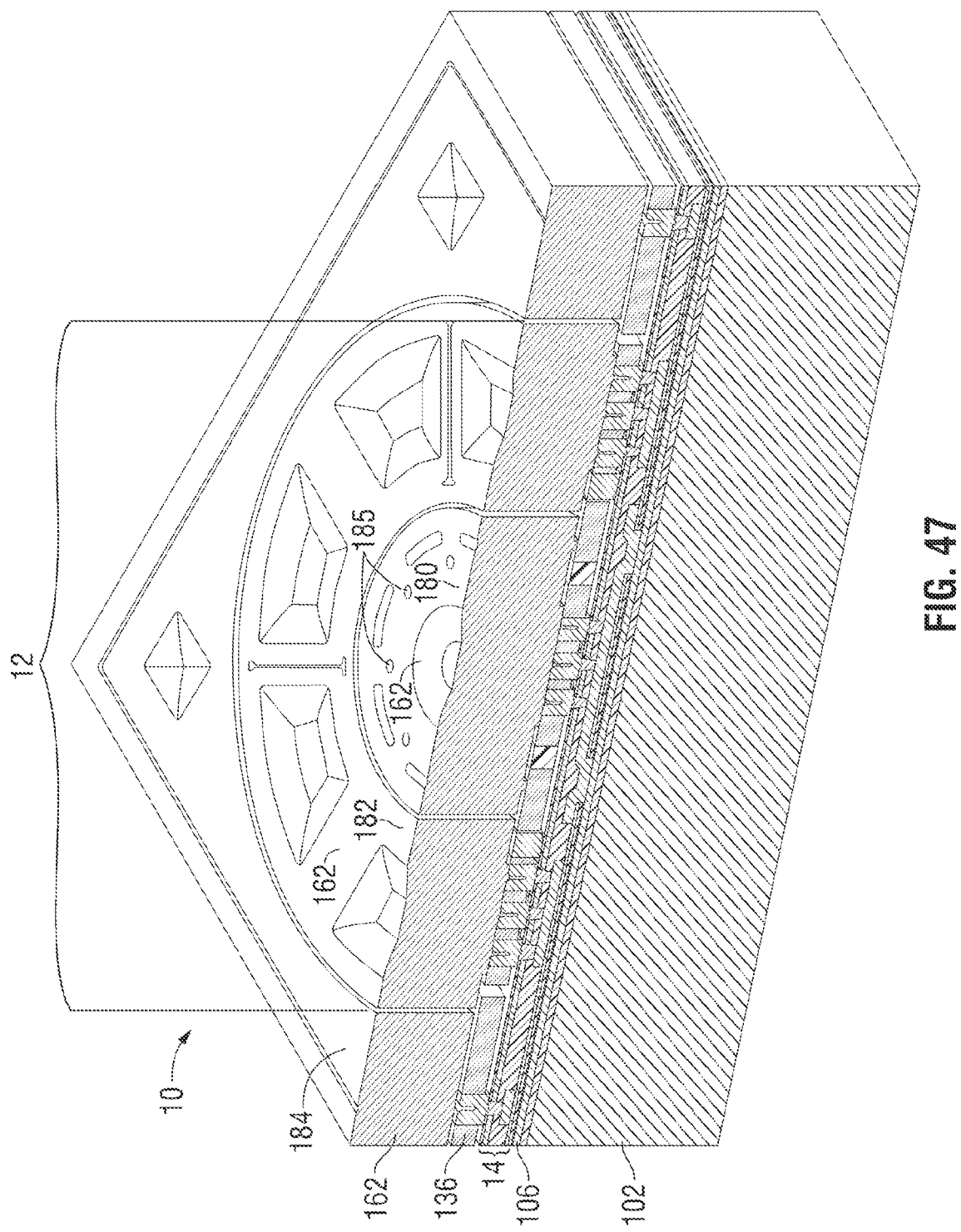
Figure 49:
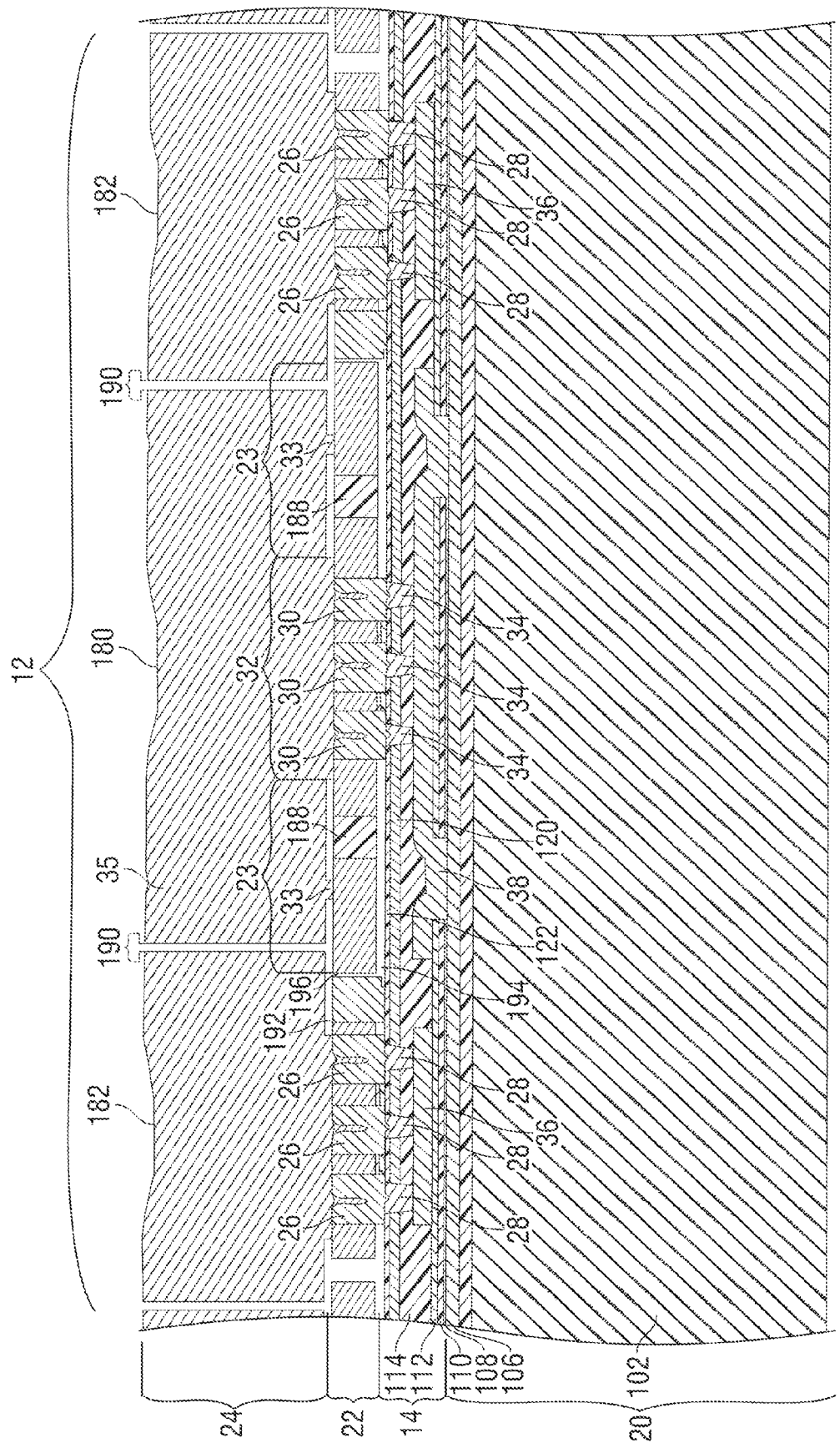
FIG. 49 illustrates a detailed two-dimensional view of a cross-section of the structure of FIG. 47 after a release technique, consistent with at least one embodiment of the invention.

Referring to FIG. 47 and corresponding detailed view in FIG. 49, in at least one embodiment, a MEMS structure (e.g., MEMS structure 12) includes a plurality of electrodes (e.g., electrodes 182) and a proof mass (e.g., proof mass 180). In at least one embodiment, the electrodes are electrically coupled with a plurality of interconnects to sense displacement of the proof mass in response to inertial forces (e.g., acceleration, Coriolis effect, or other effects). By using a high-mass (e.g., thick) layer form proof mass 180, movements of the mass in response to acceleration or deceleration are larger, which results in improved performance of the inertial sensor as compared to other inertial sensors formed without portions of the high-mass layer. In at least one embodiment, proof mass 180 and electrodes 182 are electrically coupled to at least one semiconductor device formed on substrate 102 (e.g., a semiconductor integrated circuit formed on substrate 102 in semiconductor integrated circuit stack 20), thereby incorporating the semiconductor device into the MEMS structure. In at least one embodiment, MEMS structure 12 is an inertial sensor including proof mass 180 and electrodes 182 coupled to an interface (e.g., an interface including electrical contacts in stack 14). In at least one embodiment, the MEMS structure is fabricated on a CMOS circuit subsequent to formation of the CMOS circuit. In at least one embodiment of a manufacturing technique, to facilitate integration of the MEMS structure with the CMOS circuit, all process steps used to form the MEMS device are carried out at a temperature less than approximately 450° C.

Still referring to FIGS. 47 and 49, an exemplary inertial sensor (e.g., MEMS structure 12) operates in-plane (i.e., sensitive only to directions in the plane of the substrate). In at least one embodiment, MEMS structure 12 is a disk-shaped inertial sensor with electrodes formed concentrically around a disk-shaped mass. In operation, the electrodes are electrostatically coupled to the disk-shaped mass. However, note in other embodiments of MEMS structure 12, proof mass 180 and electrodes 182 form a sensor having other geometries. For example, a geometry that senses acceleration in only one in-plane direction (e.g., an x-direction or a y-direction parallel to the surface of substrate 102) may be used. In at least one embodiment, by integrating two single-direction inertial sensors orthogonally on a single integrated circuit die, a two-axis accelerometer may be formed. In at least one embodiment, accelerations for three orthogonal directions are detectable by forming an additional out-of-plane device (i.e., a device that senses acceleration of a mass in a direction orthogonal to a surface of the substrate) on a die that also includes the two-dimensional accelerometer or two other single direction devices that sense orthogonal axes. In at least one embodiment, the integrated three-axis sensor has a lower misalignment error than three discrete inertial sensors combined after packaging.

Structure 10 may include any arrangement that couples MEMS structure 12 with an integrated circuit. For example, in at least one embodiment, semiconductor integrated circuit stack 20 comprises a CMOS signal processing circuit and MEMS structure 12 is a MEMS inertial sensor. In other embodiments, MEMS structure 12 may include any structure that falls within the scope of MEMS technologies. For example, MEMS structure 12 may include any mechanical and electronic structure fabricated using lithography, deposition, and etching processes above a substrate. In at least one embodiment, MEMS structure 12 comprises a MEMS structure selected from the group consisting of a resonator, a sensor, a detector, a filter, and a mirror. In at least one embodiment, MEMS structure 12 includes two structural regions (e.g., first structural region 22 and second structural region 24). Other MEMS structures consistent with the teachings provided herein comprise at least one portion in one of first structural region 22 and second structural region 24. In at least one embodiment, MEMS structure 12 comprises portions in each of first structural region 22 and second structural region 24. In at least one embodiment, MEMS structure 12 is formed from only portions in second structural region 24, and electrical contacts to semiconductor integrated circuit 20 are provided by interconnect structures through first structural region 22. The interconnect structures are electrically isolated from structural portions in first structural region 22. In at least one embodiment, MEMS structure 12 is formed from portions in only first structural region 22 (e.g., MEMS structure 202 of FIG. 51) and is electrically isolated from any structural portions formed in second structural region 24 (e.g., by gaps formed in second structural region 24 or by laterally spacing MEMS structures in distinct structural regions above the substrate). In at least one embodiment, portions in first structural region 22 are attached to portions of second structural region 24 in an attachment region (e.g., attachment region 40 in FIG. 60).

Proof mass 180 may be formed from any material(s) suitable to withstand a MEMS fabrication process. For example, in at least one embodiment of MEMS structure 12, proof mass 180 is comprised of a material selected from the group consisting of an insulator, a semiconductor and a conductor. In one embodiment, proof mass 180 is comprised of an insulating material selected from the group consisting of silicon dioxide, silicon nitride, silicon oxy-nitride and a high-K dielectric material. In at least one embodiment, proof mass 180 is comprised of a semiconducting material selected from the group consisting of silicon, germanium, silicon-germanium, carbon-doped silicon, carbon-doped silicon-germanium and a III-V material. The semiconducting material may also be comprised of dopant impurity atoms. For example, in a specific embodiment, proof mass 180 is comprised of poly-crystalline silicon-germanium with a germanium atomic concentration in the range of 50-70% and boron dopant impurity atoms with a total atomic concentration in the range of $1 \times 10^{18}$-$5 \times 10^{20}$ atoms/cm$^3$. In at least one embodiment, proof mass 180 is comprised of a conductor and is formed from a material selected from the group consisting of copper, aluminum, a metal alloy and a metal silicide. In at least one embodiment, proof mass 180 is comprised of one or more materials that are formed by a low temperature process, i.e., below the threshold temperature of a semiconductor integrated circuit formed in CMOS integrated circuit layers 20. In at least one embodiment, proof mass 180 is comprised of a material formed at a temperature less than approximately 450° C.

In at least one embodiment of the manufacturing technique, electrodes 182 are formed from any material(s) described in association with proof mass 180. In at least one embodiment, electrodes 182 are comprised of substantially the same material(s) as proof mass 180. In at least one embodiment, electrodes 182 and proof mass 180 are formed in the same layers above substrate 102, as depicted in FIG. 47. In at least one embodiment of the manufacturing technique, dummy structures 184 are formed near or surrounding electrodes 182 and comprise the same material(s) as electrodes 182. In at least one embodiment, dummy structures 184 are formed to control the topography and feature size precision and uniformity of portions of MEMS structure 12 that are formed in first structural region 22 and second structural region 24. In at least one embodiment of MEMS structure 12, interconnects 26 are formed in first structural region 22 and electrically couple electrodes 182 to interconnects 28 formed in stack 14. Interconnects 26 may be formed from any conducting or semiconducting material described above with respect to proof mass 180. In at least one embodiment of MEMS structure 12, interconnects 28 are formed in first structural region 22. Interconnects 30 anchor proof mass 180 to stack 14 and electrically couple proof mass 180 to interconnects 34 formed in stack 14. Interconnects 34 may be formed from any conducting or semiconducting material described above with respect to proof mass 180. In at least one embodiment of MEMS structure 12, portions of proof mass 180 in second structural region 24 are anchored to first suspended member 23 by portions 32 and 33 of second suspended member 25.

In at least one embodiment, interconnects 28 and 34 couple electrodes 182 and proof mass 180 to conductors 36 and 38, respectively. In at least one embodiment, interconnects 28 and 34 and conductors 36 and 38 are housed in at least one dielectric layer suitable to provide structural integrity to the plurality of interconnects and conductors and to mitigate cross-talk within the plurality of interconnects. In at least one embodiment of MEMS structure 12, the conductors 36 and 38 are comprised of copper, silver, aluminum, an alloy thereof, or bundles of conductive carbon nanotubes. In at least one embodiment, conductors 36 and 38 are comprised of poly-crystalline copper with an atomic composition in the range of 97-100% copper atoms. Conductors 36 and 38 may exhibit any cross-sectional shape and follow any design rule practical for interconnect technologies. In at least one embodiment, conductors 36 and 38 have a square, a rectangle, a circle, an ellipse, a U, a V, a T or an A-frame cross-sectional shape. In at least one embodiment, the cross-sectional shape of conductors 36 and 38 is an artifact of the processing scheme utilized to form conductors 36 and 38. In at least one embodiment, the dielectric layer that houses conductors 36 and 38 has a dielectric constant in the range of 2-5.5. In at least one embodiment, the dielectric layer that houses conductors 36 and 38 (e.g., layer 114) is comprised of a material selected from the group consisting of silicon dioxide, a silicate (e.g. tetraethyl orthosilicate (TEOS)), a carbon-doped oxide with 0-10% porosity or fluorinated versions thereof.

In at least one embodiment of MEMS structure 12, conductors 36 and 38 are coupled to a top conductive layer (e.g., layer 106) of semiconductor integrated circuit stack 20 and are otherwise electrically isolated from semiconductor stack 20 by one or more dielectric layers (e.g., layers 108, 110, and 112) which may comprise one or more of silicon dioxide, silicon nitride, silicon oxy-nitride, a high-K dielectric material, a low-K dielectric material or other suitable dielectric material.

In at least one embodiment, semiconductor integrated circuit stack 20 includes one or more semiconductor devices, which may be any grouping of microelectronic devices that may be connected to form an integrated circuit. For example, in at least one embodiment, semiconductor stack 20 includes a plurality of n-type and p-type transistors fabricated in a substrate 102 and encased in one or more dielectric layers (e.g., layer 104). Substrate 102 may be comprised of any material suitable to withstand an integrated circuit fabrication process and to provide structural integrity for one or more semiconductor devices, the plurality of interconnects (e.g., conductors 36 and 38, interconnects 28 and 34), and one or more MEMS structures formed in first structural region 22 and second structural region 24. In at least one embodiment, substrate 102 is comprised of group IV-based materials such as crystalline silicon, germanium or silicon-germanium. In at least one embodiment, substrate 102 is comprised of a III-V material. In at least one embodiment, substrate 102 comprises an insulating layer. In at least one embodiment, the insulating layer is comprised of a material selected from the group consisting of silicon dioxide, silicon nitride, silicon oxy-nitride and a high-k dielectric layer. In at least one embodiment, substrate 102 is an insulator. In at least one embodiment, substrate 102 consists of glass, quartz or sapphire. In at least one embodiment, the manufacturing technique includes forming dopant impurity regions and isolation regions in substrate 102.

Still referring to FIGS. 47 and 49, one or more MEMS structures located above the substrate may be fabricated subsequent to the fabrication of a semiconductor integrated circuit on substrate 102. FIGS. 1-47 illustrate a perspective, cross-sectional view of a substrate (e.g., substrate 102) undergoing a manufacturing technique to form MEMS structure 12 on substrate 102. Referring to FIG. 1, substrate 102 includes at least one semiconductor device isolated by at least one dielectric layer (e.g., dielectric layer 104) and having a top conducting portion formed in a conductive layer (e.g., conductive layer 106). The at least one semiconductor device may be comprised of any material and/or feature described above with respect to FIGS. 47 and 49. In at least one embodiment of the manufacturing technique, the tolerable threshold temperature for the one or more semiconductor integrated circuits formed on substrate 102, i.e., the temperature up to which the one or more semiconductor integrated circuits can be heated with negligible permanent degradation, is approximately 450° Celsius. However, note that the tolerable threshold temperature may vary with variations in the semiconductor manufacturing process.

The top conducting portion is capped with one or more isolation layers, passivation layers, and interface layers (e.g. layers 108, 110, and 112), which may be comprised of any of the materials described above. In at least one embodiment, layers 108, 110, and 112 are deposited by any process suitable to provide substantially uniform coverage above top conducting portions of layer 106. In at least one embodiment, layers 108, 110, and 112 are comprised of silicon nitride, TEOS, and oxynitride, respectively, and are deposited by a chemical vapor deposition process carried out at a temperature less than approximately 450° Celsius. In at least one embodiment, layers 108, 110, and 112 are substantially flat. In at least one embodiment, at least one of layers 108, 110, and 112 are planarized by a chemical-mechanical process following deposition. In at least one embodiment, layer 106 is planarized prior to the deposition of layers 108, 110, and 112. Layers 108, 110, and 112 have thicknesses suitable to suppress cross-talk from interconnects to any devices subsequently fabricated above layers 108, 110, and 112. In at least one embodiment, layers 108, 110, and 112 have thicknesses in the range of approximately 0.05-1.0 microns.

Figure 2:
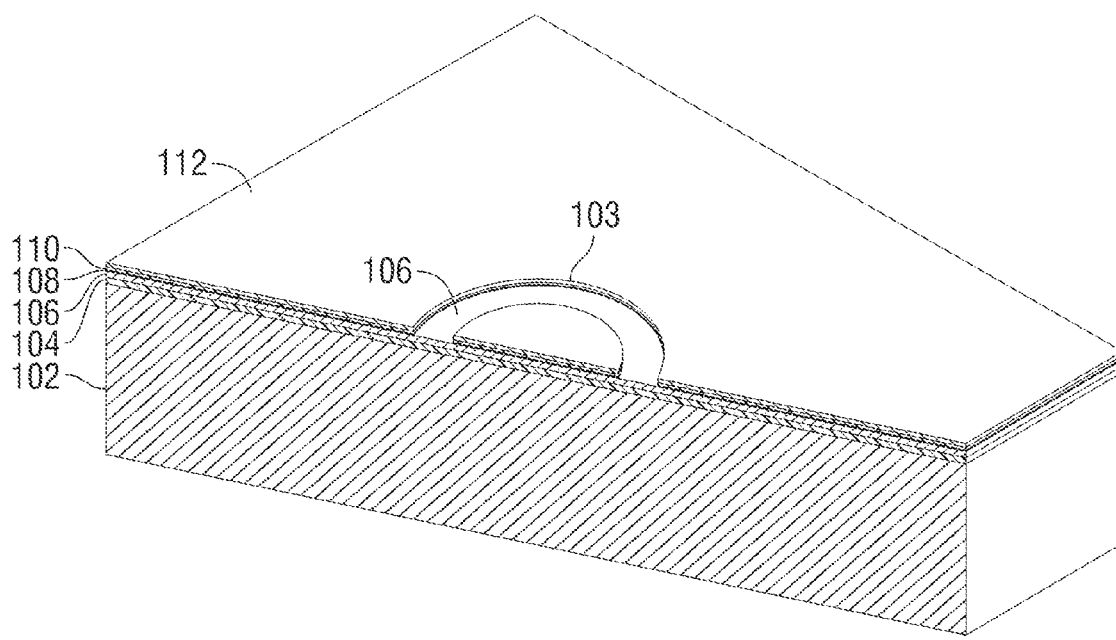

Still referring to FIG. 1, in at least one embodiment of the manufacturing technique, photolithography is used to form a patterned coating of photoresist (e.g., layer 113) above layers 108, 110, and 112. In at least one embodiment, layer 113 is patterned to later define contact openings that expose portions of the top metal layer (e.g., layer 106) of semiconductor integrated circuit stack 20. Contact opening 103 may be patterned by any lithographic/etch process suitable to provide the appropriate dimensions required for contact openings 103. For example, in at least one embodiment, layers 108, 110, and 112 are patterned by first patterning layer 113 (e.g., a positive photoresist layer) formed above layers 108, 110, and 112, e.g. by exposure to a wavelength of light selected from the group consisting of 248 nm, 193 nm and 157 nm. In at least one embodiment, an e-beam direct-write process is used to pattern layer 113. An etch process may then be used to pattern layers 108, 110, and 112 as shown in FIG. 2. In at least one embodiment, a dry etch process is used. In at least one embodiment, an anisotropic plasma etch process is used where the plasma is generated from a combination of the gases $CHF_3$, $CF_4$ and $O_2$. Contact openings 103 may have any dimension suitable to define an effective electrical contact to MEMS structure 12 in a subsequent processing step.

Figure 3:
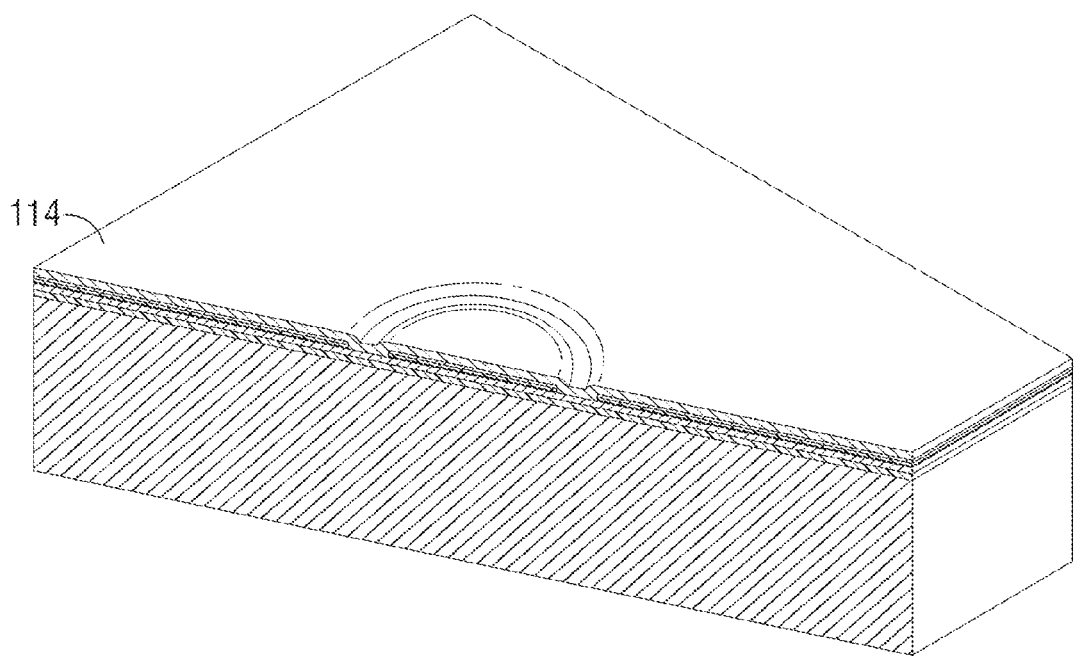

Referring to FIG. 3, contact openings 103 are filled with at least one contact-forming material layer (e.g., layer 114). In at least one embodiment, layer 114 is comprised of aluminum and is formed by any suitable technique to form layer 114 having an appropriate thickness. In at least one embodiment, a first contact layer lines contact openings 103 and a second contact layer fills any remaining voids in contact holes 103. The first contact layer may be comprised of any conductive material that can act as a suitable adhesion layer. In at least one embodiment, the first contact layer is an adhesion layer comprised of a material that provides an optimal ohmic contact between metal lines in the top layer of the semiconductor circuit and the second contact layer. In at least one embodiment, the first contact layer is substantially comprised of titanium and is formed by any technique suitable to provide a conformal layer on the sidewalls of contact openings 103 and on the surface of layer 106. In at least one embodiment, the first contact layer is deposited by a sputter deposition process to a thickness in the range of 10-100 nanometers. In at least one embodiment, a layer of titanium nitride is formed in between the first contact layer and the second contact layer in order to enhance the adhesion between the first contact layer and the second contact layer. In at least one embodiment, a sputter-clean is carried out prior to the deposition of the first contact layer.

Figure 4:
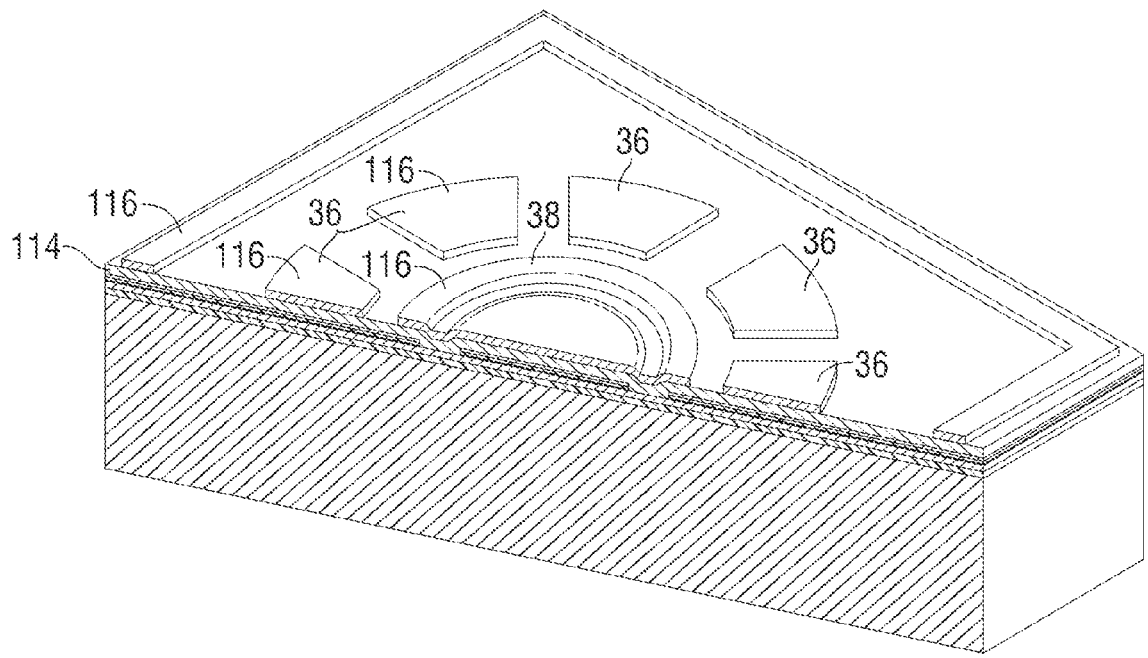
Figure 5:
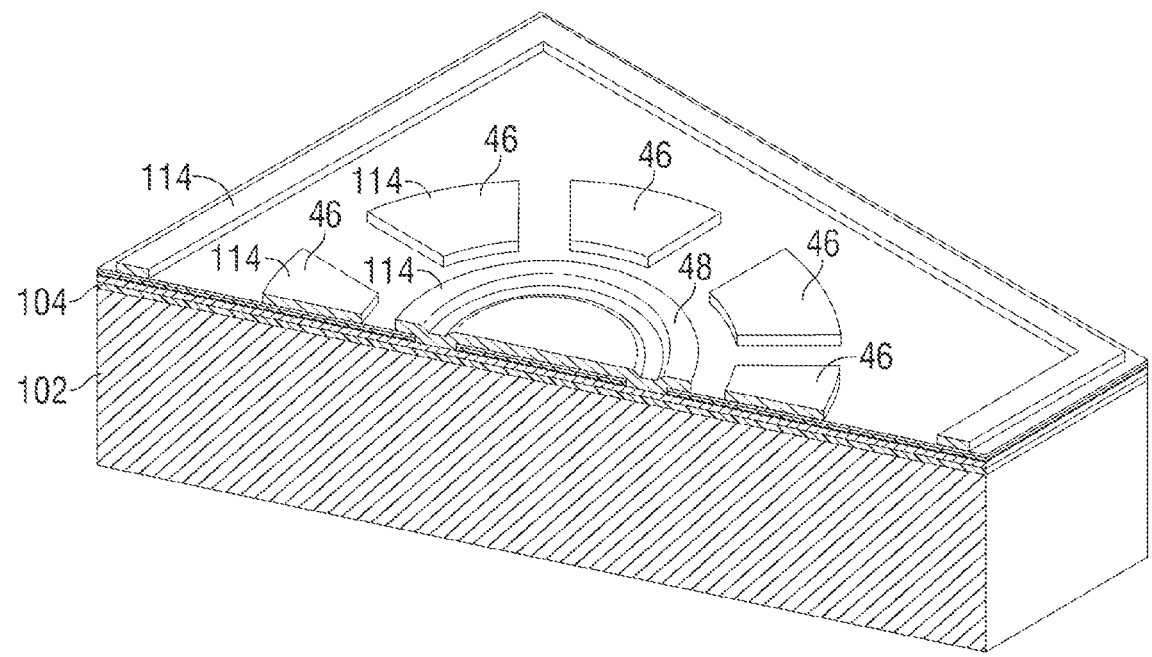
Figure 6:
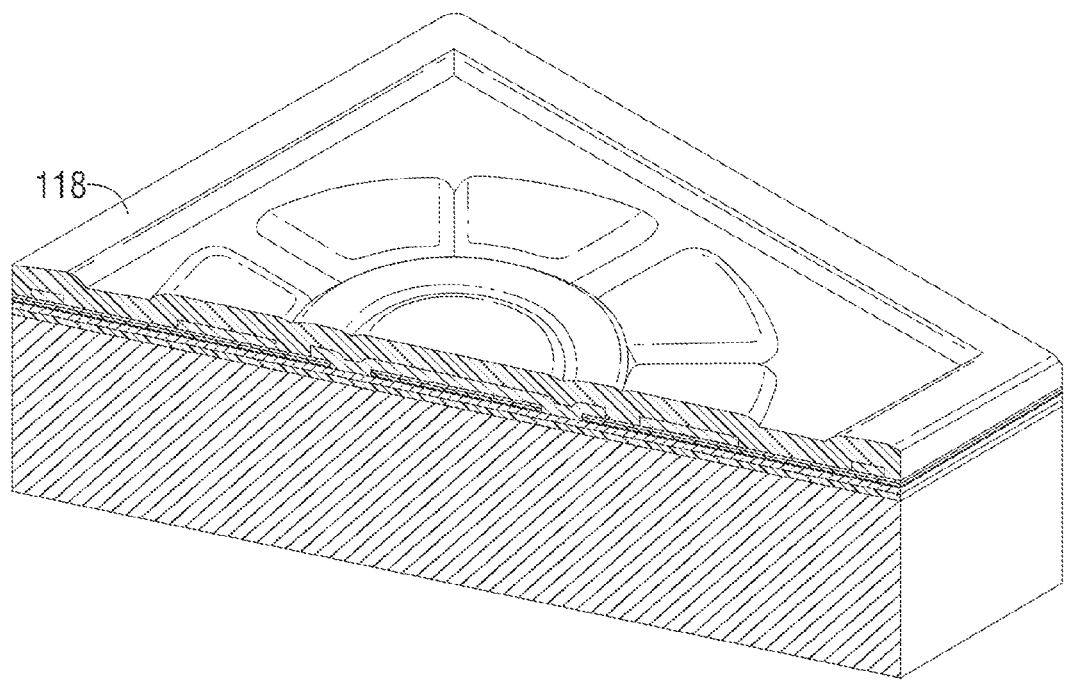

Referring to FIG. 4, in at least one embodiment of the manufacturing technique, photolithography is used to form a patterned coating of photoresist (e.g., patterned layer 116) on layer 114. In at least one embodiment, patterned layer 116 is patterned to define conductive structures of the MEMS device. For example, pattern portions 36 correspond to electrodes of the MEMS device (e.g., electrodes 182 of FIGS. 47 and 49) and pattern portion 38 corresponds to a member of the MEMS device (e.g., mass 180 of FIGS. 47 and 49). Referring to FIG. 5, after removal of the exposed portions of layer 114, conductor portions corresponding to electrodes (e.g. conductors 46) and a conductor portion corresponding to the mass (e.g. conductor 48) remain above the substrate.

In at least one embodiment of the manufacturing technique, one or more isolation layers (e.g., layer 118) are formed surrounding the conductor portions formed from portions of layer 114. In at least one embodiment, layer 118 is a conformal layer formed of any suitable isolation material described above using any suitable technique and has a thickness sufficient to completely cover the conductor portions formed from portions of layer 114. In at least one embodiment, layer 118 comprises TEOS and has a thickness in the range of approximately 1-2 μm.

Figure 7:
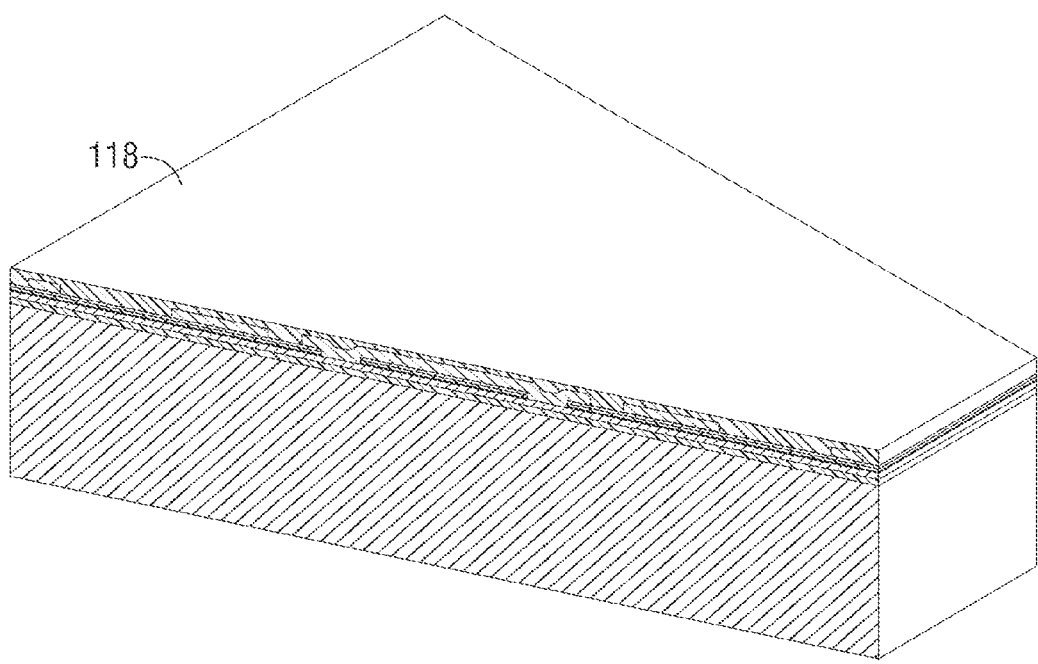

Referring to FIG. 7, in at least one embodiment of the manufacturing process, in order to maintain structural integrity, layer 118 is planarized using any suitable planarization technique that removes a portion of the material forming layer 118 without exposing conductors 46 and 48 or causing any degradation of structures formed from portions of layer 114. In at least one embodiment of the manufacturing technique, layer 118 is planarized using chemical-mechanical planarization (i.e., chemical-mechanical polishing).

Figure 8:
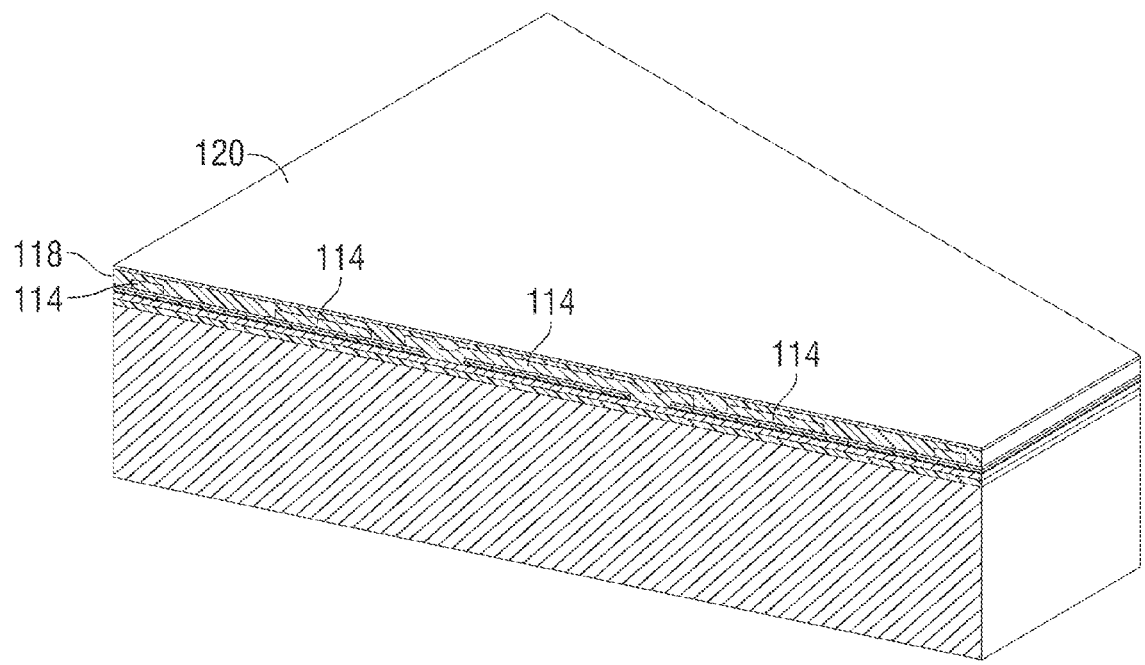
Figure 9:
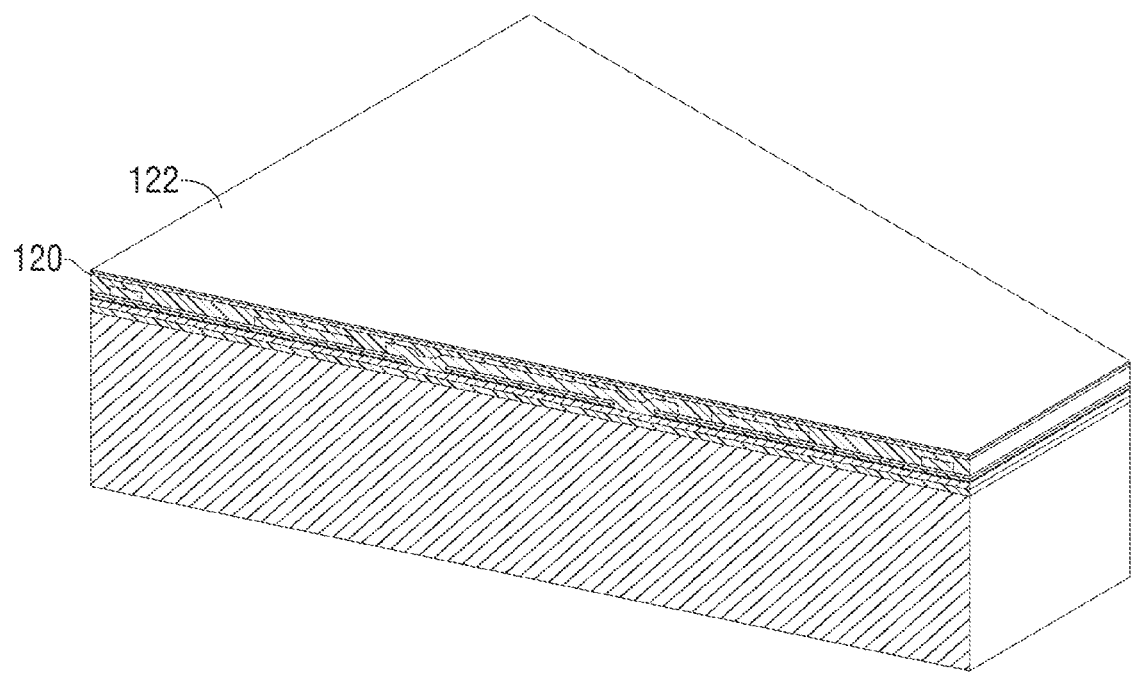

Referring to FIGS. 8 and 9, in at least one embodiment of the manufacturing technique, one or more additional isolation layers (e.g., layer 120 and layer 122) are formed on the planarized surface of layer 118 as passivation layers. In at least one embodiment, layer 120 is formed from silicon nitride having a thickness of approximately 1 μm and layer 122 is formed of TEOS having a thickness of less than approximately 0.5 μm. In other embodiments, other suitable insulating layers may be used.

Figure 10:
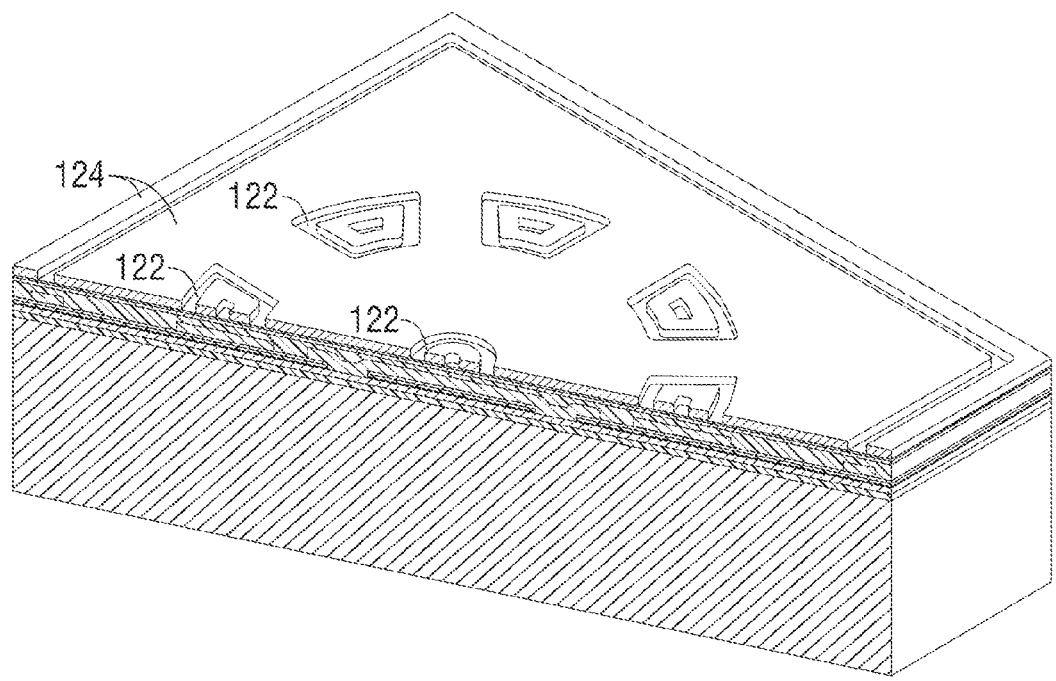
Figure 11:
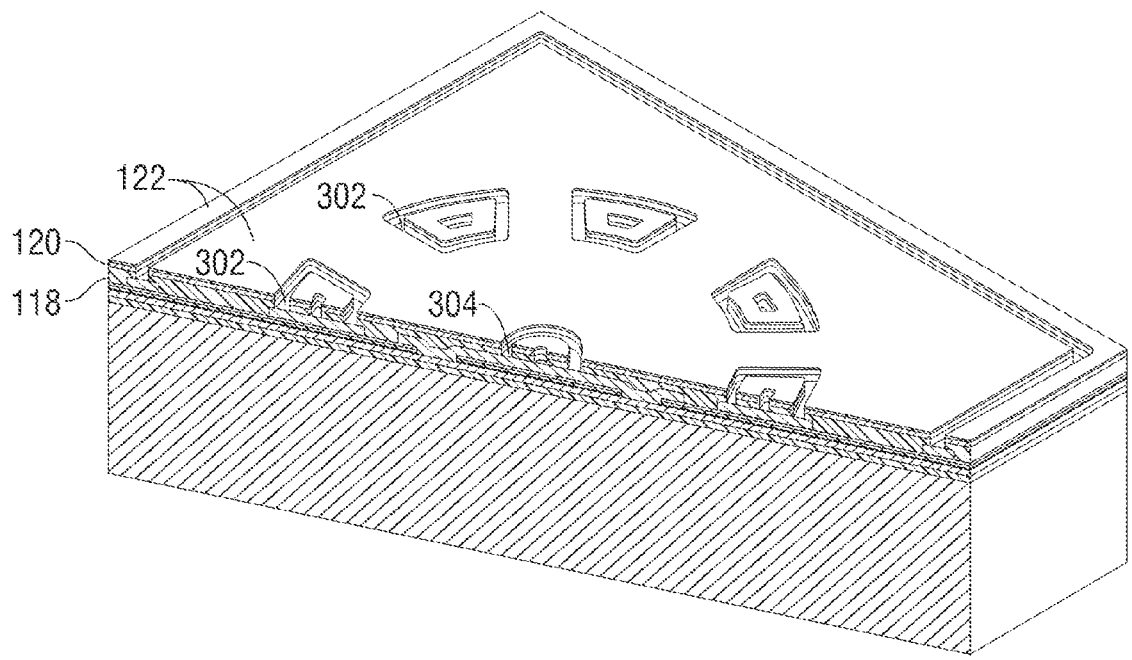

Referring to FIG. 10, in at least one embodiment of the manufacturing technique, photolithography is used to form a patterned coating of photoresist (e.g., patterned layer 124) on layer 122. In at least one embodiment, layer 124 is patterned to define interconnect structures that will couple the MEMS structure to conductors 46 and 48 of FIG. 5. Referring to FIG. 11, removal of the exposed portions of layer 122 and portions of layers 118 and 120 directly beneath exposed portions of layer 122, forms vias 302 and 304 through layers 118, 120, and 122 to conductor portions corresponding to electrodes (e.g., conductors 46) and a conductor portion corresponding to the mass (e.g., conductor 48) of MEMS structure 12.

Figure 12:
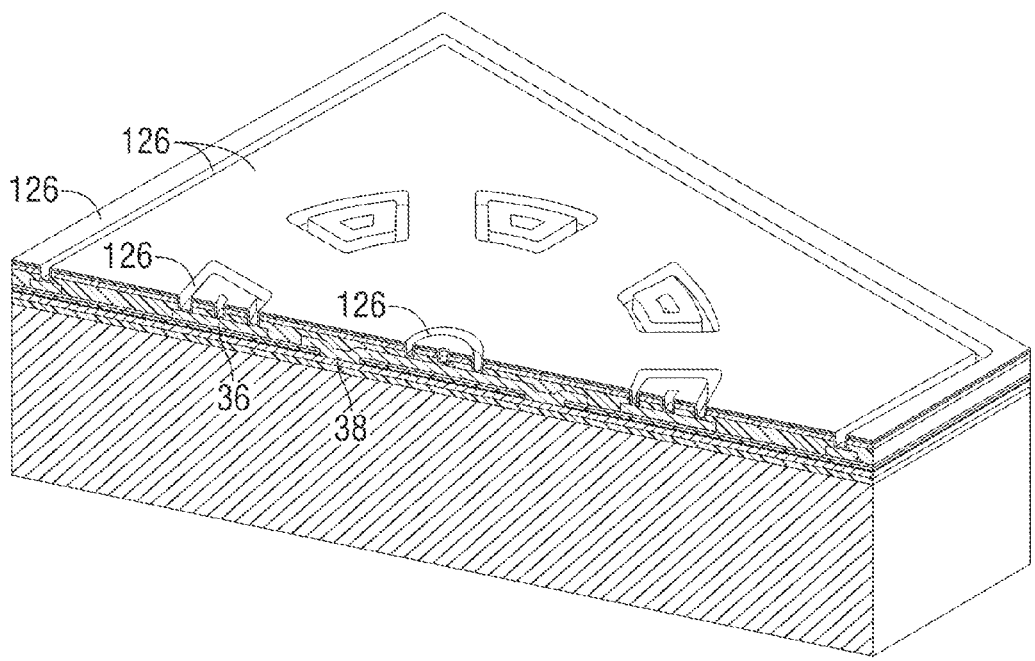
Figure 13:
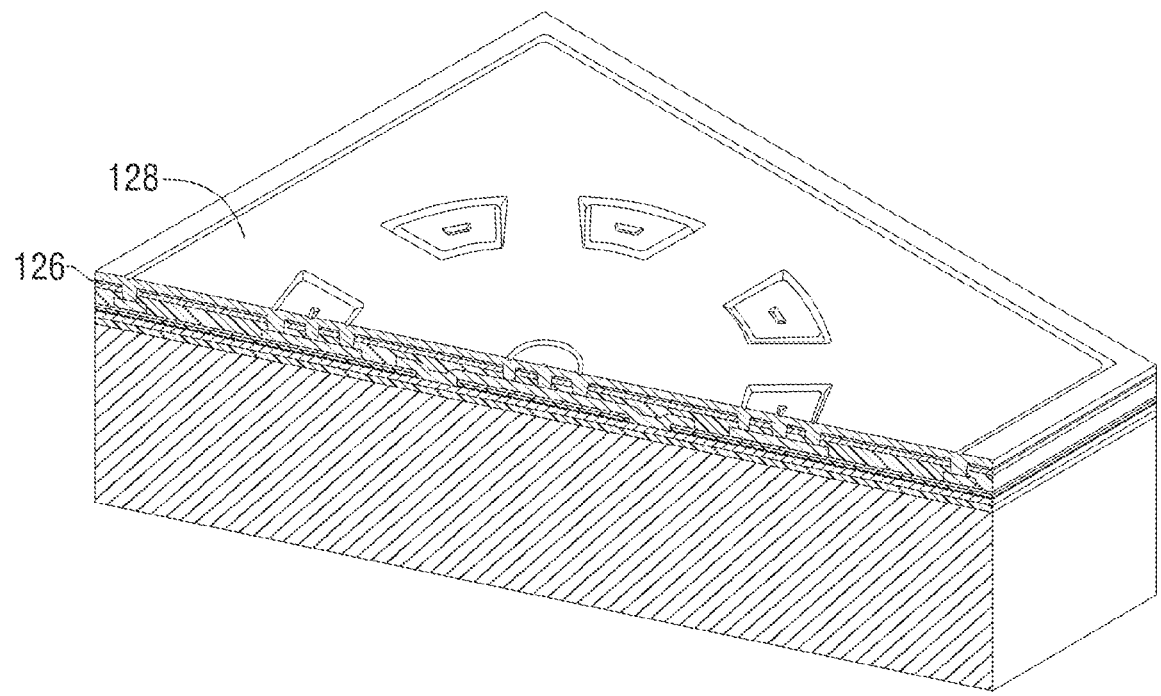
Figure 14:
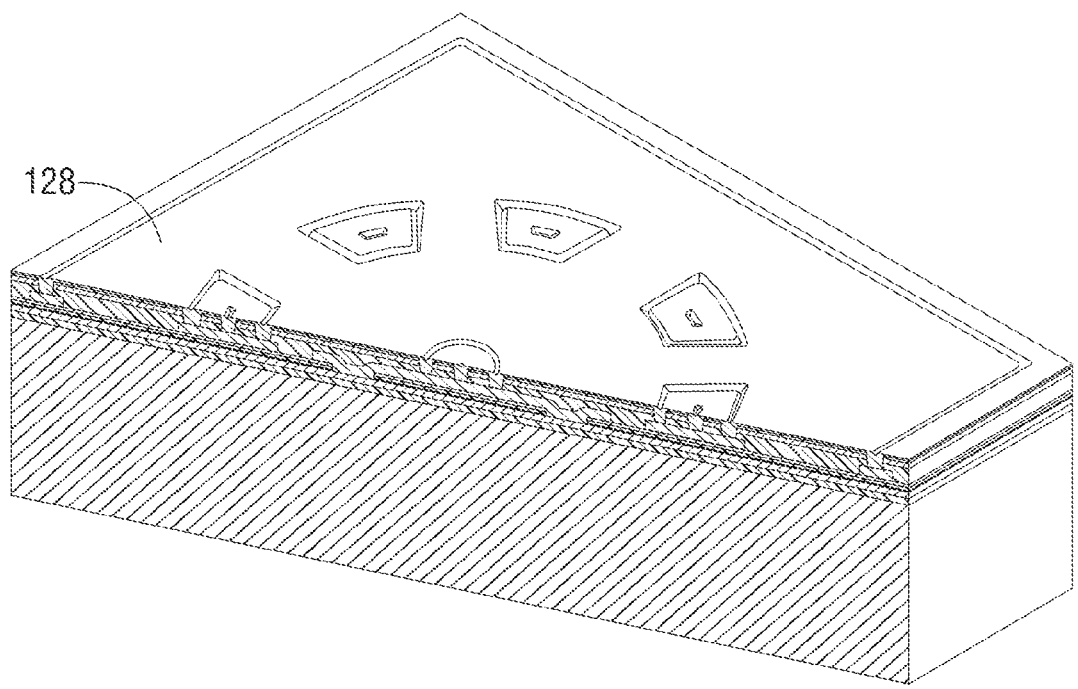
Figure 15:
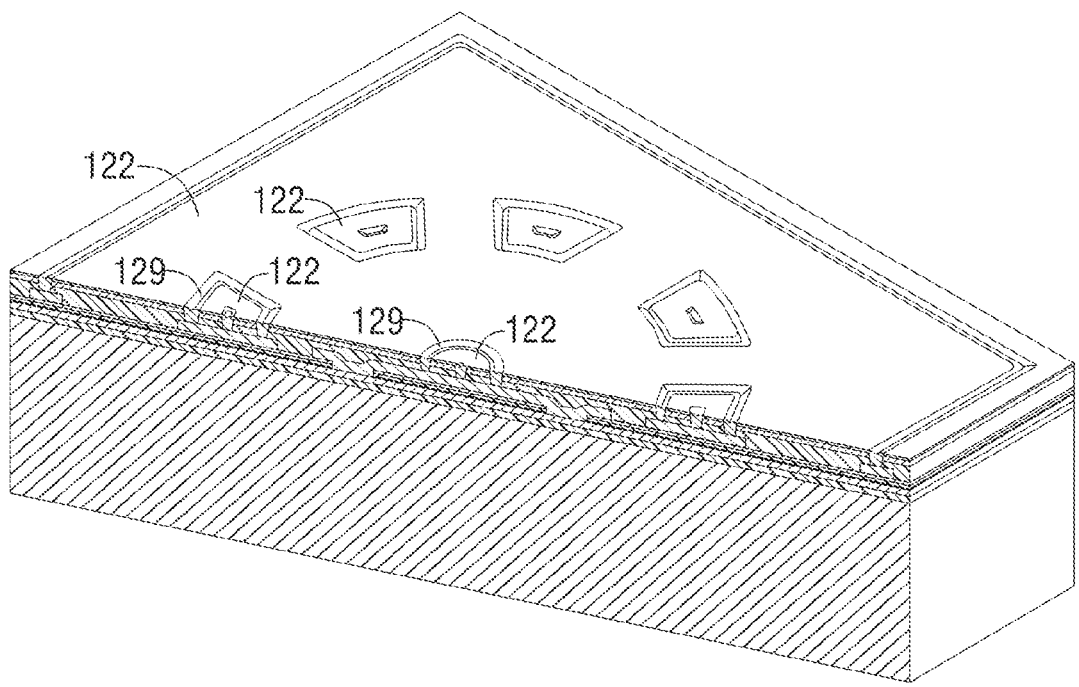

Referring to FIGS. 11 and 12, vias in layers 118 and 120 are filled with contact-forming material layers to form electrical contacts. In at least one embodiment of the manufacturing technique, a conformal layer of conductive material (e.g. layer 126) is formed on patterned layer 122. Layer 126 is comprised of any conductive material that can act as a suitable adhesion layer. In at least one embodiment, layer 126 comprises silicon-germanium and may be formed by any technique suitable to provide a conformal layer on the sidewalls of vias 302 and via 304 and on the surface of plurality of conductors 36 and 38. In one embodiment, layer 126 is deposited by a chemical vapor deposition process to a thickness sufficient to cover the sidewalls of vias 302 and 304 and the surface of layer 122. Referring to FIGS. 12 and 13, in at least one embodiment of the manufacturing technique, an additional layer of conductive material (e.g., layer 128) is formed on layer 126 to fill the vias 302 and 304. In at least one embodiment, layer 128 is formed from the same material as layer 126 using a similar technique. Referring to FIGS. 14 and 15, in at least one embodiment of the manufacturing technique, layer 128 is removed from above layer 122, leaving portions of layer 128 only in vias 302 and 304. In at least one embodiment, the removal includes a first removal followed by a second removal. For example, referring to FIG. 14, first the thickness of layer 128 is reduced. Then, referring to FIG. 15, all remaining portions of layer 128 except for the portions in vias 302 and 304 up to the surface of layer 122 are removed, thereby forming electrical contacts 129.

Figure 16:
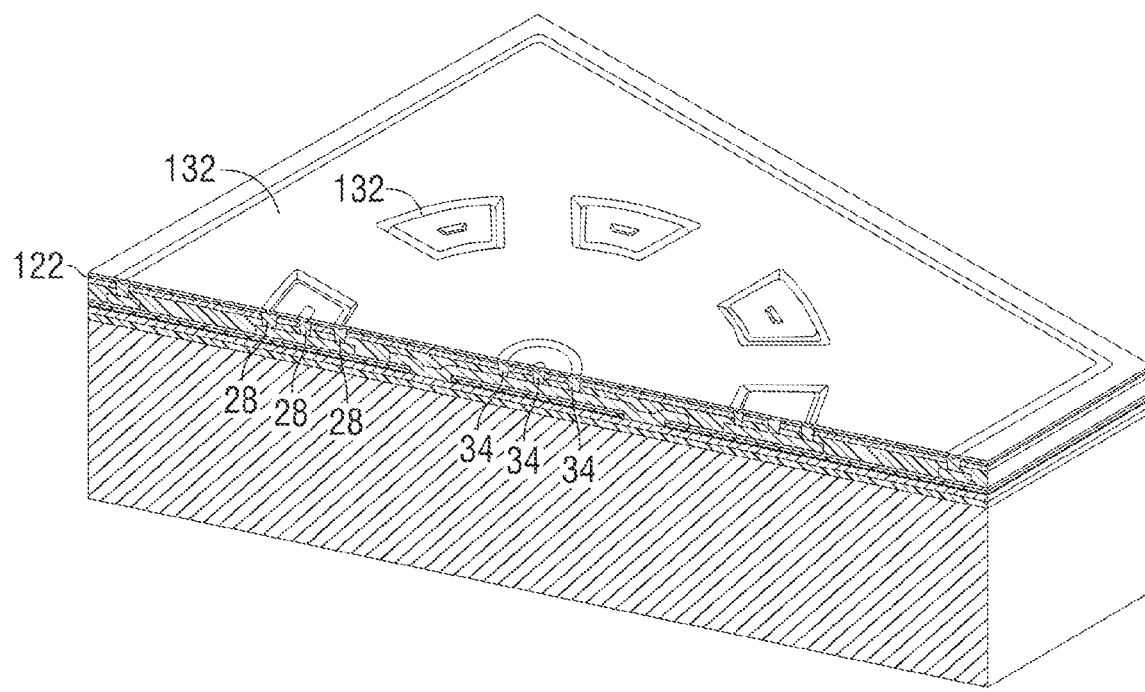

Referring to FIG. 16, in at least one embodiment of the manufacturing technique, a first release layer (e.g., first release layer 132) is formed above the isolation layer 122 and electrical contacts 28 and 34. First release layer 132 may be comprised of any material suitable to withstand a MEMS fabrication process. For example, in at least one embodiment of the manufacturing technique, first release layer 132 is comprised of a material selected from a group consisting of an insulator and a semiconductor. In at least one embodiment, first release layer 132 is an insulating material and is comprised of a material selected from the group consisting of silicon dioxide, silicon nitride, silicon oxy-nitride and a high-K dielectric material. In at least one embodiment of the manufacturing technique, first release layer 132 is a semiconducting material and is selected from the group consisting of silicon, germanium, silicon-germanium, carbon-doped silicon, and a III-V material. The semiconducting material may also be comprised of dopant impurity atoms. For example, in at least one embodiment of the manufacturing technique, the concentration of dopant impurity atoms is selected to optimize the germanium nucleation from $GeH_4$ precursor gas at a temperature in the range of 300-400° C. In at least one embodiment of the manufacturing technique, first release layer 132 is comprised of greater than 98% germanium atoms and boron dopant impurity atoms having a total atomic concentration in the range of $5\times10^{19}$-$5\times10^{20}$ atoms/cm$^3$. First release layer 132 may be comprised of any material that may subsequently be removed with high selectivity to layer 122 and a subsequently formed structural layer. For example, in at least one embodiment of the manufacturing technique, layer 122 is comprised of TEOS, a subsequently formed structural layer is comprised of silicon-germanium and first release layer 132 comprises germanium. In a specific embodiment, both the silicon-germanium structural layer and the germanium first release layer 132 are doped with boron dopant impurity atoms. The thickness of first release layer 132 may be any thickness suitable to provide a first suspended member at a desired distance above layer 122. Thus, in accordance with at least one embodiment of the manufacturing technique, the thickness of first release layer 132 is substantially the same as the thicknesses described in association with the height of gap 194, which is the gap between first suspended member 23 and layer 122 of FIG. 49.

Figure 17:
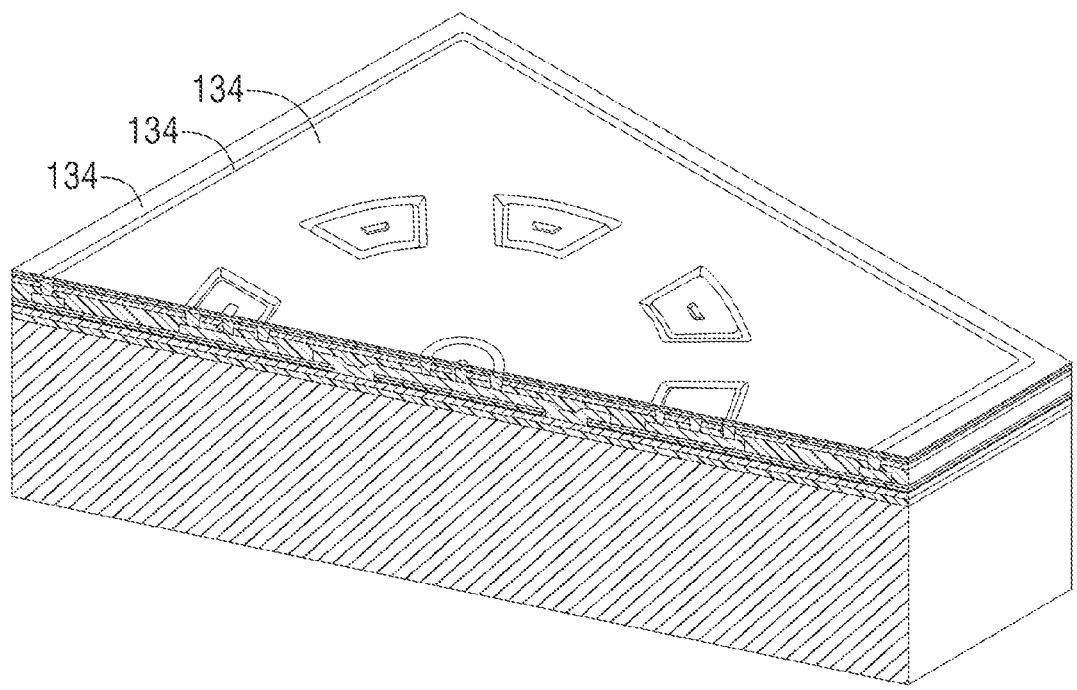
Figure 18:
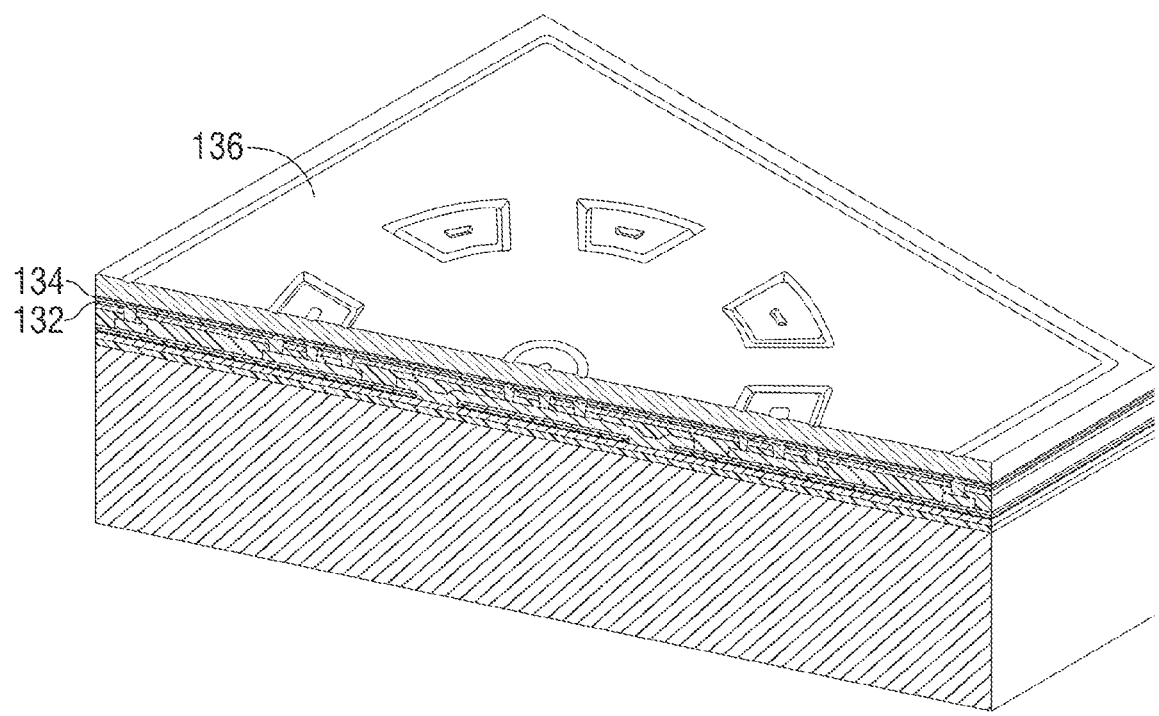

Referring to FIG. 17, in at least one embodiment of the manufacturing technique, an isolation layer (e.g., layer 134) is formed on first release layer 132. Layer 134 may be formed from any suitable isolation material using any suitable technique described above. In at least one embodiment, layer 134 is used as an etch-stop layer for etching of a first structural layer later formed on layer 134. Referring to FIG. 18, first structural layer 136 is formed above isolation layer 134 and first release layer 132. First structural layer 136 may be comprised of any material and have any thickness described in association with proof mass 180, which includes first suspended member 23, as illustrated in FIG. 49.

Figure 19:
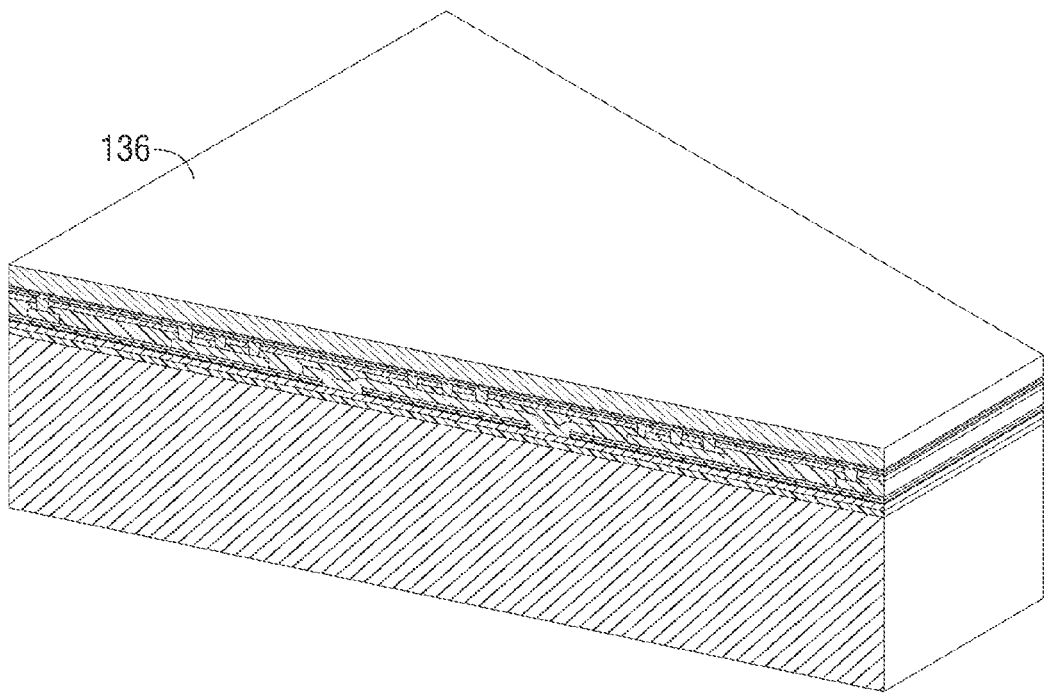

Referring back to FIG. 18, first structural layer 136 and first release layer 132 may be formed by any suitable deposition process that generates uniform material layers of consistent composition. For example, in at least one embodiment of the manufacturing technique, first structural layer 136 and first release layer 132 are deposited by a process selected from the group consisting of chemical vapor deposition, physical vapor deposition, atomic layer deposition, electroplating and electro-less plating. In at least one embodiment, first structural layer 136 and first release layer 132 are deposited by a low temperature deposition process. In at least one embodiment of the manufacturing technique, first structural layer 136 is deposited by a chemical vapor deposition using the gases $SiH_4$, $GeH_4$ and $BCl_3$ and first release layer 132 is deposited by a chemical vapor deposition using the gases $GeH_4$ and $BCl_3$. In at least one embodiment, first structural layer 136 and first release layer 132 are deposited by a low-pressure chemical vapor deposition process at a temperature less than 450° C. Referring to FIG. 19, in at least one embodiment of the manufacturing technique, first structural layer 136 is planarized by any suitable planarization technique that removes a portion of the material forming first structural layer 136 without exposing layer 134 or causing any degradation of structures formed from portions of layer 114.

Figure 20:
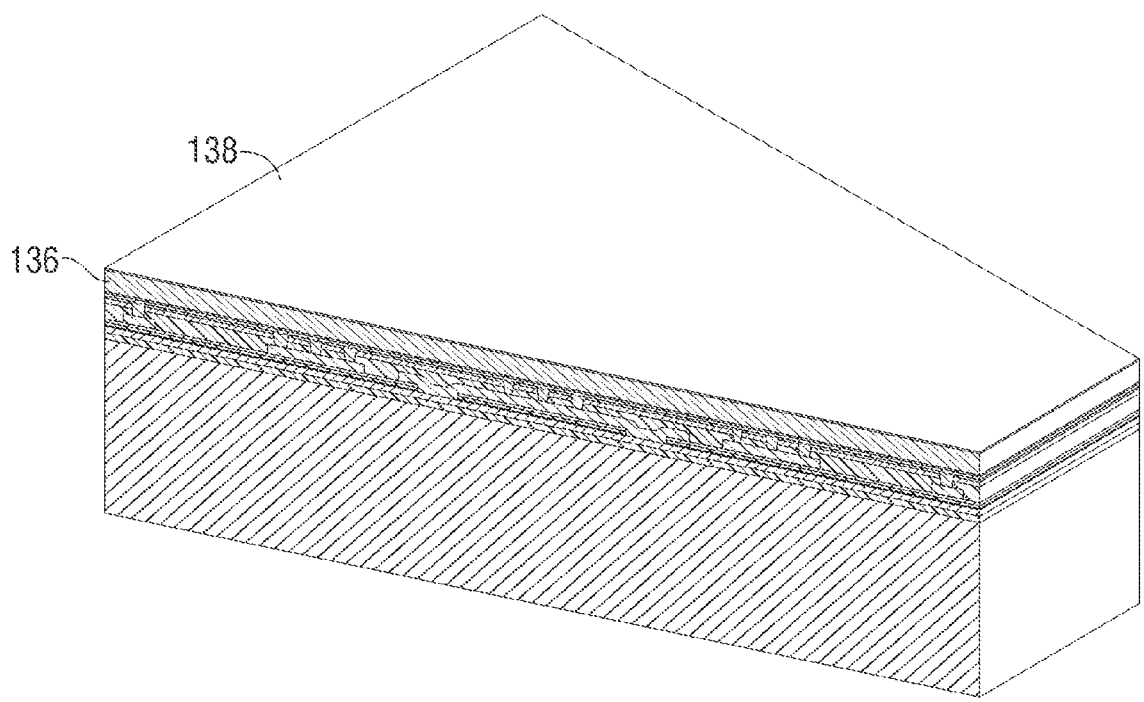

Referring to FIG. 20, in at least one embodiment of the manufacturing technique, a hard mask layer (e.g., hard mask layer 138) is deposited above first structural layer 136. In at least one embodiment, hard mask layer 138 is comprised of a material selected from the group consisting of silicon dioxide and silicon oxy-nitride. In at least one embodiment, hard mask layer 138 is comprised of silicon dioxide formed from a plasma-enhanced chemical vapor deposition process step.

Figure 21:
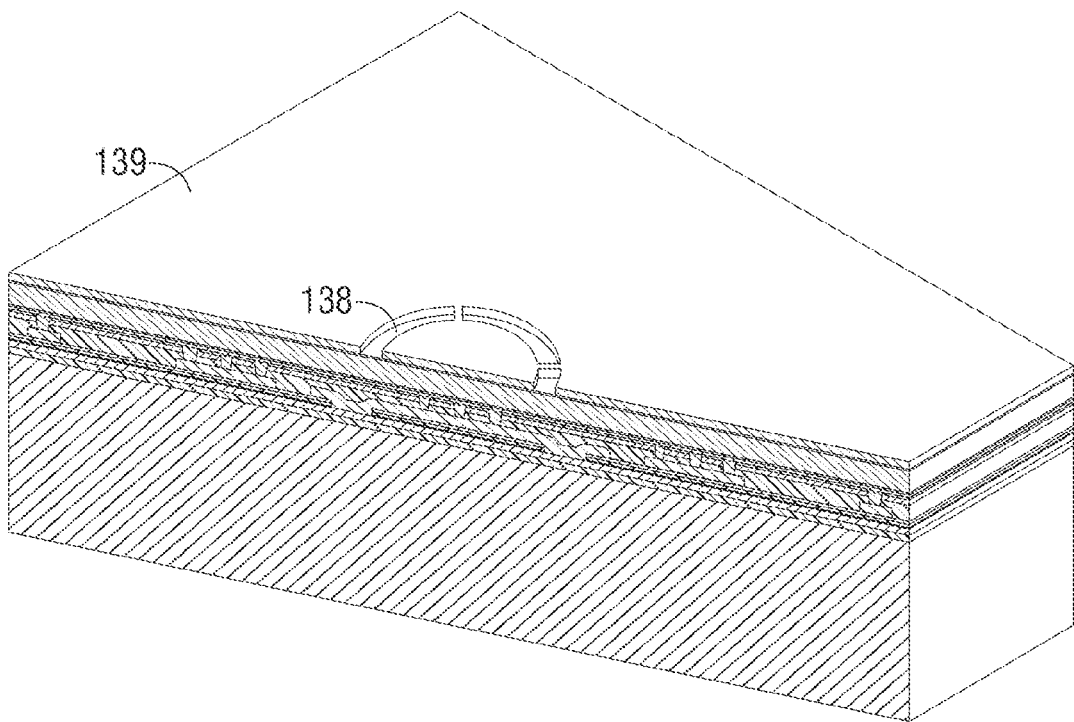
Figure 22:
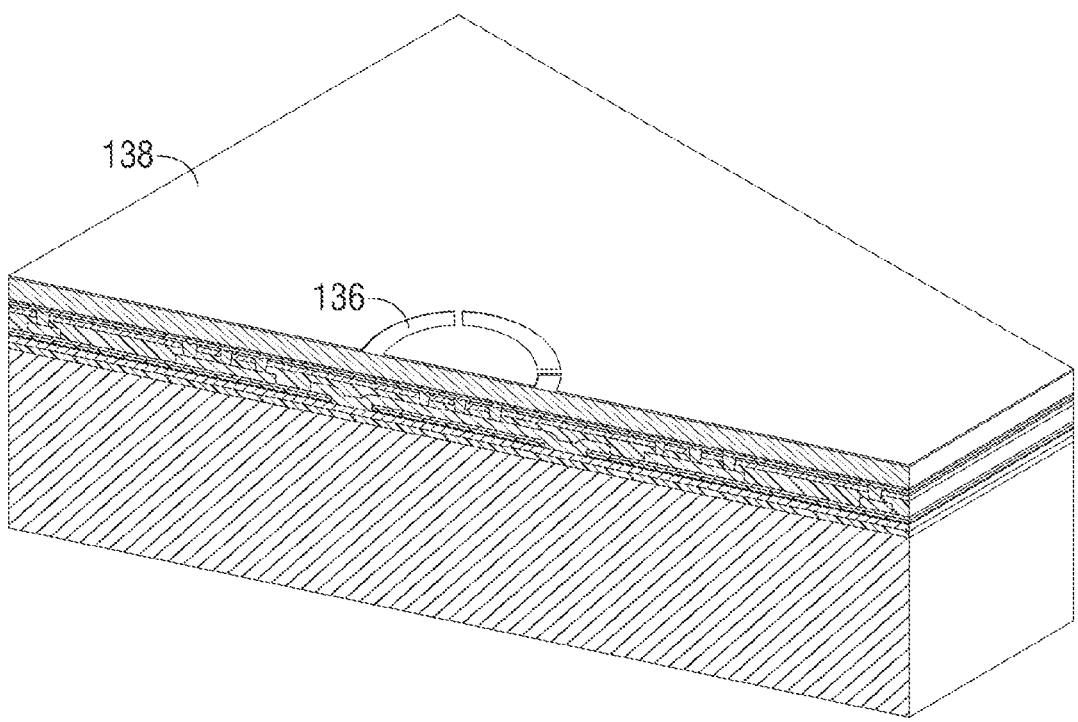
Figure 23:
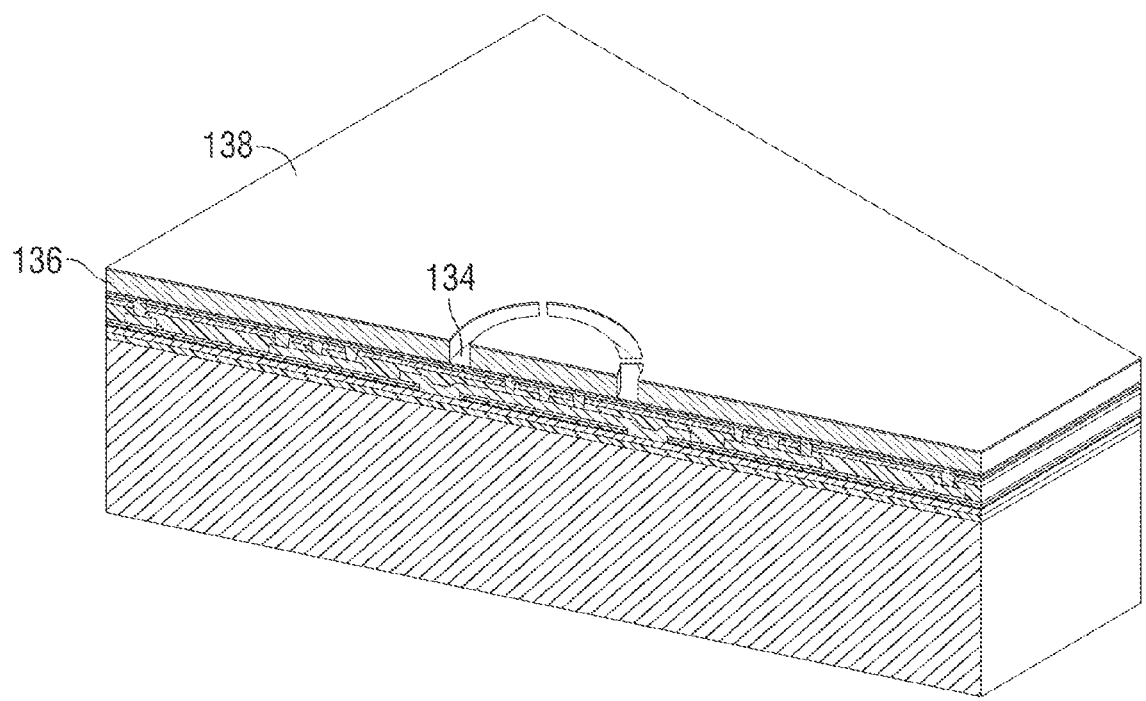

Referring to FIGS. 21-23, in at least one embodiment of the manufacturing technique, hard mask layer 138 is patterned with features desirable for the fabrication of MEMS structure 12 (e.g., features to form a temperature compensation portion of proof mass 180 of FIGS. 47 and 49). Referring back to FIG. 21, hard mask layer 138 may be patterned by any suitable patterning process that provides well-defined features of the appropriate dimensions. For example, in at least one embodiment of the manufacturing technique, hard mask layer 138 is patterned by forming a patterned positive photo-resist layer (e.g., layer 139 of FIG. 21) above hard mask layer 138 by exposure to a wavelength of light selected from the group consisting of 248 nm, 193 nm and 157 nm. In at least one embodiment of the manufacturing technique, an e-beam direct-write process is used to pattern positive photo-resist layer 139. In at least one embodiment of the manufacturing technique, hard mask layer 138 is etched by a dry etch process utilizing the gases $CHF_3$, $CF_4$ and $O_2$. As a result, openings in layer 138 reveal portions of first structural layer 136, as depicted in FIG. 22. Referring to FIG. 23, in at least one embodiment of the manufacturing technique, first structural layer 136 is patterned using any suitable technique to form openings in layers 138 and 136 that reveal portions of layer 134. Note that the openings in layers 138 and 136 may be formed in other locations of the MEMS structure 12.

Figure 24:
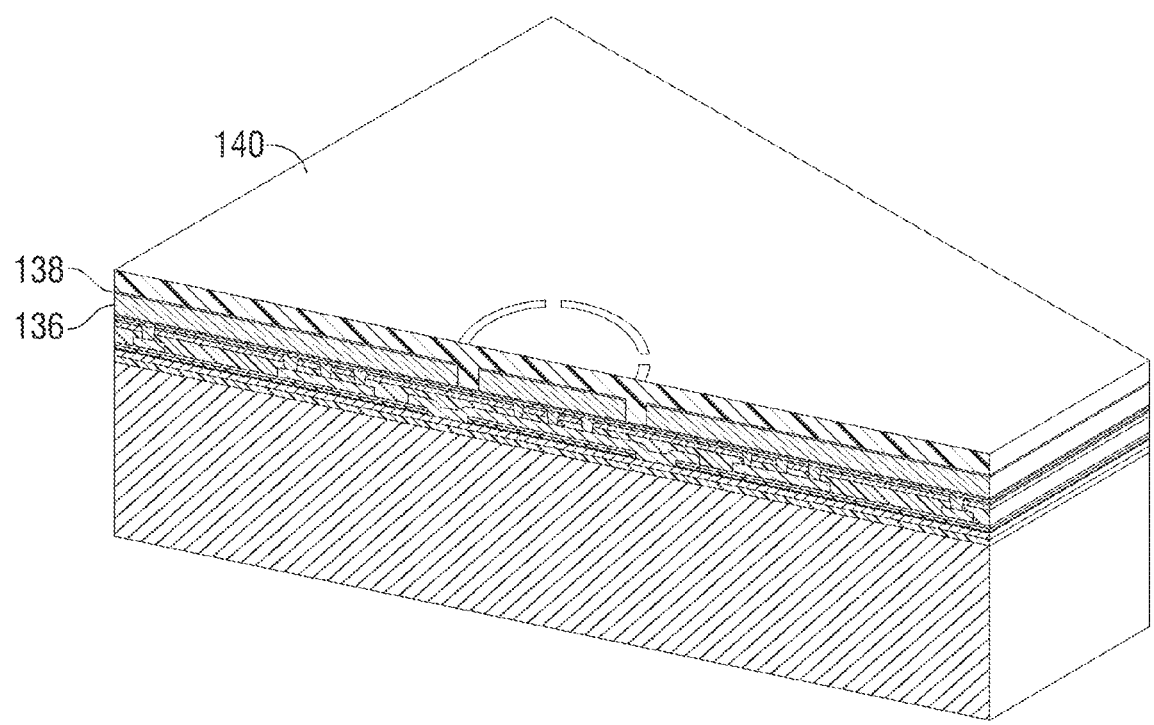
Figure 25:
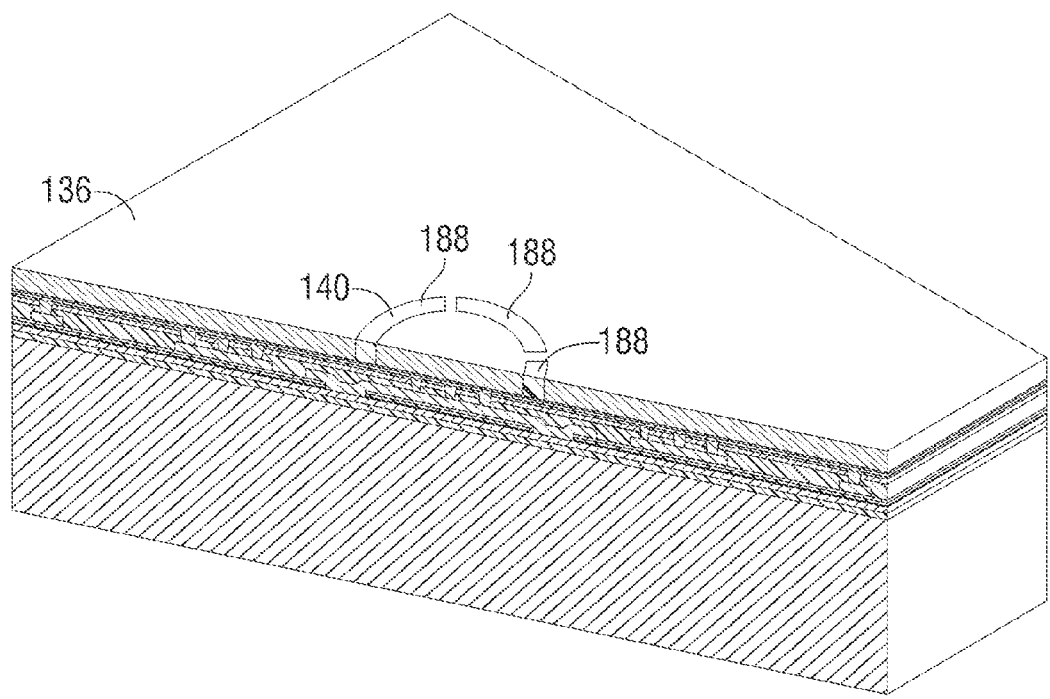

Referring to FIG. 24, in at least one embodiment of the manufacturing technique, a layer (e.g., layer 140) of material having a rate of thermal expansion different from the rate of thermal expansion of the material used to form first structural layer 136 is formed above layer 138 and fills the openings in layers 136 and 138 to provide a temperature compensation structure. In at least one embodiment, layer 140 is formed from any material and in any thickness suitable for providing temperature compensation for MEMS structure 12. In at least one embodiment, layer 140 is formed from oxide. Temperature compensation techniques consistent with the manufacturing techniques described herein are described in U.S. Pat. No. 7,639,104, filed Mar. 9, 2007, entitled "Method for Temperature Compensation in MEMS Resonators with Isolated Regions of Distinct Material," naming Emmanuel P. Quevy and David H. Bernstein as inventors. U.S. Pat. No. 7,591,201, filed Mar. 9, 2007, entitled "MEMS Structure Having a Compensated Resonating Member," naming David H. Bernstein, Roger T. Howe, and Emmanuel P. Quevy as inventors, and U.S. Pat. No. 7,514,853, filed May 10, 2007, entitled "MEMS Structure Having a Stress Inverter Temperature-Compensated Resonating Member." naming Roger T. Howe, Emmanuel P. Quevy, and David H. Bernstein as inventors, which applications are hereby incorporated by reference. Referring to FIG. 25, in at least one embodiment of the manufacturing technique, hard mask layer 138 and portions of layer 140 above hard mask layer 138 are removed, leaving a substantially planar surface of first structural layer 136 including temperature compensation portions 188 formed from portions of layer 140.

Figure 26:
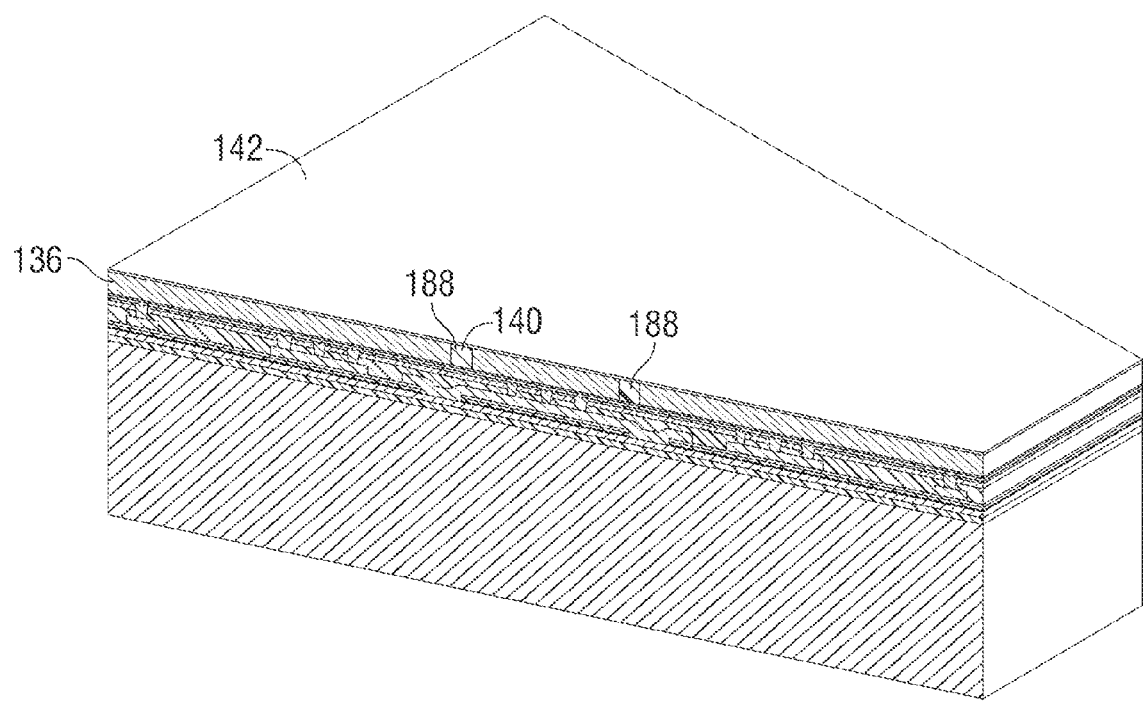
Figure 27:
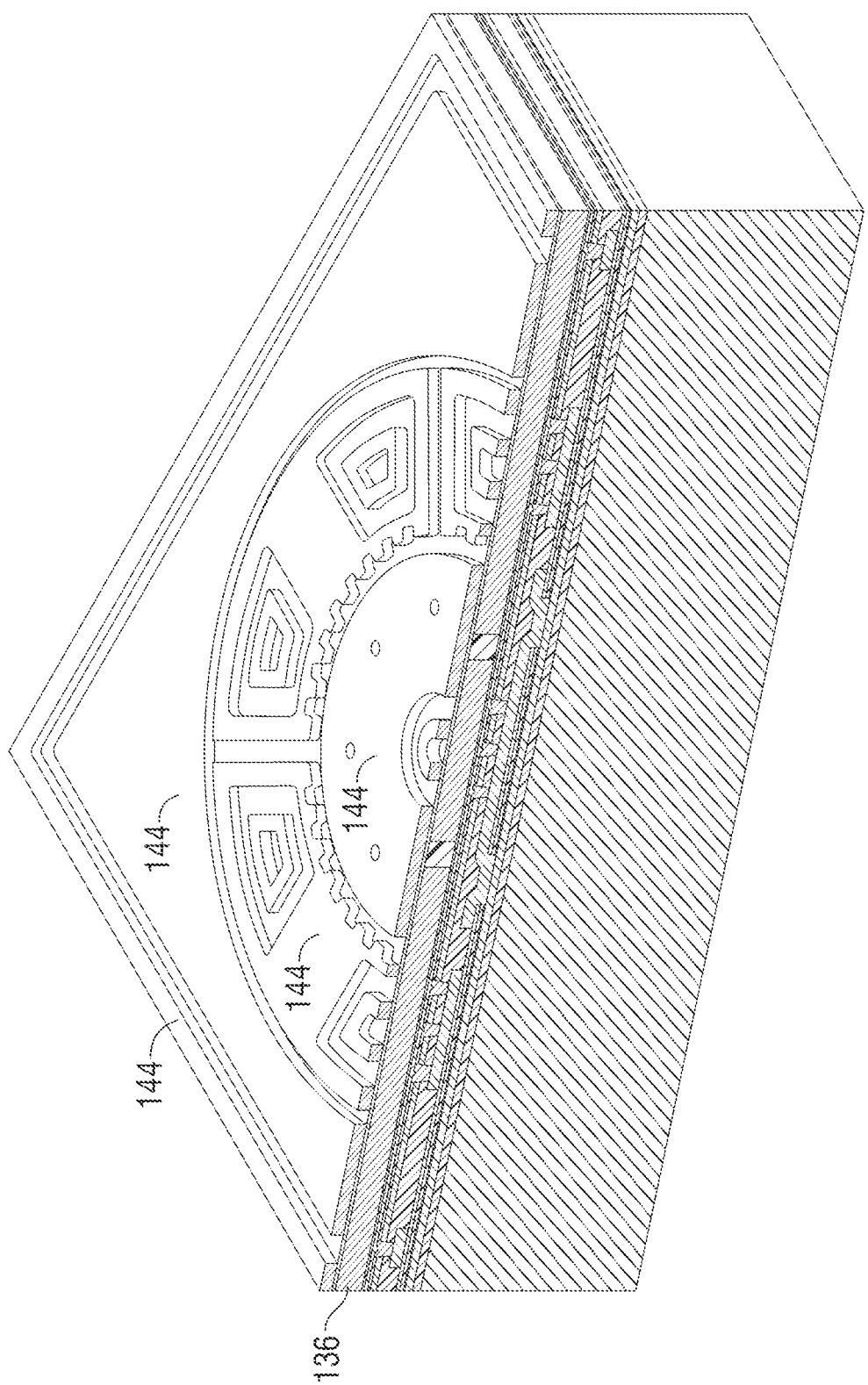
Figure 28:
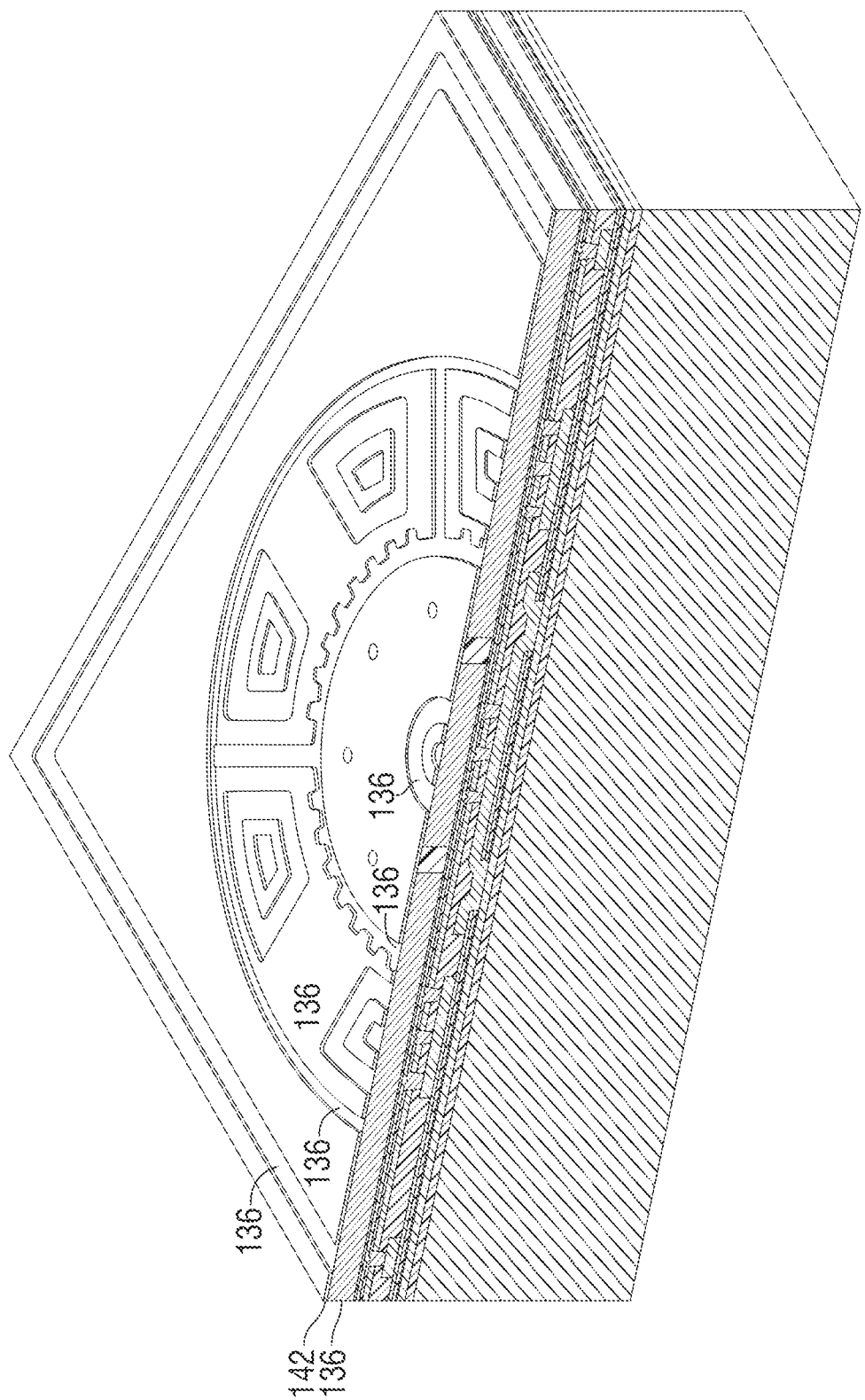

Referring to FIG. 26, in at least one embodiment of the manufacturing technique, a hard mask layer (e.g., hard mask layer 142) is deposited above first structural layer 136 and temperature compensation portions 188. In at least one embodiment, hard mask layer 142 is comprised of a material selected from the group consisting of silicon dioxide and silicon oxy-nitride. In at least one embodiment, hard mask layer 142 is comprised of silicon dioxide formed from a plasma-enhanced chemical vapor deposition process step. Referring to FIG. 27, in at least one embodiment, hard mask layer 142 is patterned (e.g., using photoresist layer 144) with features desirable for the fabrication of a MEMS structure (e.g., features to form electrodes 182 and proof mass 180 of FIG. 49). As a result, openings in layer 142 reveal portions of layer 136, as depicted in FIG. 28.

Figure 29:
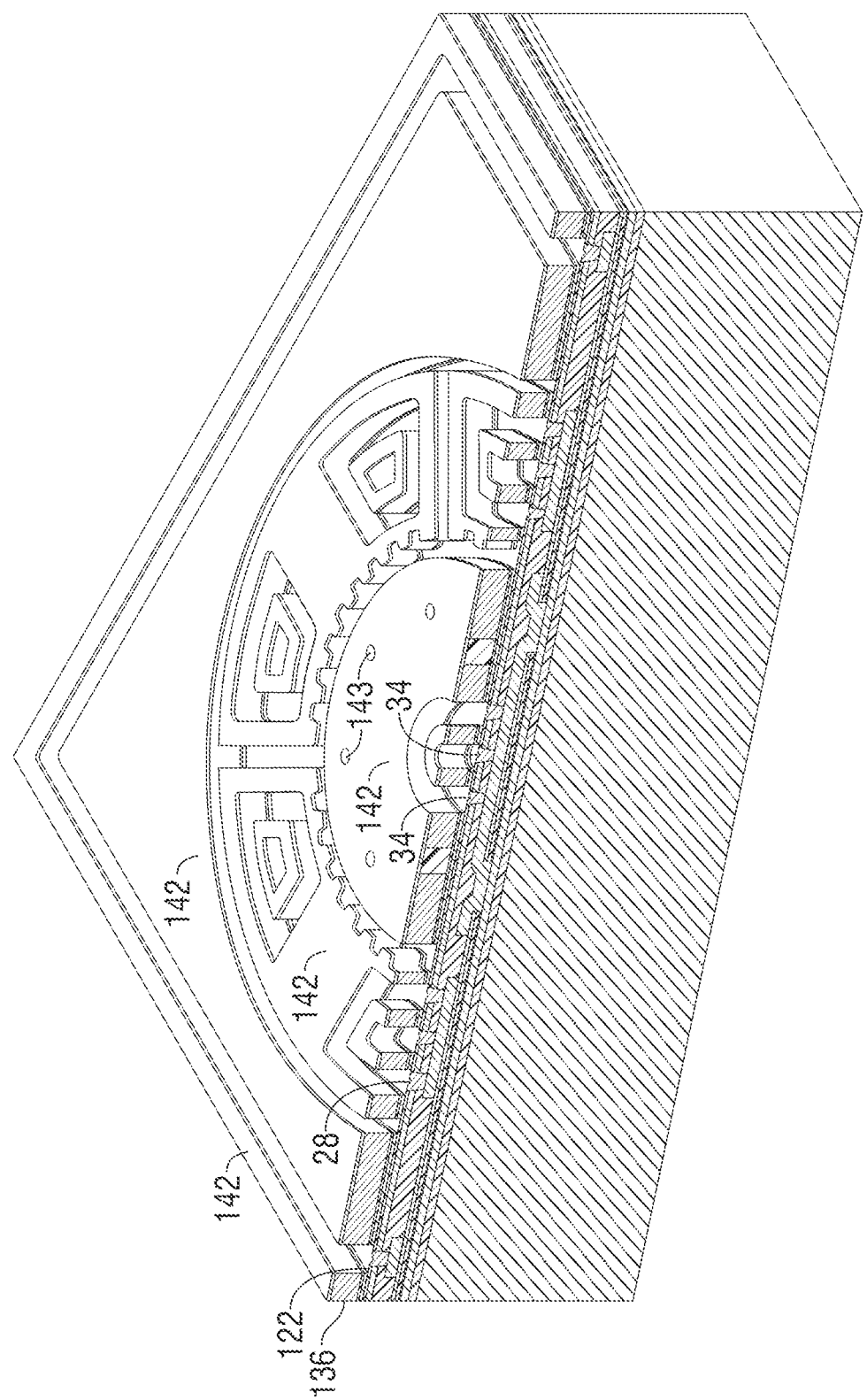

Referring to FIG. 29, in at least one embodiment of the manufacturing technique, first structural layer 136 and first release layer 132 are patterned to form openings in first structural layer 136, layer 134, and first release layer 132 that reveal portions of layer 122 and interconnects 28 and 34. In at least one embodiment of the manufacturing technique, one or more release holes 143 are formed for use by a subsequent release operation.

Figure 30:
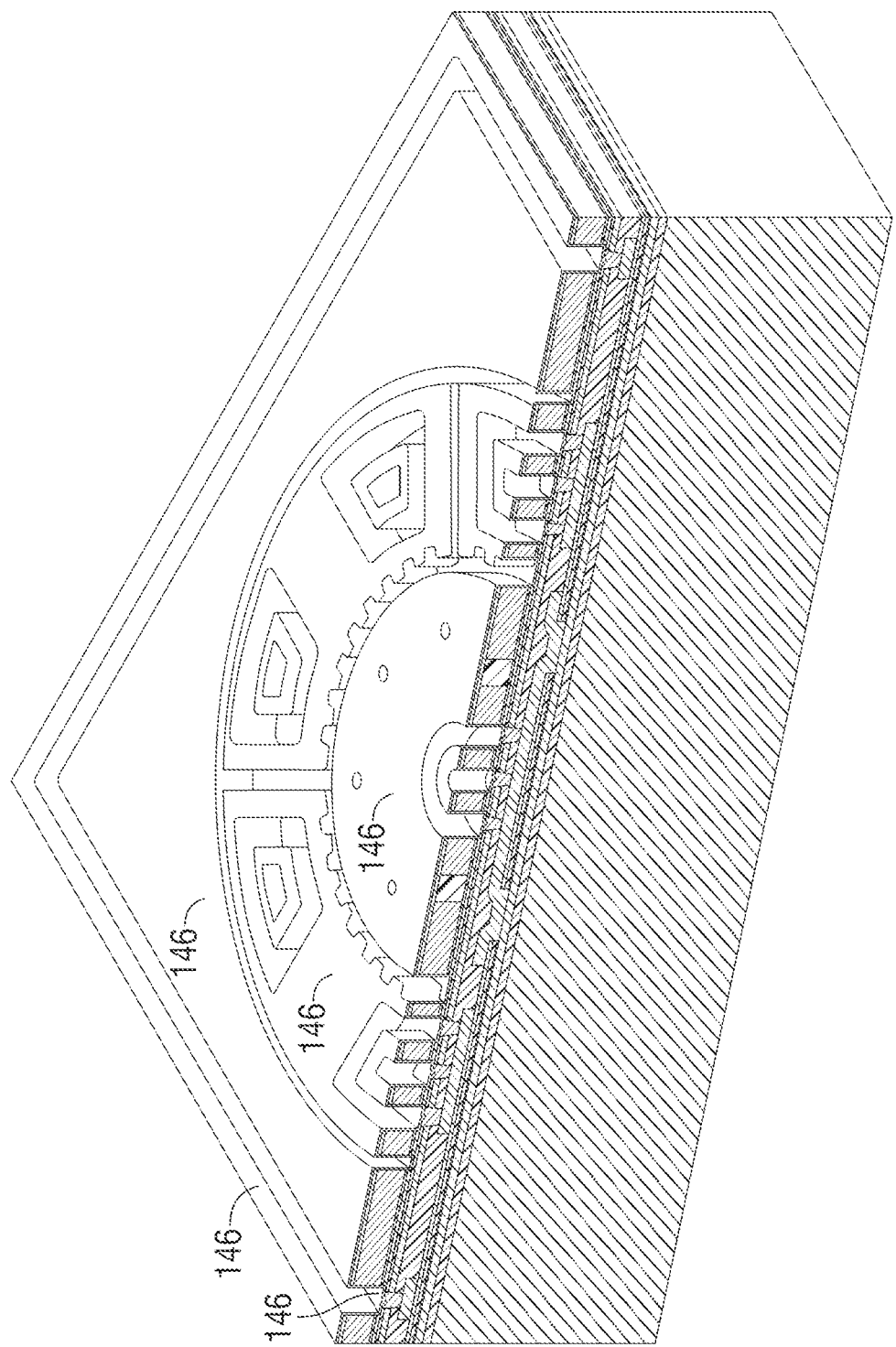

Referring to FIG. 30, in at least one embodiment of the manufacturing technique, a conformal release layer (e.g., release layer 146) is deposited above the patterned first structural layer 136. Release layer 146 may be comprised of any material described above in association with first release layer 132. In at least one embodiment of the manufacturing technique, release layer 146 is formed from substantially the same material as first release layer 132. In at least one embodiment of the manufacturing technique, release layer 146 is formed from a different material than first release layer 132. Release layer 146 may be formed to a thickness suitable to provide a spacing between a suspended portion of first structural layer 136 and any subsequently formed layer. In at least one embodiment of the manufacturing technique, the thickness of release layer 146 is approximately the same as the thickness of first release layer 132.

Figure 31:
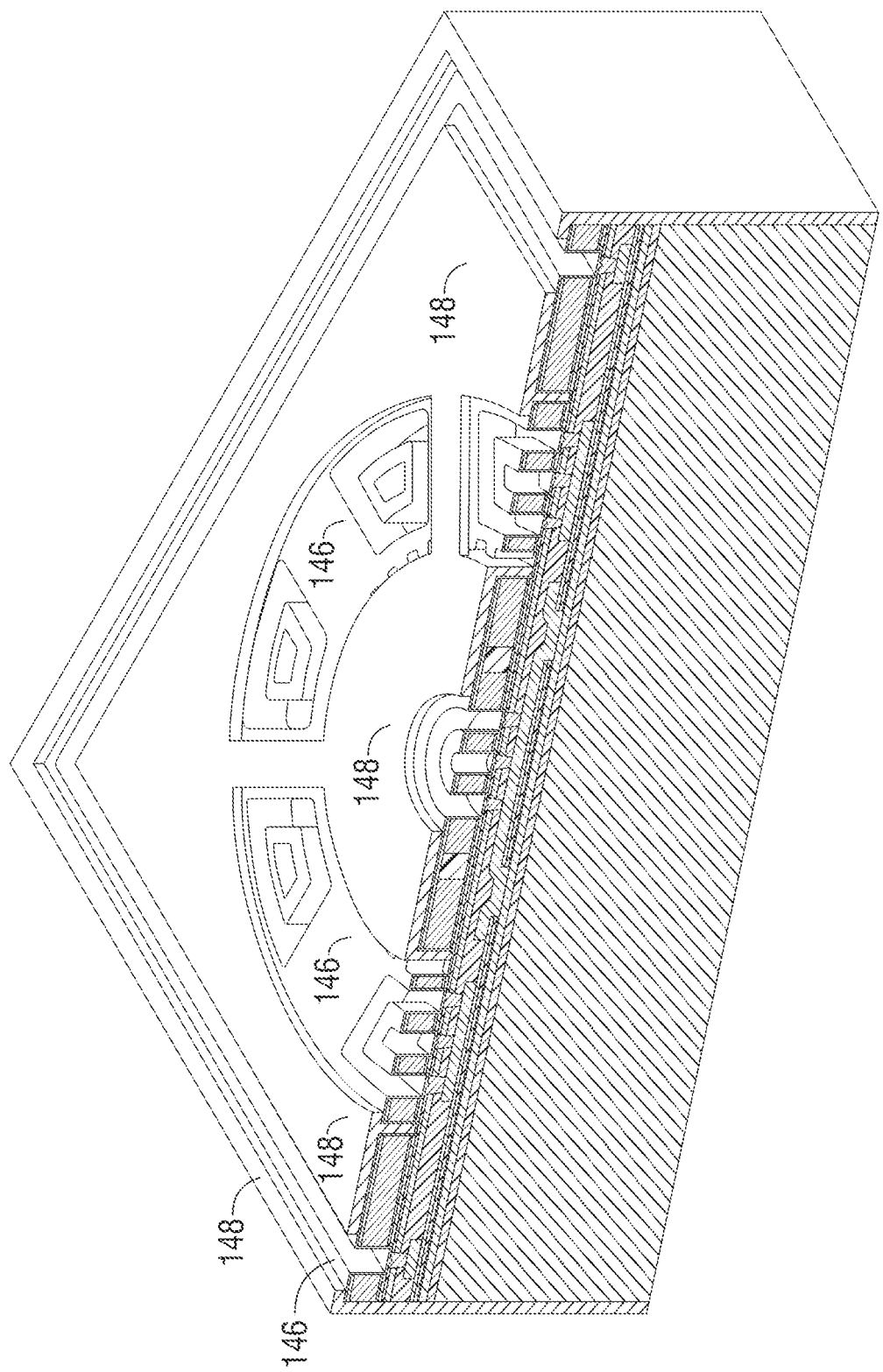
Figure 32:
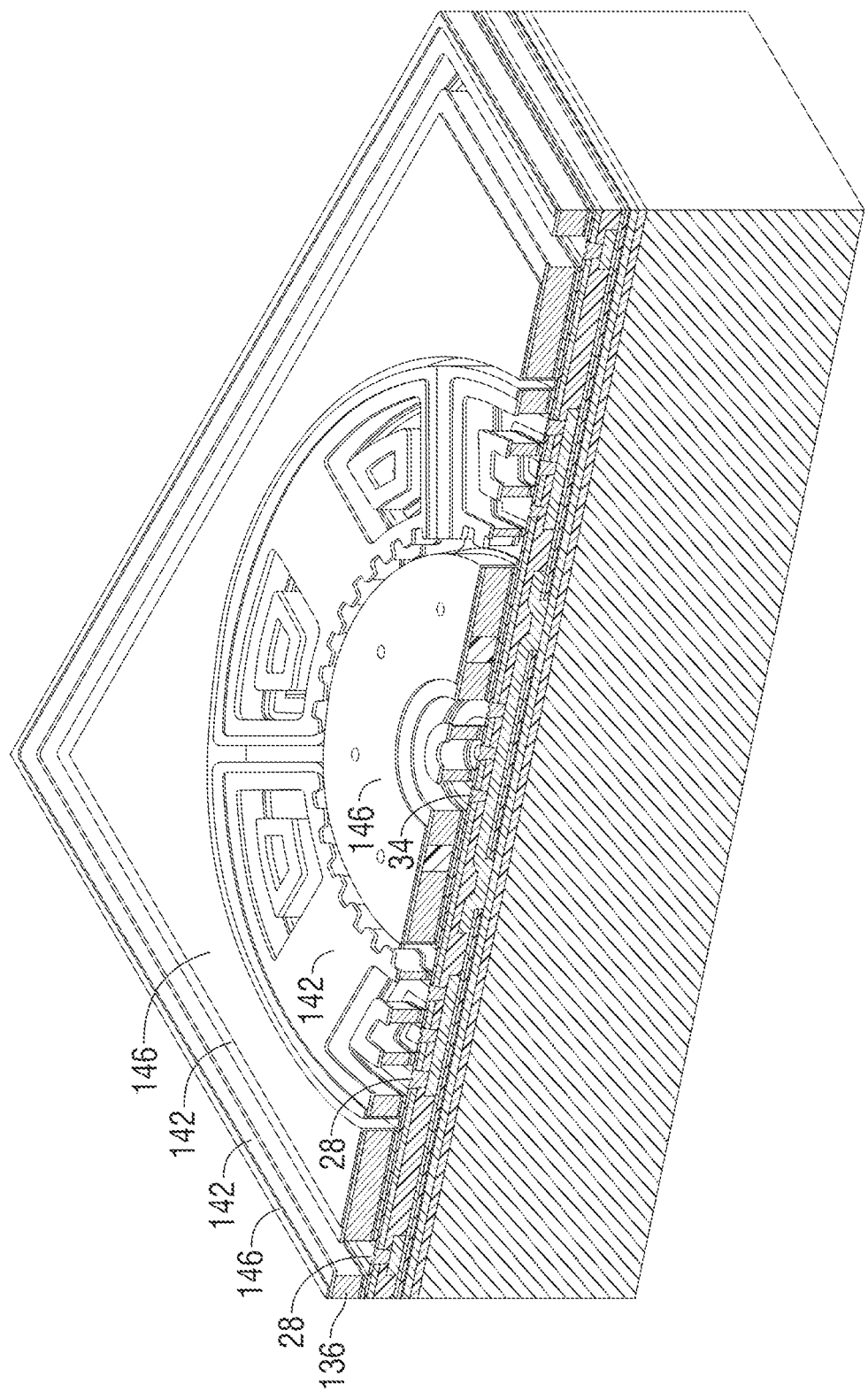

Referring to FIG. 31, in at least one embodiment of the manufacturing technique, release layer 146 is patterned by any suitable patterning process that provides well-defined features of the appropriate dimensions. For example, in at least one embodiment of the manufacturing technique, release layer 146 is patterned by forming a patterned positive photo-resist layer (e.g., layer 148 of FIG. 31) above release layer 146 by exposure to a wavelength of light selected from the group consisting of 248 nm, 193 nm and 157 nm. In at least one embodiment of the manufacturing technique, an e-beam direct-write process is used to pattern positive photo-resist layer 148. In at least one embodiment of the manufacturing technique, release layer 146 is etched by a dry etch process utilizing the gases $CHF_3$, $CF_4$ and $O_2$. As a result, openings in release layer 146 reveal portions of layer 142, portions of layer 122, and interconnects 28 and 34, as depicted in FIG. 32.

Figure 33:
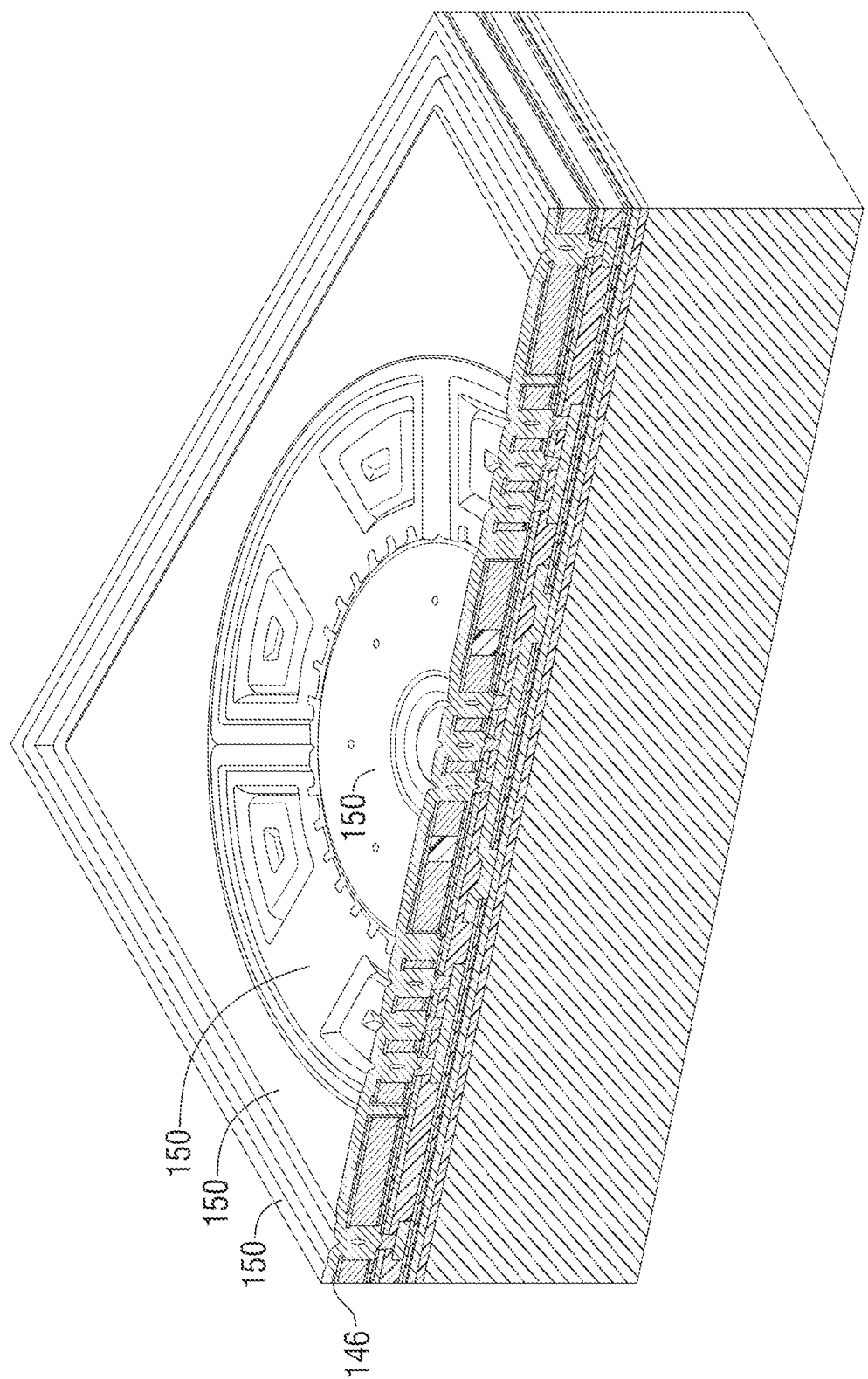
Figure 34:
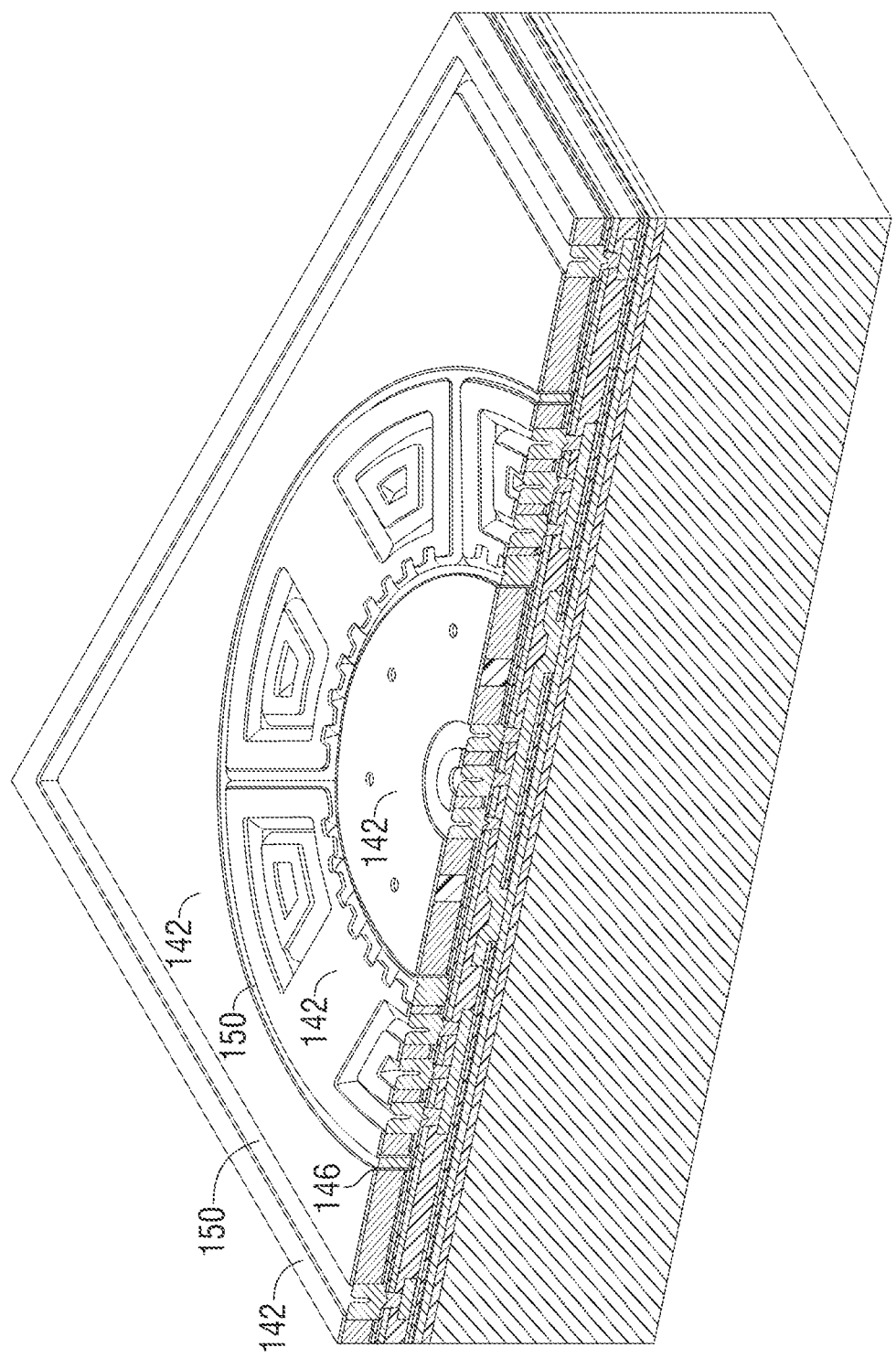

Referring to FIG. 33, in at least one embodiment of the manufacturing technique, a conformal layer of conductive material (e.g., layer 150) is formed on the patterned release layer 146. Layer 150 is comprised of any conductive material that can act as a suitable adhesion layer. In at least one embodiment, layer 150 comprises silicon-germanium and may be formed by any technique suitable to provide a conformal layer on the sidewalls of release layer 146. In at least one embodiment of the manufacturing technique, conformal layer 150 is deposited by a Low Pressure Chemical Vapor deposition process to a thickness in the range of approximately 1-2 microns. Referring to FIG. 34, in at least one embodiment of the manufacturing technique, layer 150 and layer 146 are removed from the surface, leaving portions of layer 150 and layer 146 only in openings in the surface of layers 150 and 142. The remaining portions of layer 150 extend electrical contacts to the surface of layer 142. In addition, remaining portions of layer 150 fill openings in the surface of layer 142 that define the MEMS structure (e.g., separate MEMS structure 12 from dummy structures and separate electrodes 182 from each other).

Figure 35:
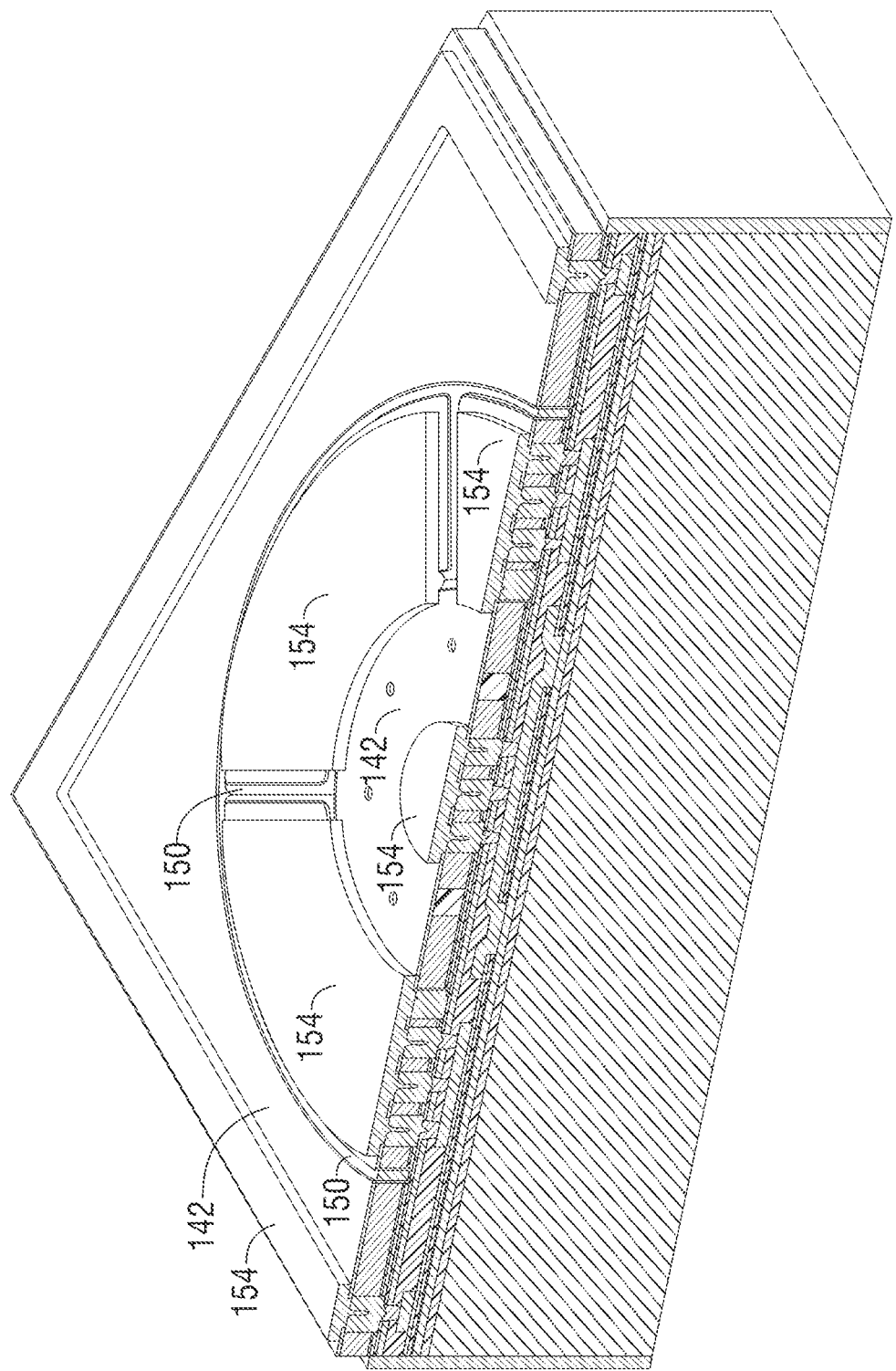
Figure 36:
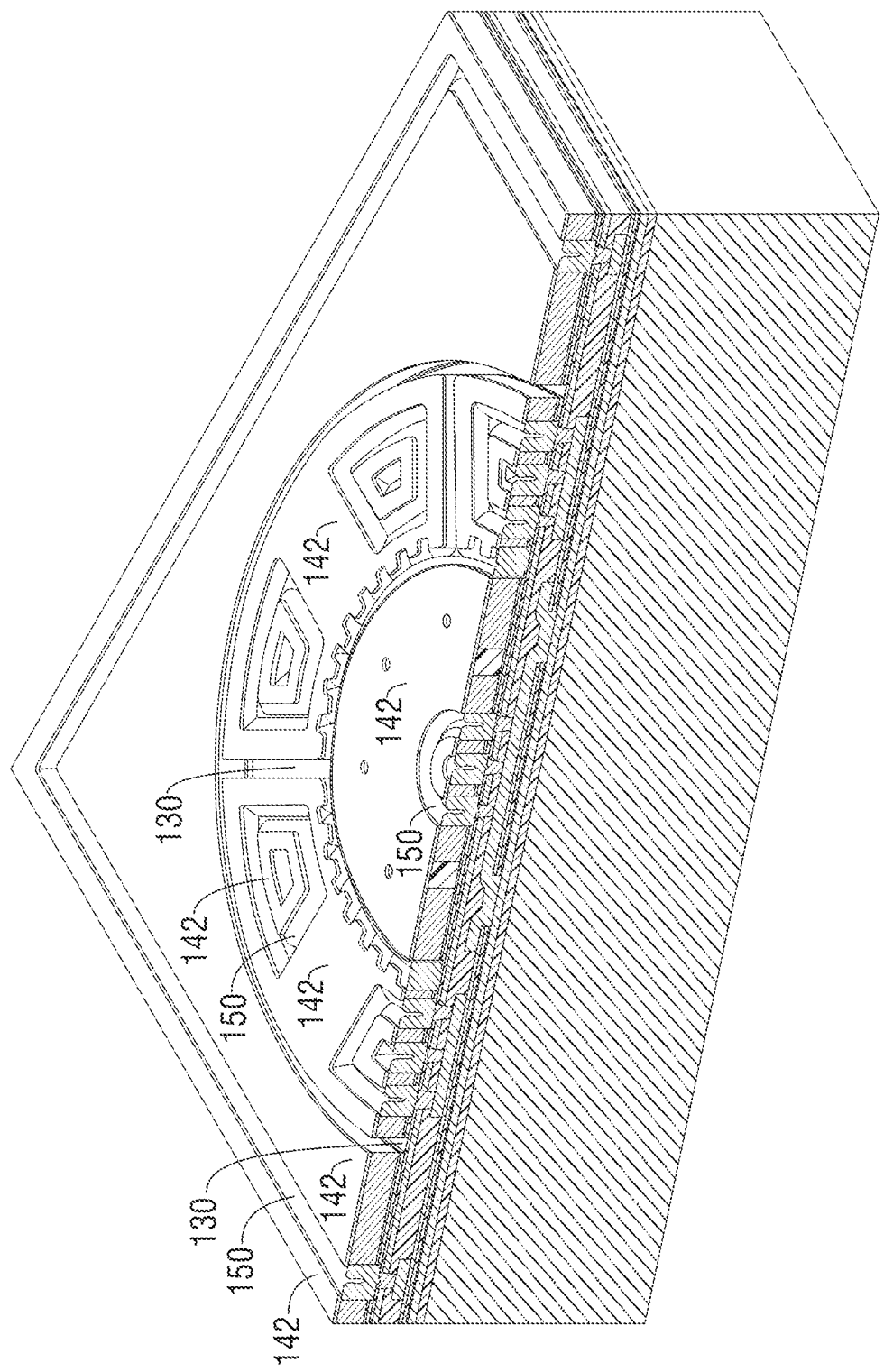

Referring to FIG. 35, in at least one embodiment of the manufacturing technique, photolithography is used to form a patterned coating of photoresist (e.g., patterned layer 154) above layer 142. Excess portions of layer 150 are removed (e.g., etched) to separate the MEMS structure from dummy structures and to separate electrodes 154 from each other, as depicted in FIG. 36.

Figure 37:
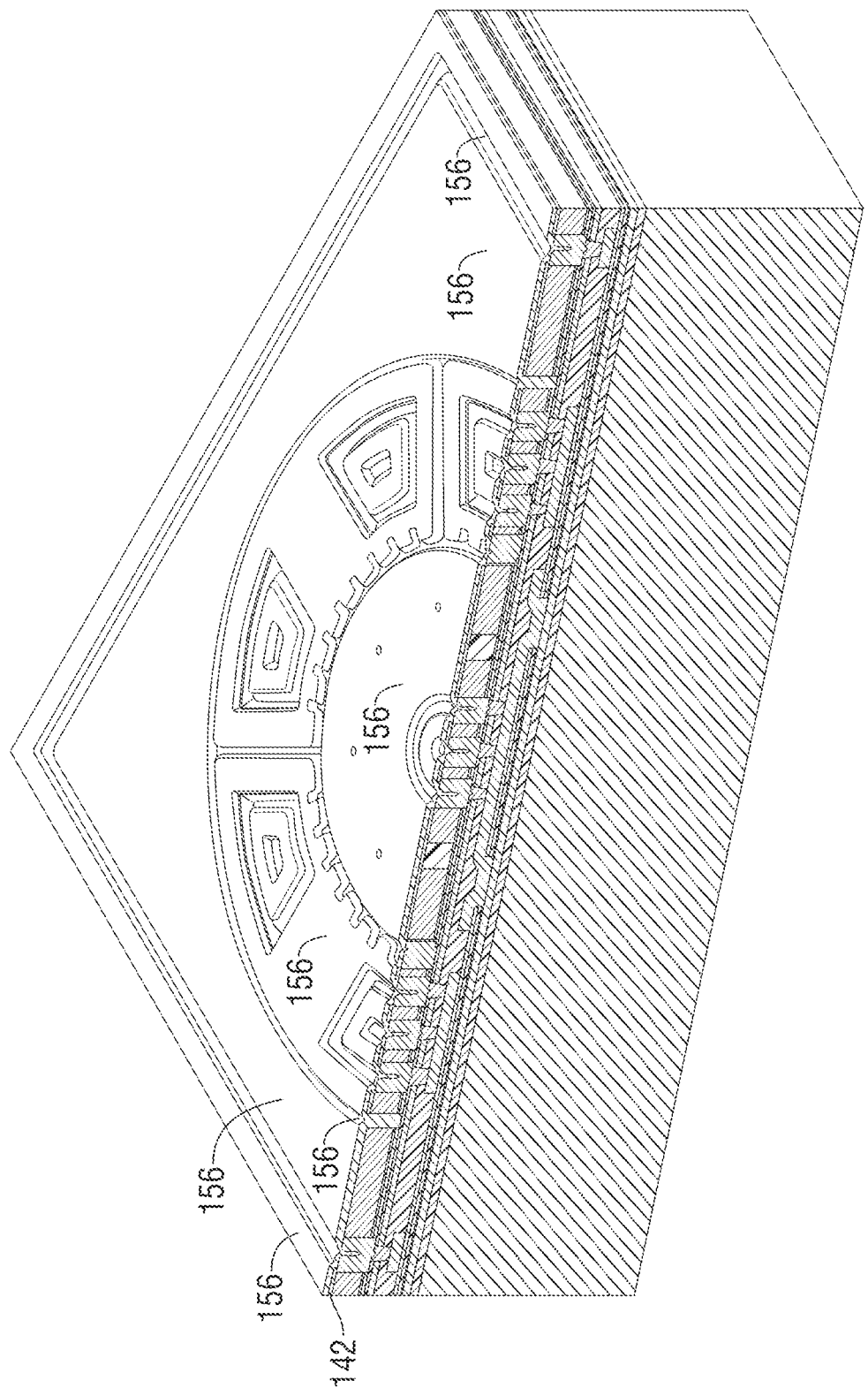
Figure 38:
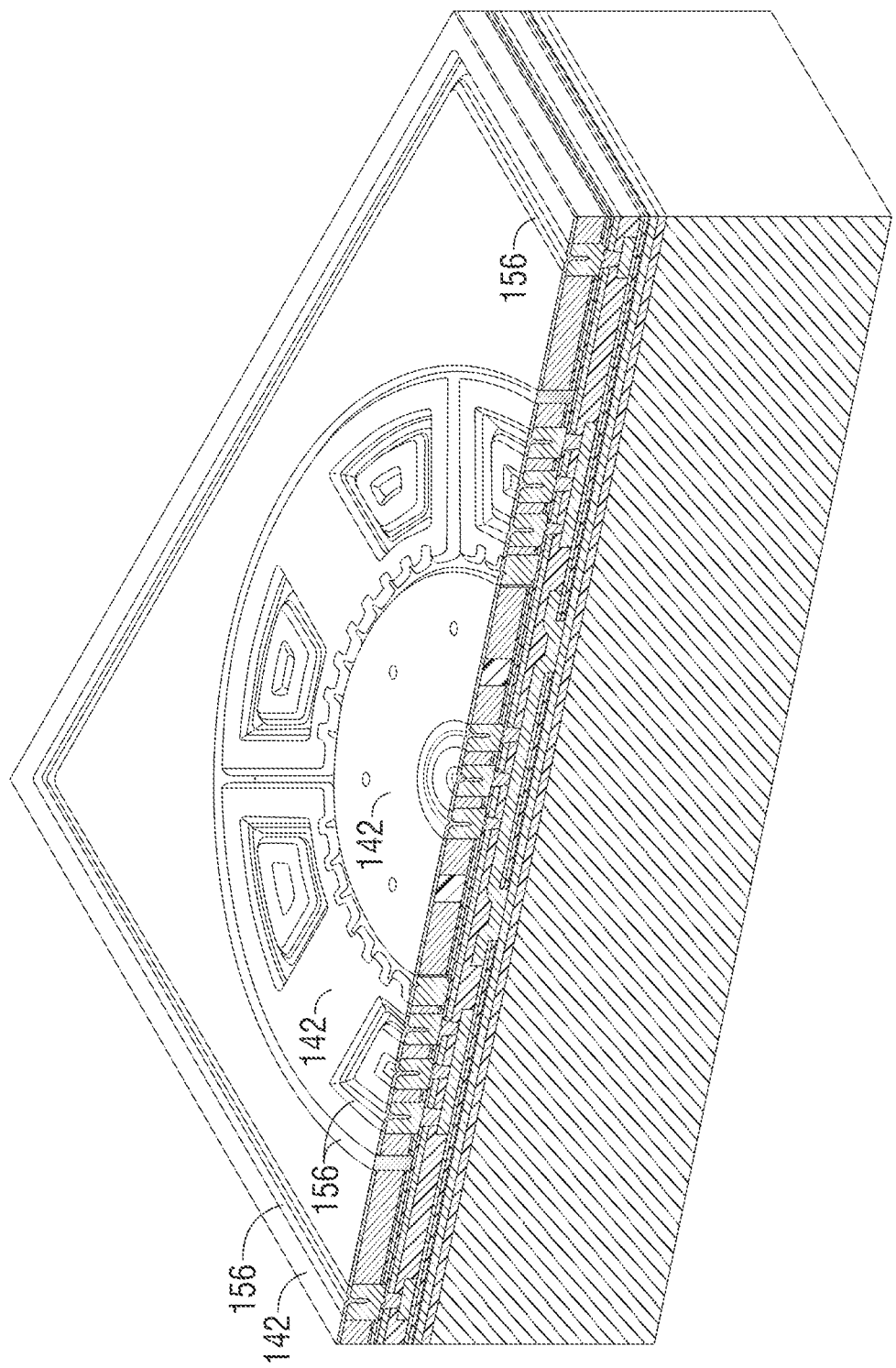
Figure 39:
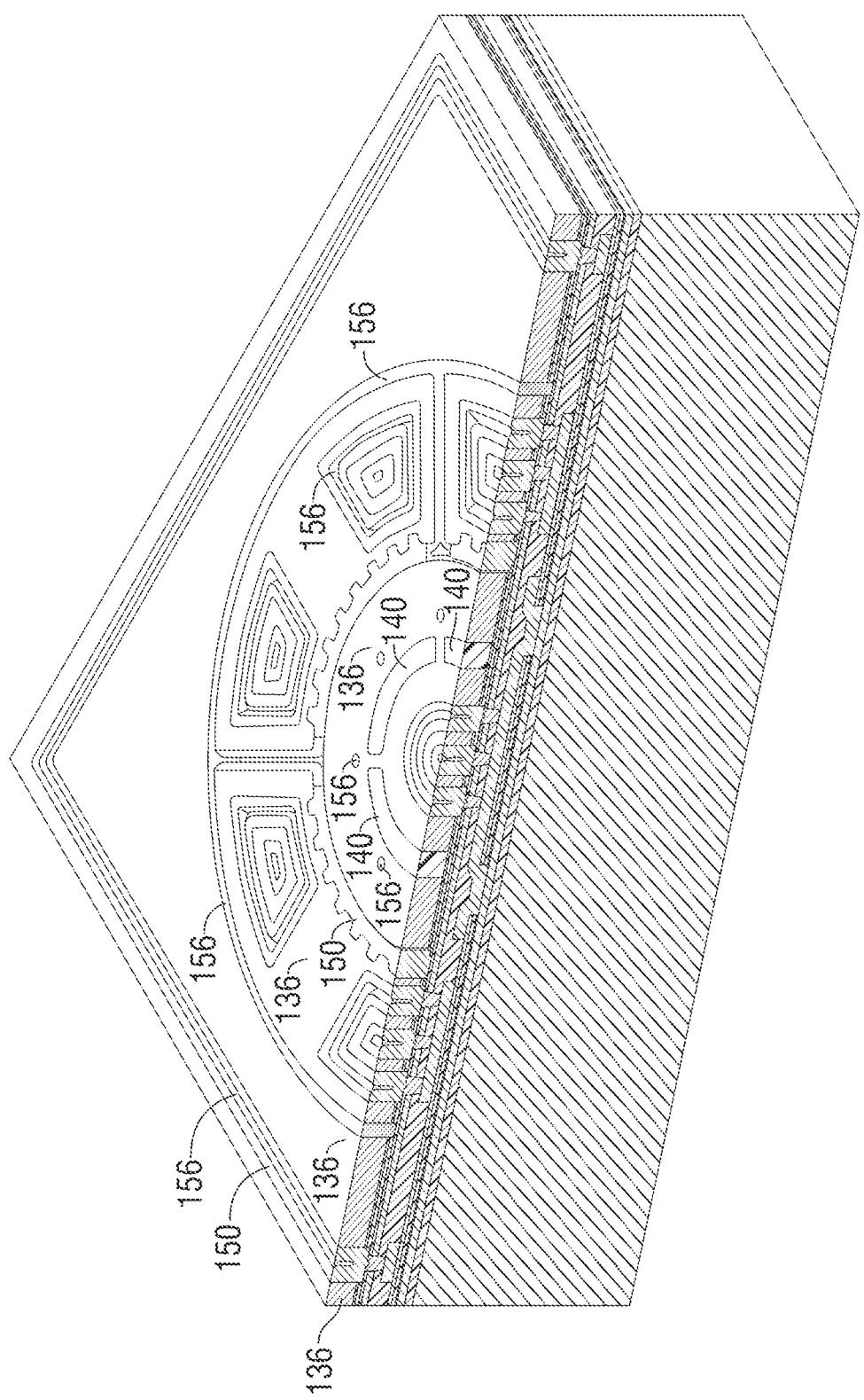

Referring to FIG. 37, in at least one embodiment of the manufacturing technique, layer 156 is formed above layer 142 to form release material in openings and gaps that define the MEMS structure and separate the electrodes. In at least one embodiment, layer 156 is formed from any suitable material described above with respect to first release layer 132 and release layer 146. Portions of layer 156 on the above layer 142 are removed and portions of layer 156 remain in the openings and gaps that define the MEMS structure and separate the electrodes, as depicted in FIG. 38. Referring to FIG. 39, layer 142 is removed by any suitable technique and the resulting structures form an unreleased first structural region of a MEMS device (e.g., unreleased first structural region 22).

Figure 40:
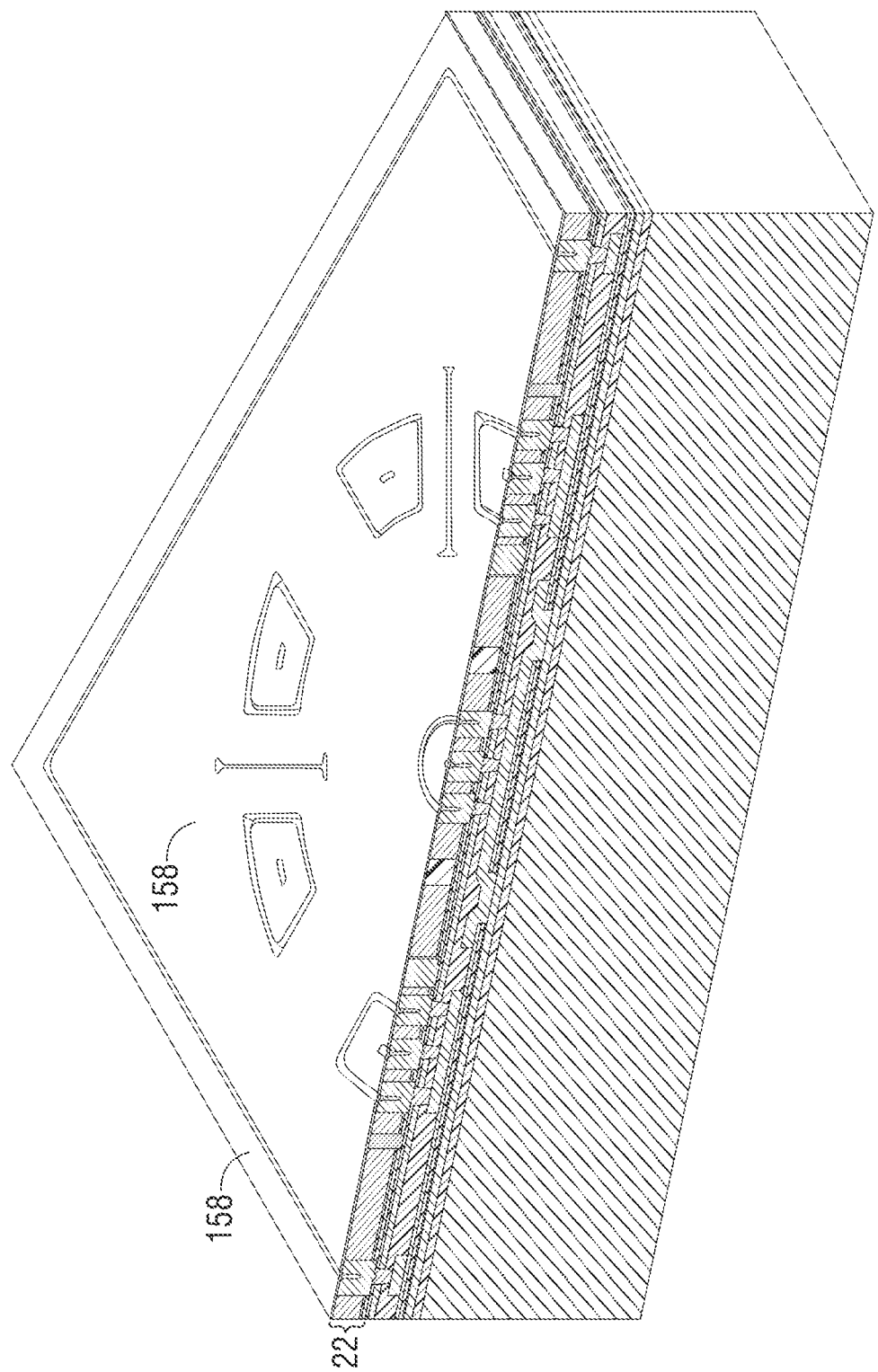

Referring to FIG. 40, an etch-stop layer (e.g., etch-stop layer 158) is formed on the unreleased first structural region 22. Etch-stop layer 158 is comprised of any material suitable to act as an etch-stop layer during subsequent processing steps. In at least one embodiment, etch-stop layer 158 is a material that may be removed in a later release step (e.g., using an $H_2O_2$ release). In at least one embodiment of the processing technique, etch-stop layer 158 comprises a titanium layer. Etch-stop layer 158 may be formed by any suitable process to provide substantially uniform coverage of the unreleased first structural layer 136 of the structure of FIG. 39. In at least one embodiment of the processing technique, etch-stop layer 158 is in the range of approximately 0.05-0.2 microns thick.

Figure 41:
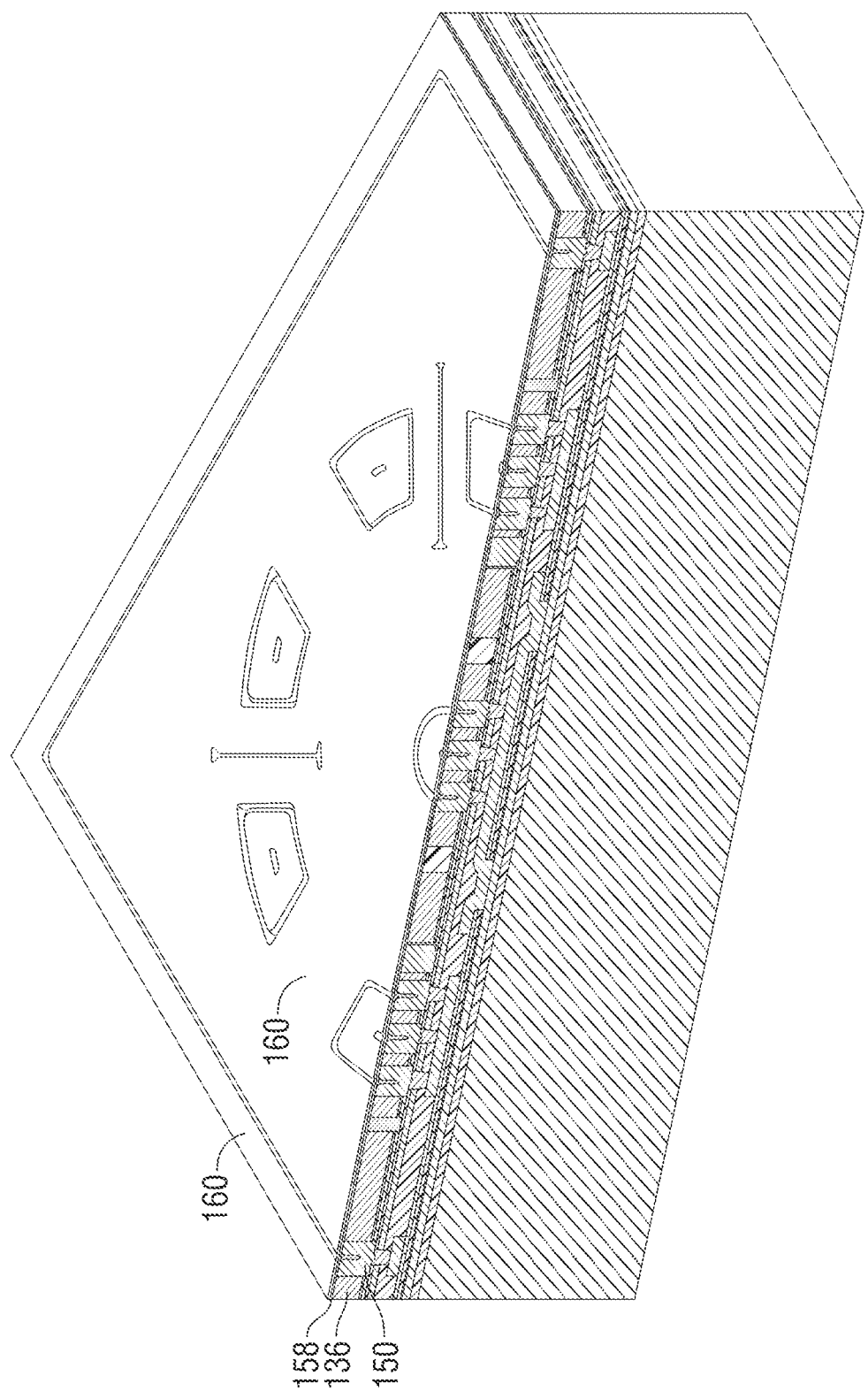

Referring to FIG. 41, in at least one embodiment of the processing technique, release layer 160 is formed above etch-stop layer 158. Release layer 160 may comprise any material described above with respect to first release layer 132 suitable to withstand a MEMS fabrication process. For example, in accordance with an embodiment of the present invention, etch-stop layer 158 is comprised of an insulator layer, a subsequently formed structural layer is comprised of silicon-germanium, and release layer 160 comprises germanium. In at least one embodiment, both the silicon-germanium structural layer and the germanium release layer 160 are doped with boron dopant impurity atoms. The thickness of release layer 160 may be any thickness suitable to provide an adequate gap between first suspended member 23 and structures above first suspended member 23 (e.g., 0.5 um). In at least one embodiment, release layer 160 is deposited using LPCVD or PECVD technique. In at least one embodiment of the processing technique, etch-stop layer 158 is a titanium layer and release layer 160 is a germanium layer. The titanium layer may enhance the growth speed of the germanium release layer by a metal-induced-crystallization phenomenon, which facilitates faster and/or cheaper deposition.

Figure 42:
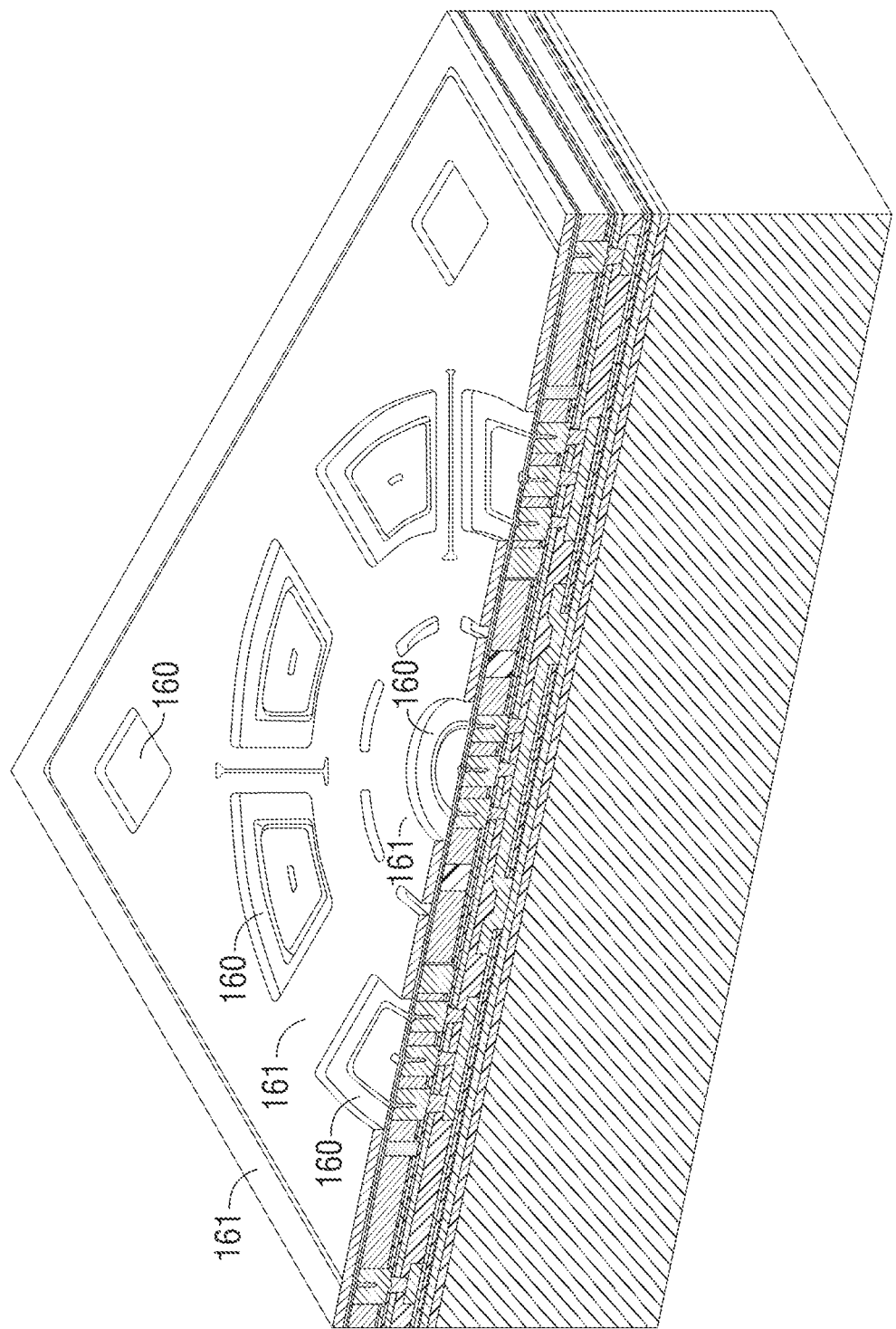
Figure 43:
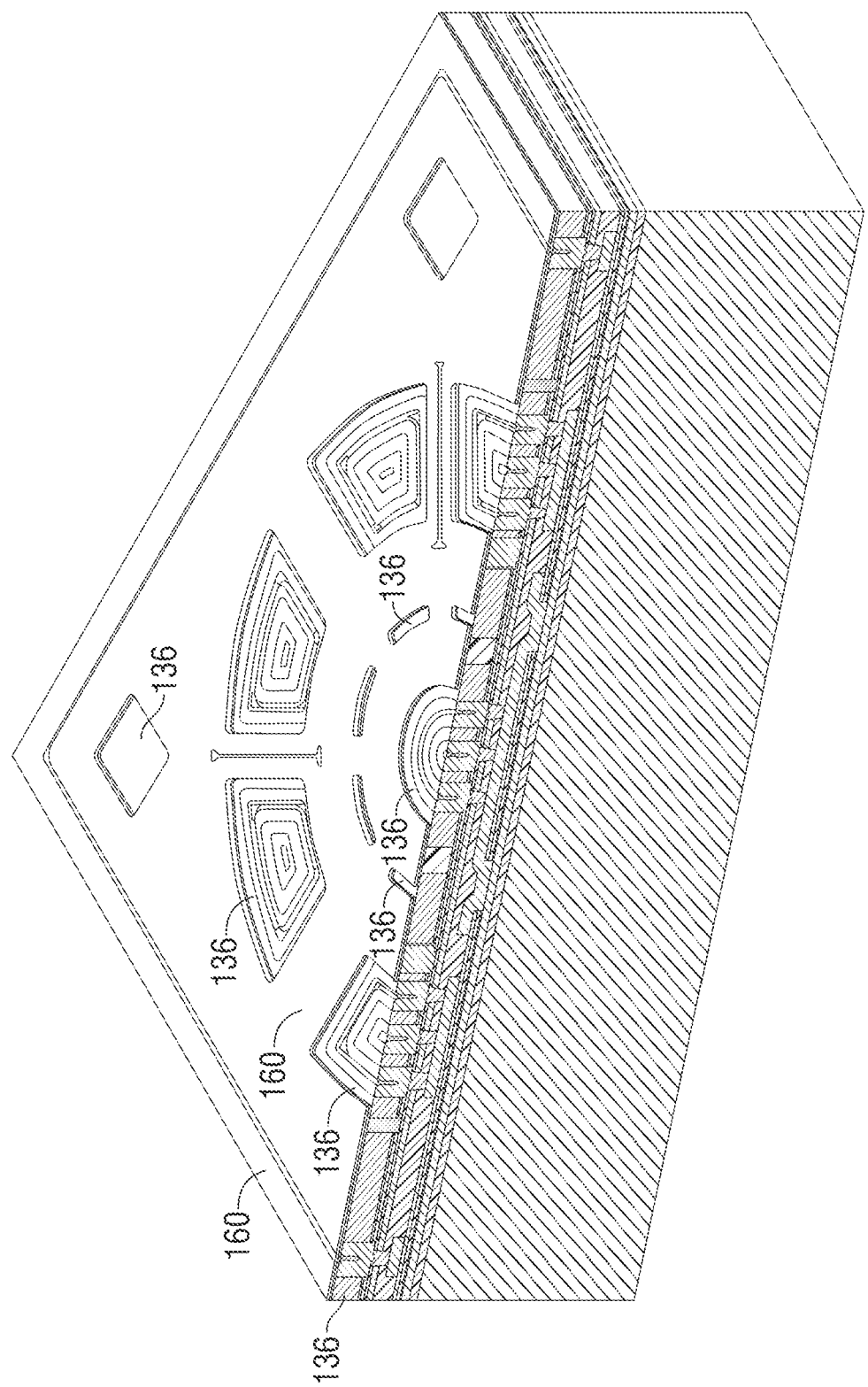

Referring to FIG. 42, release layer 160 is patterned by first patterning a hard mask layer (e.g., mask layer 161) using techniques consistent with those described above. Referring to FIG. 43, an etch process is then used to pattern release layer 160 to form openings corresponding to electrodes 182, proof mass 180, and dummy structures. The dimensions of these openings may be any dimensions suitable for a particular MEMS structure (e.g., inertial sensor). In at least one embodiment, the etch process is a dry etch process, e.g., an etch process using the gases $SF_6$ or the combination of $Cl_2$, HBr, $O_2$, and $BCl_3$. Mask layer 161 is removed, exposing release layer 160 and openings to form contacts to portions of first structural layer 136.

Figure 44:
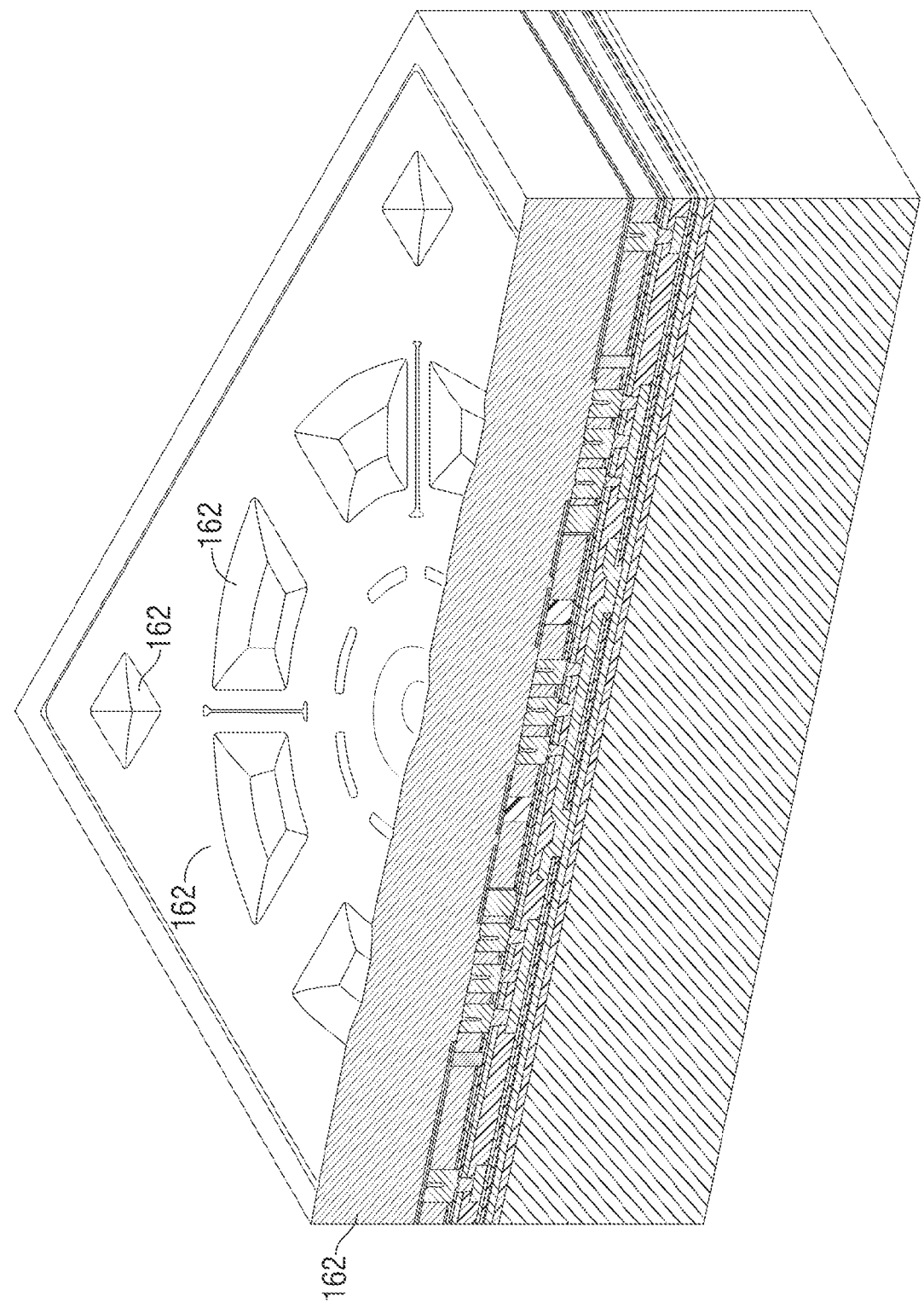

Referring to FIG. 44, a second structural layer (e.g., second structural layer 162) is formed above first structural layer 136 from any material described above as suitable for first structural layer 136. In at least one embodiment, second structural layer 162 is formed from a different material than first structural layer 136. In at least one embodiment, second structural layer 162 is formed from the same material as first structural layer 136. In at least one embodiment, second structural layer 162 is deposited as a single layer using LPCVD, PECVD, or other suitable technique. In at least one embodiment, the single layer is substantially thicker than first structural layer 136 (e.g. second structural layer 162 is in the range of approximately two to approximately five times as thick as first structural layer 136). For example, in at least one embodiment, first structural layer 136 is approximately 2 μm thick and second structural layer 162 has a thickness greater than approximately 2 μm, e.g. is at least 4-5 μm thick. In at least one embodiment, second structural layer 162 is thick enough to provide sufficient mass for an intended MEMS application, but thin enough to be patterned with acceptable geometry for the intended MEMS application (e.g., second structural layer 162 has a thickness of approximately 8-10 μm).

Figure 45:
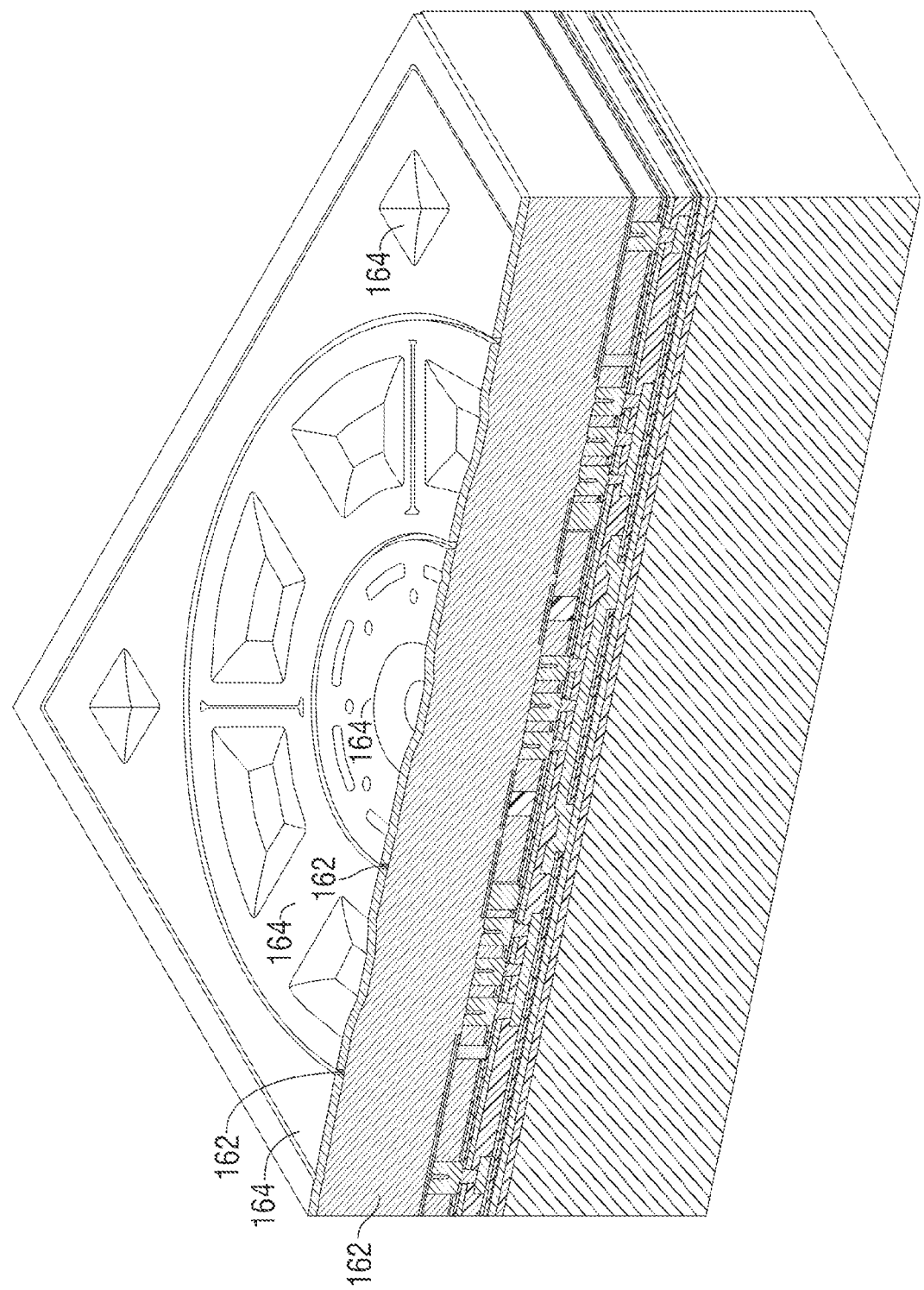
Figure 46:
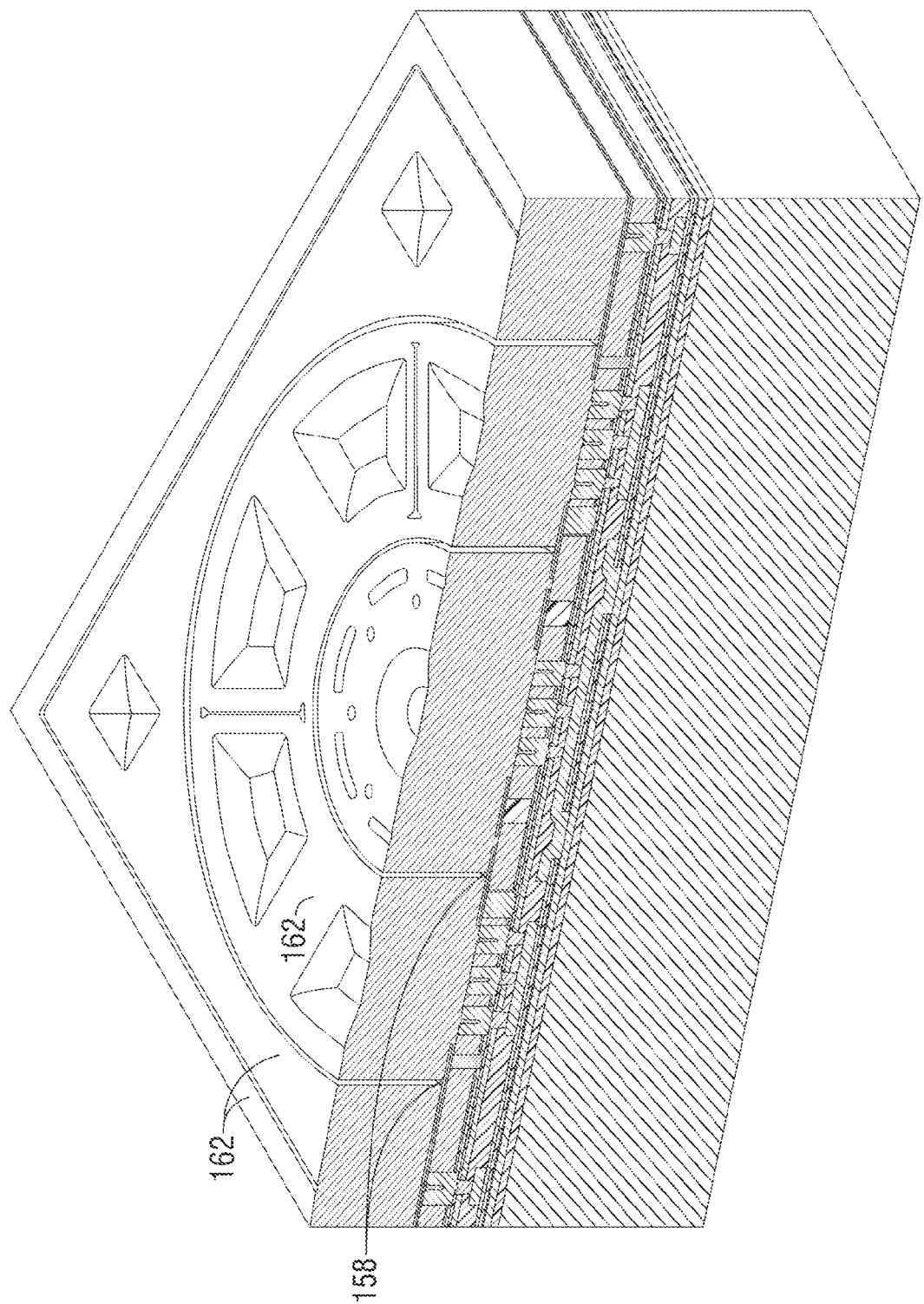
Figure 48:
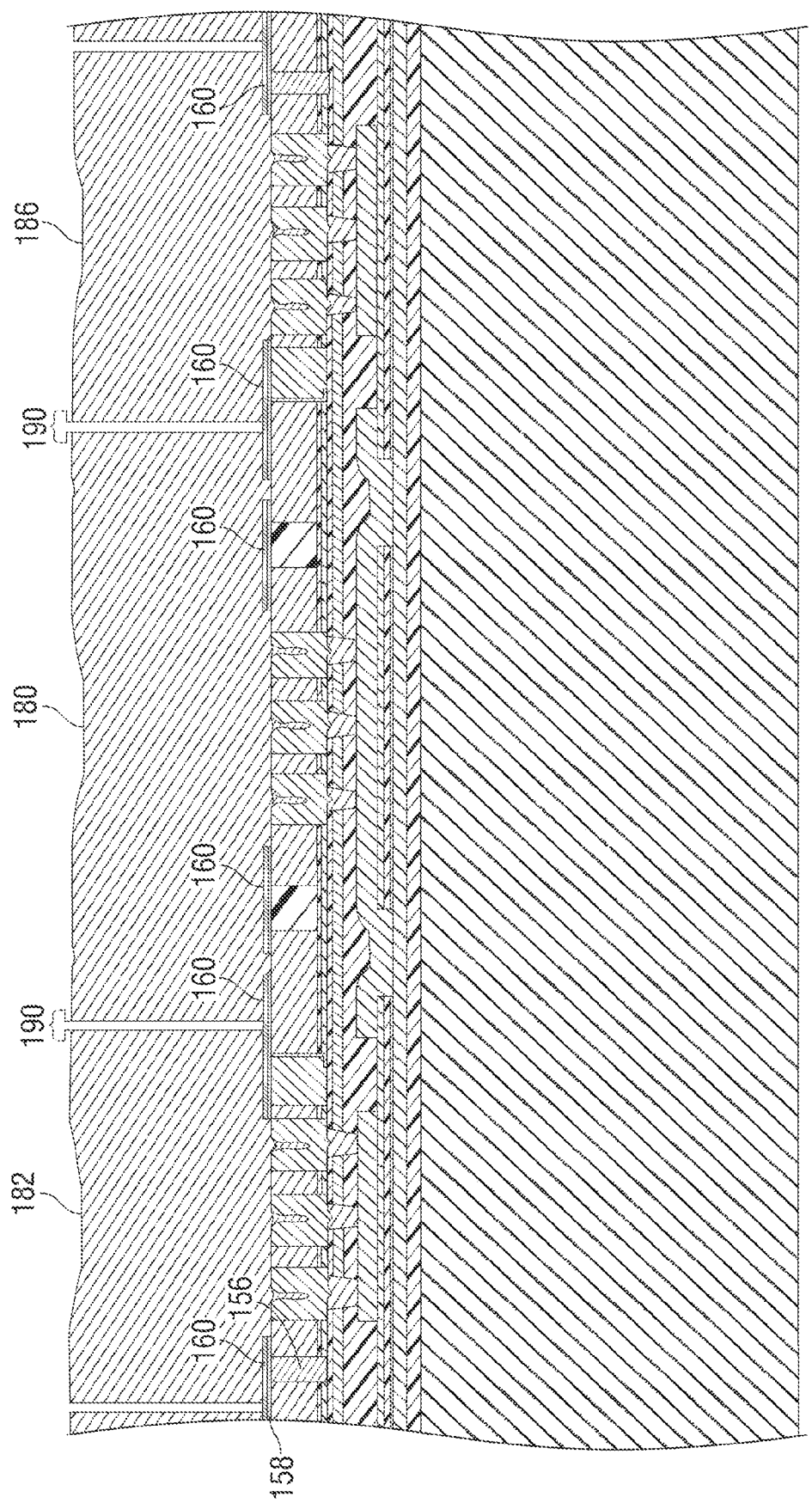
FIG. 48 illustrates a detailed, two-dimensional view of the cross-section of the structure of FIG. 46 before a release technique consistent with at least one embodiment of the invention.

Referring to FIG. 45, second structural layer 162 is patterned to define features and/or distinct structures of the resulting MEMS device (e.g., electrodes 182 and proof mass 180 of MEMS structure 12 of FIGS. 47 and 49). In at least one embodiment, a hard mask layer (e.g., mask layer 164) is patterned to define those features. Mask layer 164 may be patterned by any suitable patterning process described above. Referring to FIG. 46 and the detailed view of unreleased MEMS structure 12 in FIG. 48, the patterned mask layer 164 is then used to define features in second structural layer 162. In at least one embodiment, a narrow, vertical gap through the entire thickness of second structural layer 162 is defined. The gap may be formed using any technique suitable to create a high aspect-ratio gap. In at least one embodiment, the gap has a width at least one order of magnitude less than the thickness of second structural layer 162. e.g., the gap has a width of approximately 0.5 μm and second structural layer 162 is approximately 8-10 μm thick. In at least one embodiment, a deep reactive ion etch (DRIE) technique is used to define the gap. In at least one embodiment, upon completion of the formation of gap 190, patterned mask layer 164 is removed.

Referring to FIG. 47 and the additional, detailed view of released MEMS structure 12 illustrated in FIG. 49, in at least one embodiment of the manufacturing technique, at least one portion of second structural layer 162 is released. In at least one embodiment, a release technique that releases the portion of second structural layer 162 also releases portions of first structural layer 136. In at least one embodiment of the manufacturing technique, the release technique includes applying a wet etchant comprising an aqueous solution of hydrogen peroxide with an $H_2O_2$ concentration in the range of approximately 25-35% by volume and a temperature in the range of approximately 80-95° C. The etchant removes exposed sacrificial material to form at least one horizontal gap (e.g., gap 192) between second structural layer 162 and the material below (e.g., first structural layer 136). The formation of horizontal gap(s) release portions of first structural layer 136 and portions of second structural layer 162. In embodiments of the manufacturing technique that also release first structural layer 136, horizontal and vertical gaps (e.g., gaps 194 and 196, respectively) are formed by the release, thereby releasing first structural layer 136.

Note that the patterning of second structural layer 162 may be chosen to provide any structural arrangement desired for a fabricated MEMS device. For example, in accordance with an embodiment of the present invention, first structural layer 136 forms portions of electrodes 182 and proof mass 180 and includes temperature compensation features and electrical contacts to electrodes 182 and proof mass 180 of an inertial sensor. Second structural layer 162 is patterned to form proof mass 180, an anchor for proof mass 180, and electrodes 182 that surround the proof mass 180. However, those features and the manufacturing techniques described in FIGS. 41-46 are exemplary only and variations on the manufacturing technique may be used to form first and/or second structural layers.

In at least one embodiment, the manufacturing technique described above with respect to FIGS. 41-46 forms a release layer (e.g., release layer 160) between first structural layer 136 and second structural layer 162 using one material (e.g. germanium), which may be formed over an etch stop layer (e.g., etch stop layer 158). The selectivity of the etchant for that release material between structural material (e.g., SiGe) and the release material is limited. That limited selectivity imposes a time limit on the release etch to avoid over-etching the structural elements. As a result, release holes 185 are formed in the second structural layer to allow complete release of long channels without having to extend the release time beyond an etch time tolerated by the structural layer itself.

Figure 50A:
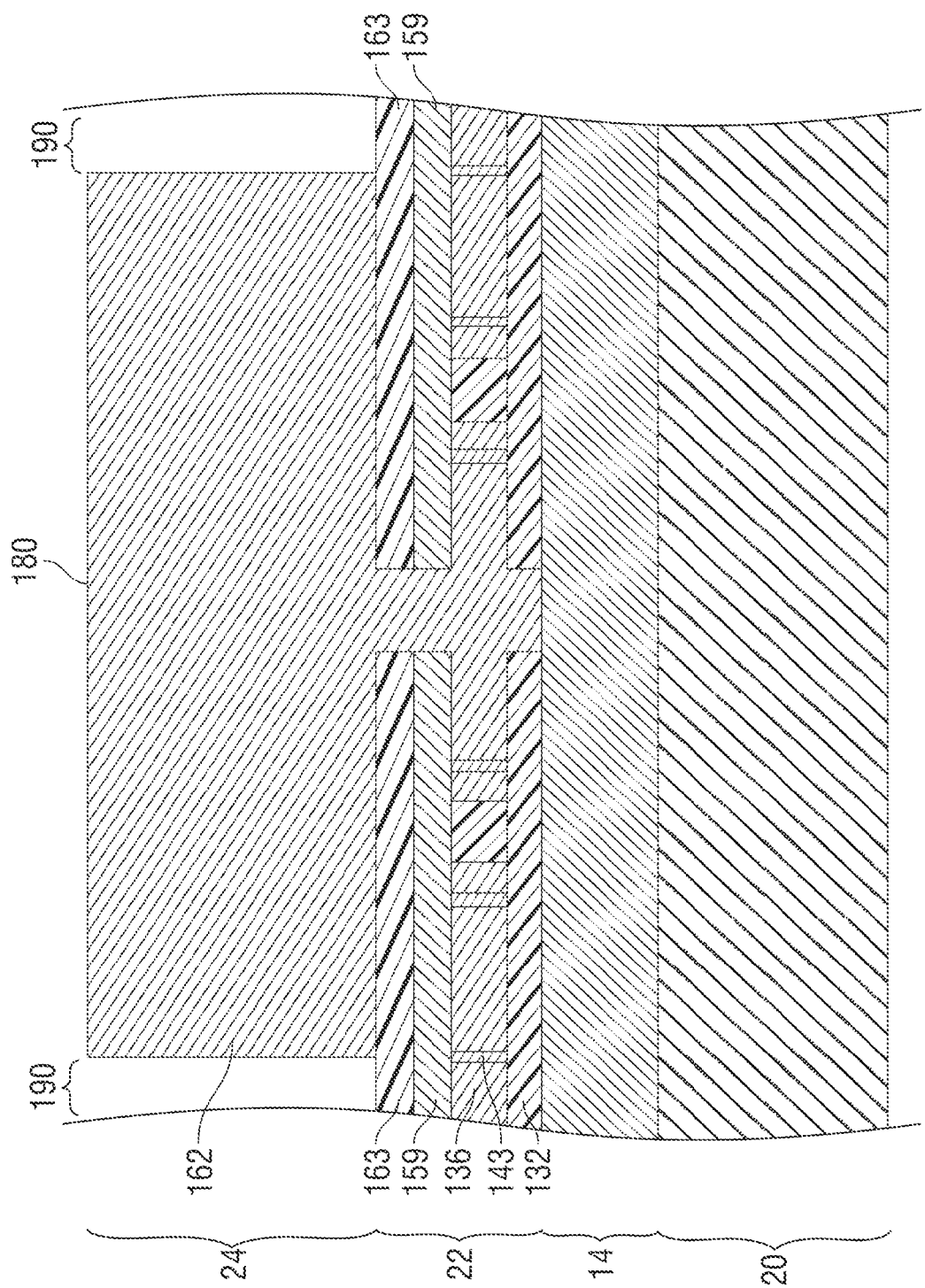
FIG. 50A illustrates a detailed two-dimensional view of an embodiment of a manufacturing sequence for fabricating a MEMS structure including a dual release consistent with at least one embodiment of the invention.

In at least one other embodiment of the manufacturing technique, a combination of a plurality of distinct materials form the sacrificial layer between first structural layer 136 and second structural layer 162, as shown in FIG. 50A, which illustrates a simplified view of MEMS structure 12. In at least one embodiment of the manufacturing technique, rather than forming release layer 160 on etch-stop layer 158, as described above, a stack of release layers (e.g. release layer 159 and release layer 163) is formed and patterned by any suitable technique. Portions of the stack of release layers are later removed using a dual-release technique.

In at least one embodiment of the manufacturing technique, release layer 159 is formed from a semiconducting material (e.g., germanium) suitable for a MEMS process, as described above, and release layer 163 is formed from an oxide (e.g., $SiO_2$) or other insulating material suitable for a MEMS process, as described above. Release layers 159 and 163 have a combined thickness of a gap between the first and second structural layers that is suitable to define the corresponding feature of the MEMS structure. A first etchant (e.g., hydrofluoric acid) removes release layer 163 and is followed by a second etchant (e.g., hydrogen peroxide) that removes release layer 159. In at least one embodiment of the manufacturing technique, the use of the oxide release layer increases the selectivity of the etch between the structural layers and the release layers, hence reducing or eliminating the need for release holes in the second structural layer. For example, release holes 185 illustrated in FIG. 47 are not needed when using the dual release technique of FIG. 50A. However, in at least one embodiment of the manufacturing technique, the germanium layer also serves as a protective layer that protects any oxide features embedded in first structural layer 136 (e.g., temperature compensation portions 188) from oxide etchants. The germanium release layer is removed by the second etchant as part of the dual release technique. In addition, since oxide is a better etch-stop material than other materials (e.g., germanium or titanium nitride) for the etch of the second structural layer, the oxide release layer provides improved manufacturability when an increased tolerance to non-uniformity is desired (e.g., when the second structural layer is relatively thick).

Figure 50B:
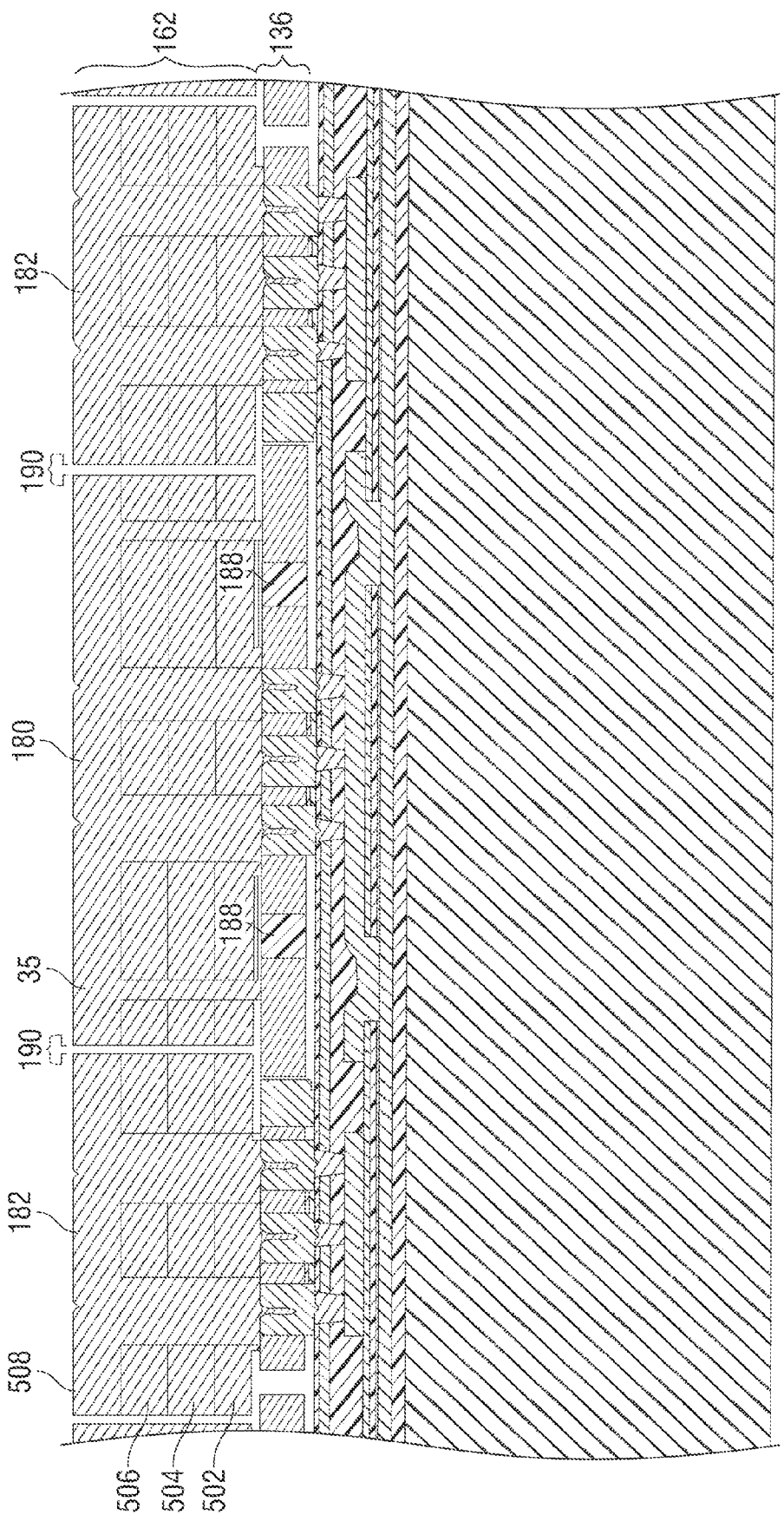
FIG. 50B illustrates a detailed two-dimensional view of an alternative to the manufacturing sequence for fabricating a MEMS structure including formation of a layered structural layer consistent with at least one embodiment of the invention.

Referring to FIG. 50B, in at least one embodiment of the manufacturing technique, a layered formation technique may be used to reduce variations in mechanical properties (e.g., strain gradient) of the second structural layer. In at least one embodiment, rather than pattern the release layer between the first and second structural layers (e.g., etch stop layer 158 and release layer 160 of FIG. 41 or release layers 159 and 163 of FIG. 50A) prior to forming second structural layer 162, as described above, second structural layer 162 is formed on an unpatterned release layer, as illustrated in FIG. 41, by forming multiple layers (e.g., depositing layers 502, 504, and 506 of FIG. 50B using any suitable technique) of a material described above with respect to second structural layer 162. In at least one embodiment, the multiple layers have approximately the same thickness (e.g., thickness in the range of approximately 0.5-3 µm). In at least one embodiment of the manufacturing technique, formation of each of the multiple layers in a vacuum or at a particular temperature is interrupted by vacuum interruption or exposure to room ambient temperature, respectively. In at least one embodiment of the manufacturing technique, formation of each of the multiple layers is interrupted by oxygen flow over the surface.

In at least one embodiment of the manufacturing technique, after forming n−1 layers on one or more release layer(s), the n−1 layers and the release layer(s) are patterned to form portions of the second structural layer that contact and/or anchor the second structural layer to the first structural layer. Those n−1 layers are patterned using any suitable patterning techniques. After patterning those layers, the nth layer (e.g., layer 508), which is a final layer of the second structural layer, is formed above the multiple patterned layers, conforming to the pattern created in the layers below and filling gaps created by the patterning, to thereby form at least one anchor and electrical contact to at least one portion of first structural layer 136. Then, the n layers are patterned and at least one release removes exposed sacrificial material to form gaps (e.g., gaps 190). Note that the n layers of material may be formed by any material and technique described above with regard to first structural layer 136 and/or second structural layer 162.

Although the layered second structural layer has the advantage of a reduced strain gradient as compared to the non-layered second structural layer, the oxygen flow over the individual structural layers that form the second structural layer forms a thin oxide interface between the individual structural layers, which degrades the conductivity of the second structural layer as compared to a non-layered second structural layer. Although the layered second structural layer is described using four depositions of material (i.e., three depositions followed by definition of the anchor and contact and a final, fourth layer), any suitable number of depositions may be used. The number of depositions may be generalized to n−1 layers prior to definition of device features (e.g., an anchor or electrical contact), followed by forming an nth layer that fills the openings and anchors second structural layer 162 and/or electrically couples second structural layer 162 to at least one layer below second structural layer 162.

Figure 51:
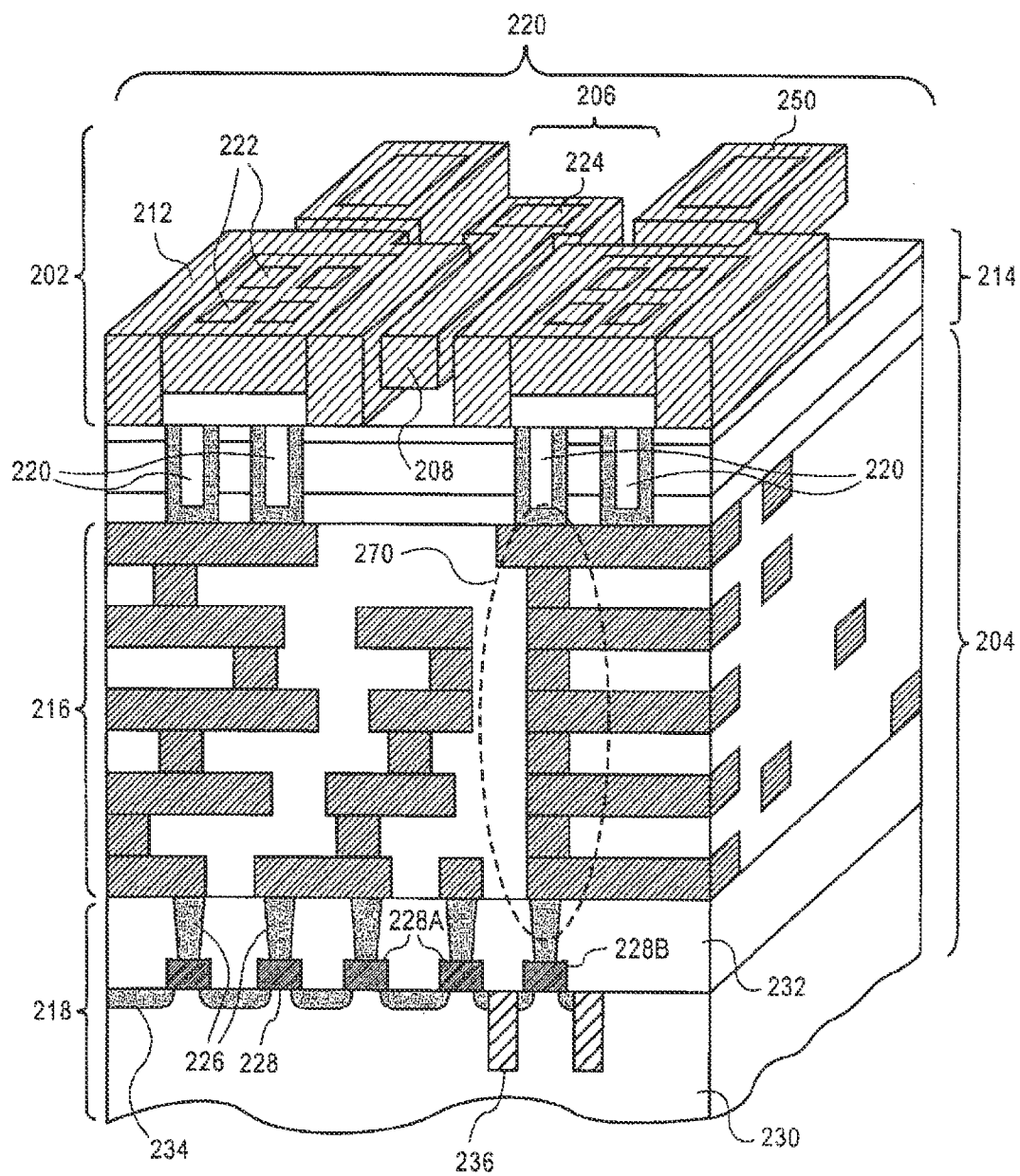
FIG. 51 illustrates a perspective, cross-sectional view of a MEMS structure consistent with at least one embodiment of the invention.

Although the manufacturing technique is described with reference to an inertial sensor, other MEMS devices may be manufactured using techniques described herein. Referring to FIG. 51, another exemplary integrated circuit-compatible MEMS structure (e.g., MEMS structure 202, which is described in U.S. Pat. No. 7,514,760, filed Mar. 9, 2007, entitled "IC-Compatible MEMS Structure," naming Emmanuel P. Quevy as inventor, which application is incorporated herein by reference) may be formed by techniques described herein. MEMS structure 202 includes a member (e.g. member 206) and a pair of electrodes (e.g. electrodes 210 and 212) electrically coupled to interconnects (e.g., interconnects 216) to at least one semiconductor device (e.g., semiconductor devices 218) formed on a substrate (e.g., substrate 230). MEMS structure 202 is formed in one of first structural region 22 and second structural region 24, and comprises respective ones of portions of first structural layer 136 and second structural layer 162.

Figure 58:
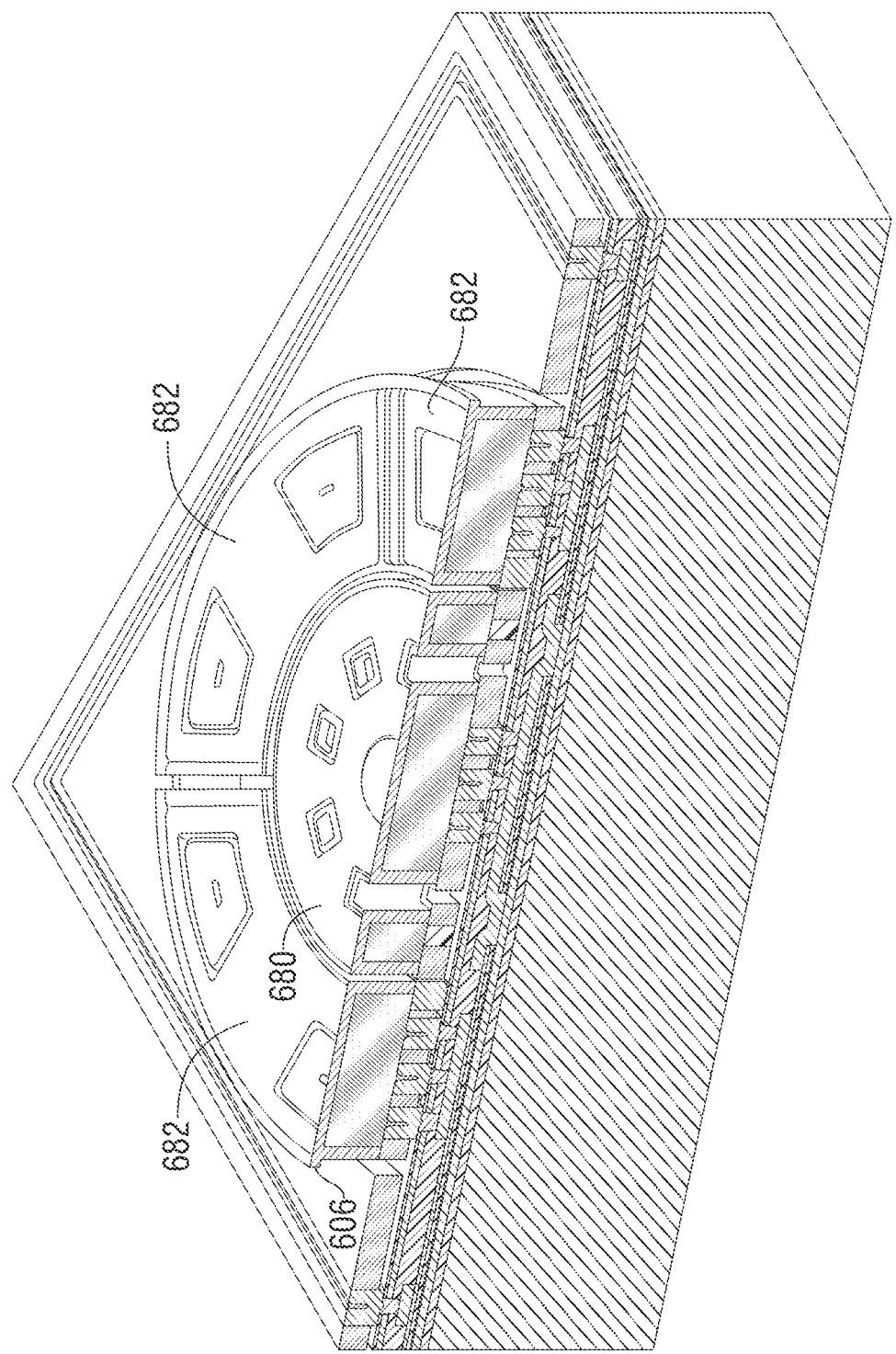
Figure 59:
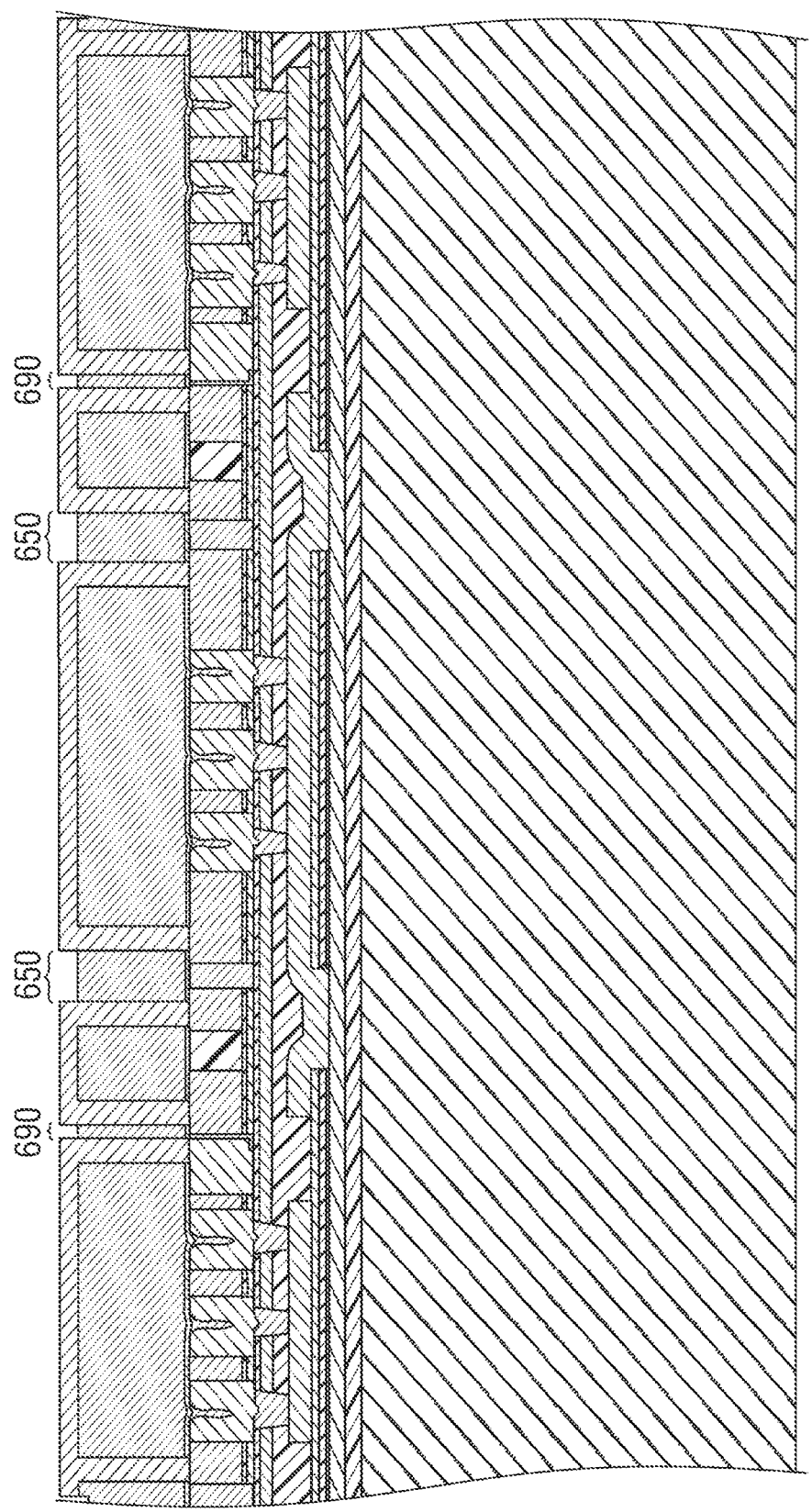
FIG. 59 illustrates a detailed, two-dimensional view of the cross-section of the structure of FIG. 57 before a release technique consistent with at least one embodiment of the invention.
Figure 60:
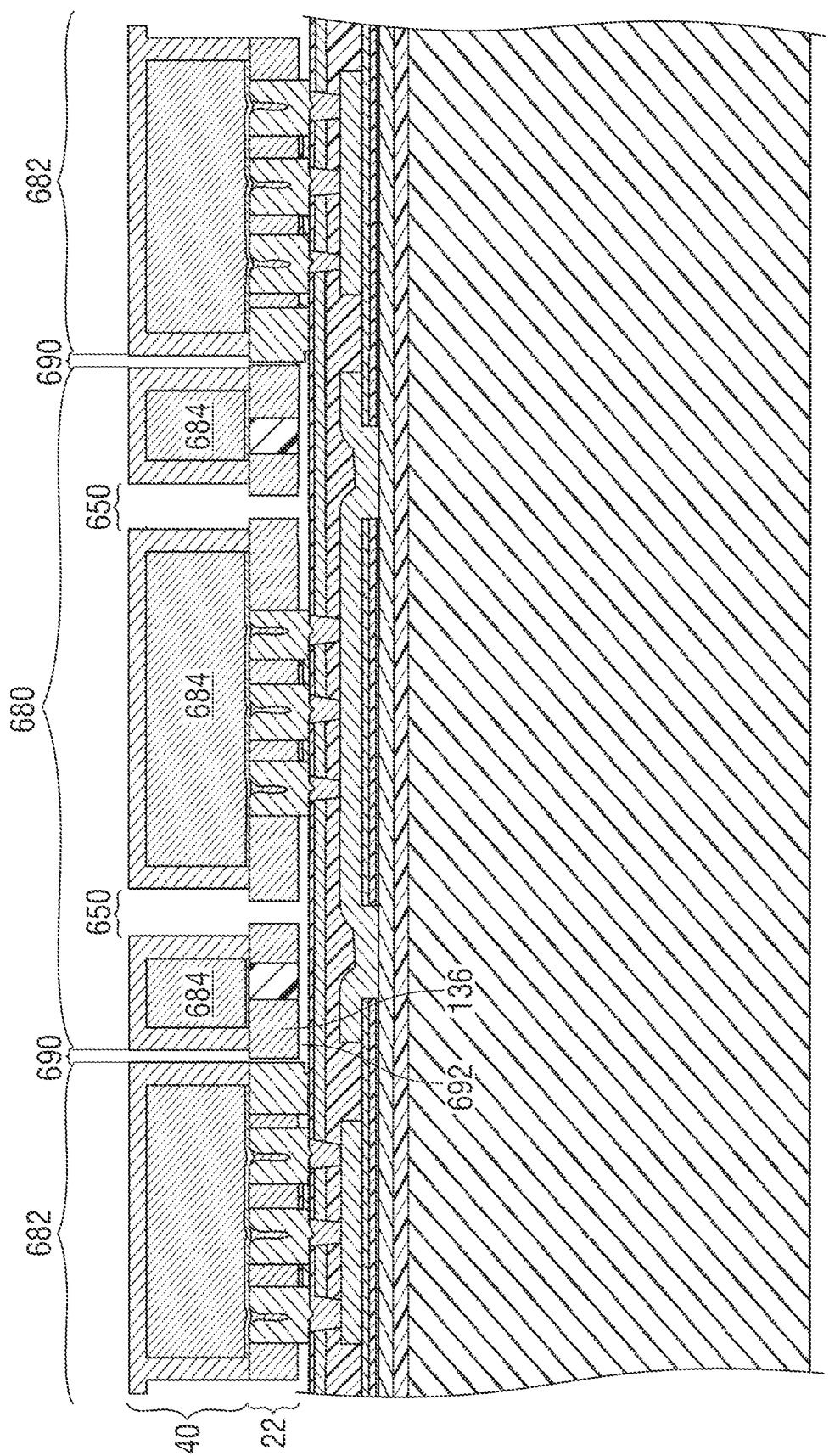
FIG. 60 illustrates a detailed two-dimensional view of a cross-section of the structure of FIG. 58 after a release technique consistent with at least one embodiment of the invention.

Referring to FIGS. 52-60, an alternate manufacturing technique for manufacturing MEMS structure 12 may be used to form MEMS devices comprising high aspect ratio lateral transducers. The alternate manufacturing technique forms attachment portions above the first structural region and attached to portions of the structures formed from portions of first structural layer 136. In at least on embodiment of MEMS structure 12, an individual attachment portion is conjoined to a portion of first structural layer 136, i.e. the individual attachment portion and the portion of first structural layer 136 mechanically move in unison. In at least one embodiment, the manufacturing technique includes forming a vertical gap in a thick layer of structural material (e.g., gap 190 of FIG. 49) without the use of a deep reactive-ion etch, which may be expensive for such a high aspect ratio gap. The alternate manufacturing technique includes forming an unreleased first structural region 22, of a partially processed MEMS device consistent with FIGS. 1-40 and/or FIG. 50A and the associated description above. Referring to FIG. 60, attachment portions (e.g., attachment portions formed in attachment region 40) are formed above first structural region 22 and attached to portions of electrodes and a proof mass formed from first structural layer 136. In at least one embodiment of a MEMS structure, an attachment portion (e.g., attachment portion 684) increases the mass of the MEMS member (e.g., mass 680), which improves the performance of a resulting inertial sensor.

Figure 52:
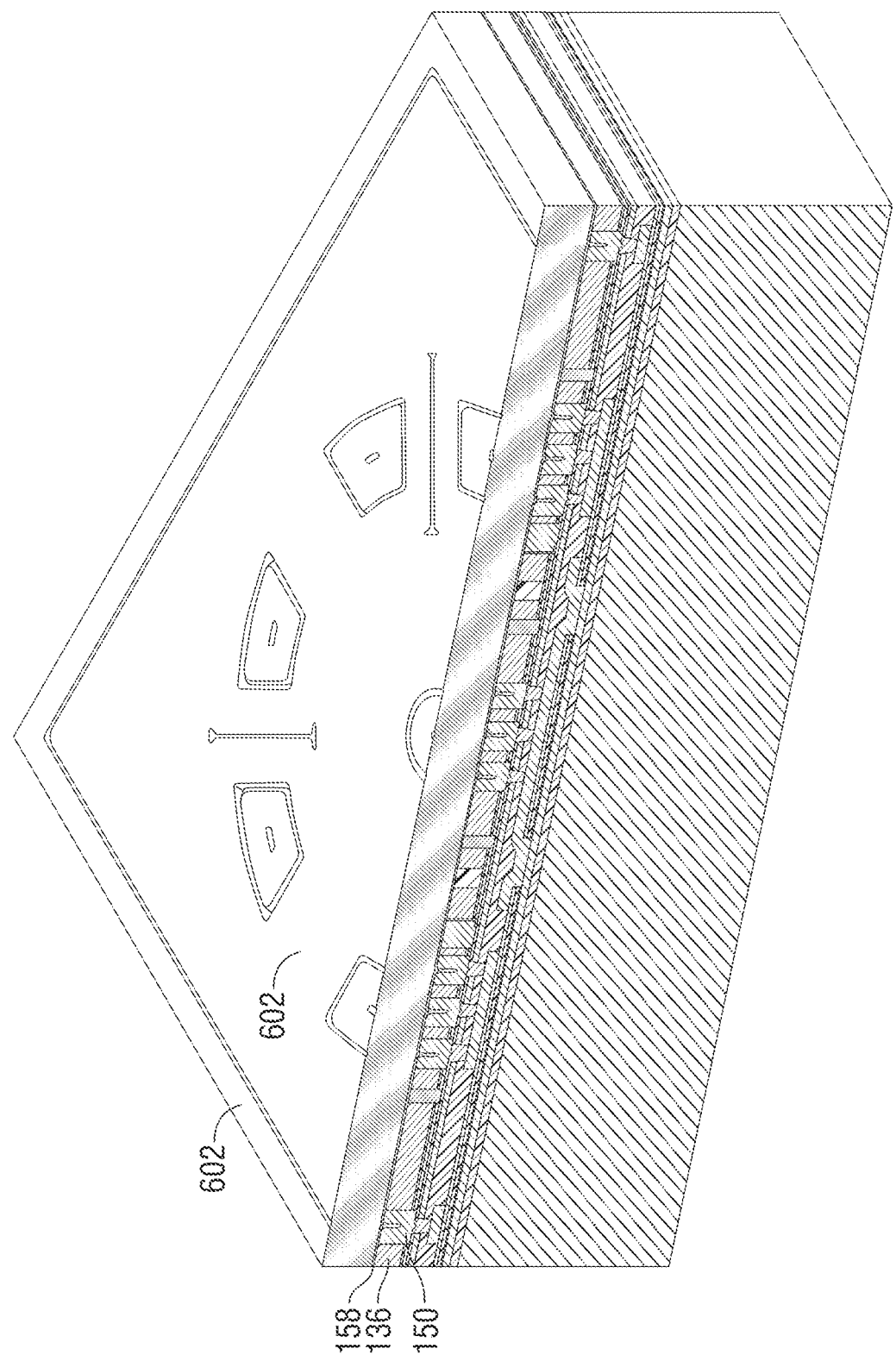
FIGS. 52-58 illustrate a perspective, cross-sectional view of an embodiment of a manufacturing sequence for fabricating a MEMS structure using island structures consistent with at least one embodiment of the invention.

Referring to FIG. 52, in at least one embodiment of the manufacturing technique, a thick layer of material (e.g., filler layer 602) is formed on etch-stop layer 158. Filler layer 602 may be comprised of any material suitable to withstand a MEMS fabrication process. Filler layer 602 may be a material selected from the group consisting of an insulator, a semiconductor and a conductor. For example, in at least one embodiment of the manufacturing technique, filler layer 602 is comprised of a semiconductor material and is selected from the group consisting of silicon, germanium, silicon-germanium, carbon-doped silicon and a III-V material. The semiconducting material may also be comprised of dopant impurity atoms. For example, in one embodiment, the concentration of dopant impurity atoms is selected to optimize the germanium nucleation from $GeH_4$ precursor gas at a temperature in the range of 300-400° C. In at least one embodiment, layer 160 is comprised of greater than 98% germanium atoms and boron dopant impurity atoms having a total atomic concentration in the range of $5 \times 10^{19}$-$5 \times 10^{20}$ atoms/cm$^3$. Filler layer 602 may be comprised of any material that may subsequently be removed with high selectivity to layer 158 and a subsequently formed coating layer. In at least one embodiment, filler layer 602 has a thickness greater than approximately 2 µm. For example, in at least one embodiment of the manufacturing technique, layer 158 is comprised of 0.1 µm of titanium, filler layer 602 comprises at least 5 µm of germanium, and a subsequently formed coating layer is comprised of approximately 1 µm of silicon-germanium. The thickness of filler layer 602 may be any thickness suitable to provide an attachment that increases the total mass of mass 680 to a target level. Thus, in accordance with an embodiment of the present invention, the thickness of filler layer 602 is substantially greater than the thicknesses described in association with the first structural layer 136. In at least one embodiment of the manufacturing technique, filler layer 602 is formed from multiple layers of the same material interrupted by an oxygen flow to form one layer of the material having a target thickness.

Figure 53:
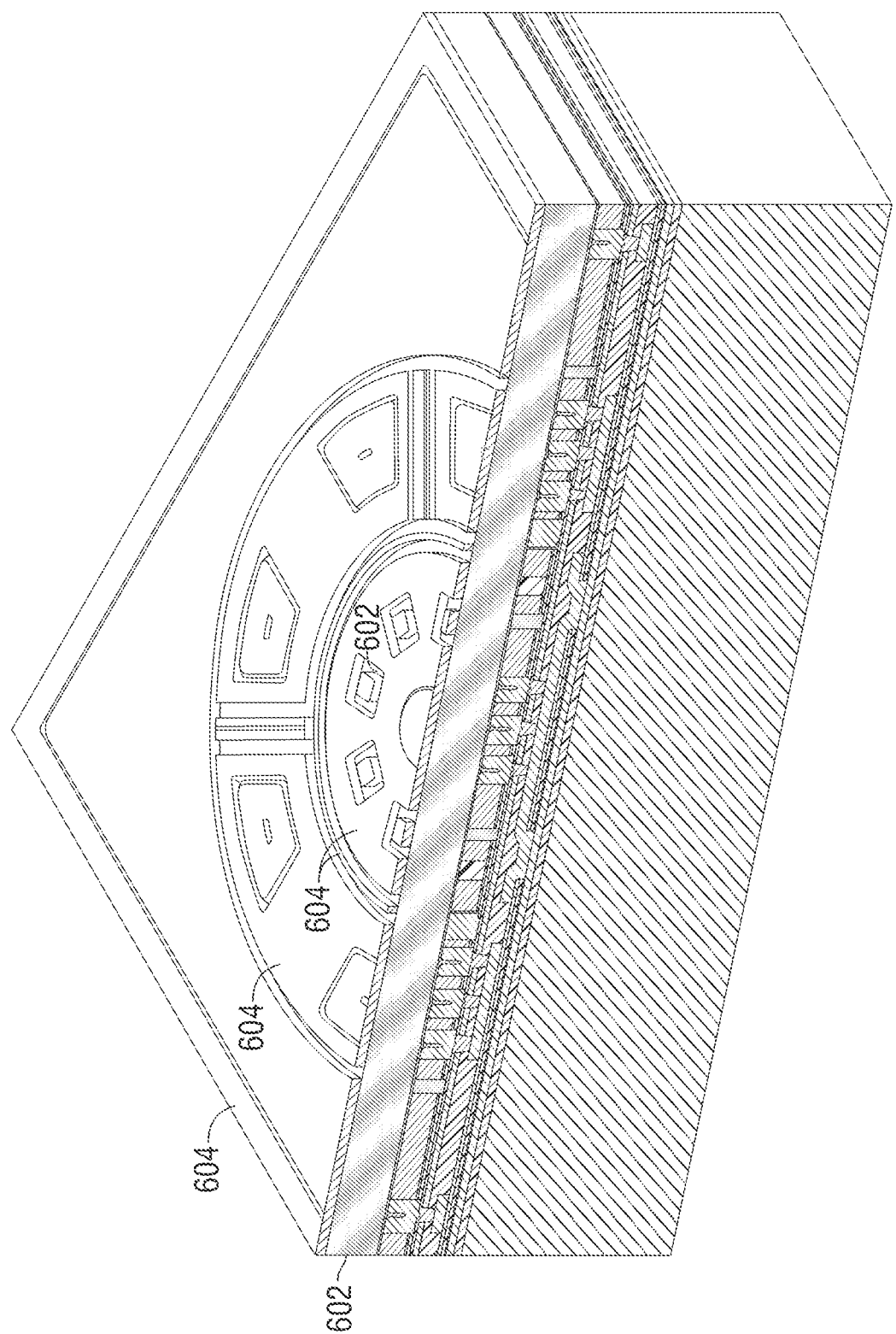
Figure 54:
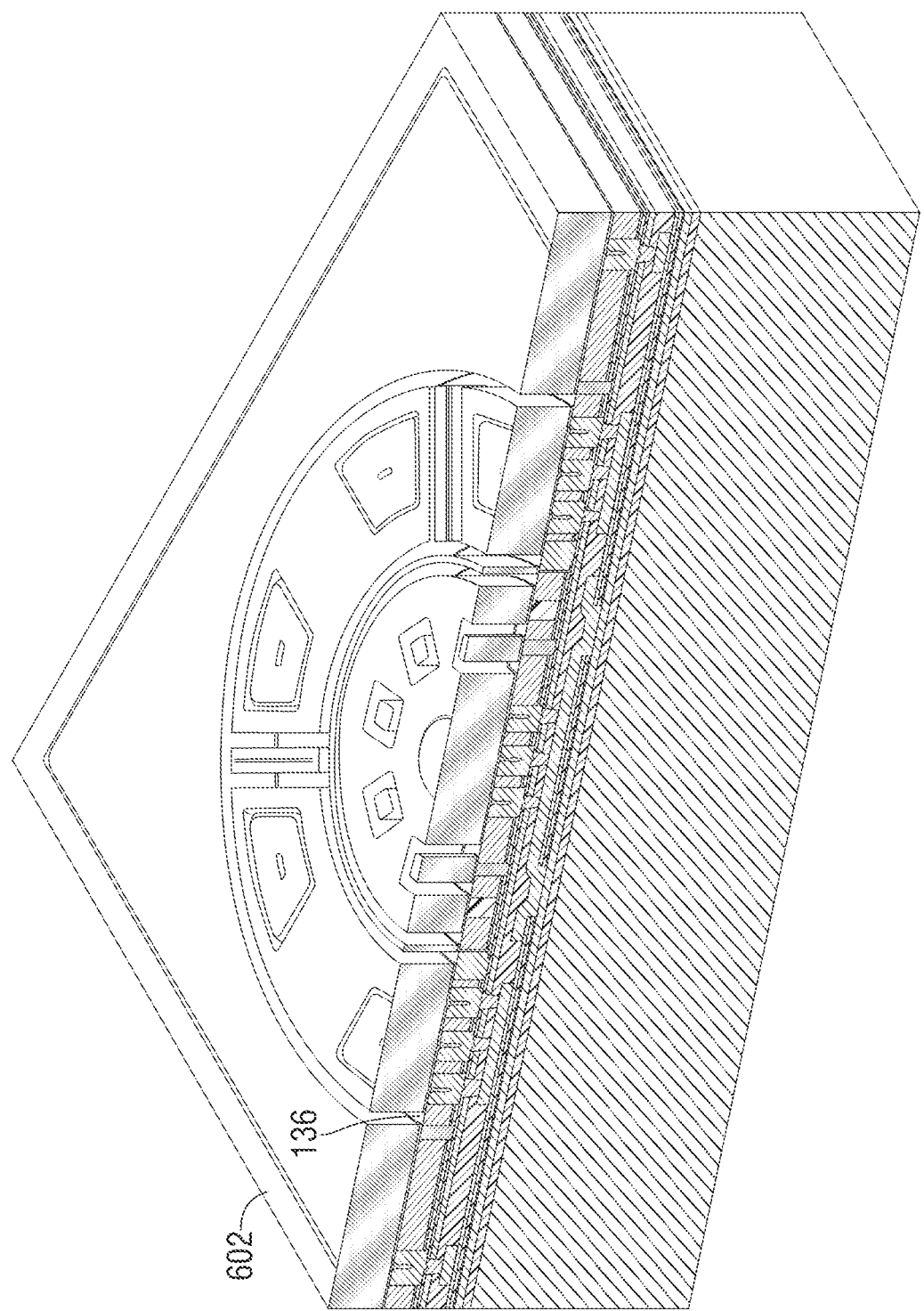

Referring to FIG. 53, filler layer 602 is patterned by first patterning a hard mask layer (e.g., layer 604), as described above. Referring to FIG. 54, in at least one embodiment of the manufacturing technique, mask layer 604 is removed after an etch process is used to pattern filler layer 602 and etch stop layer 158 to form release holes and to form island portions of filler layer 602 based on features of the electrodes 682, proof mass 680, and dummy structures (see FIG. 60). In at least one embodiment of the manufacturing technique, the removal technique includes applying a wet etchant comprising an aqueous solution of hydrogen peroxide with an $H_2O_2$ concentration in the range of 25-35% by volume and a temperature in the range of 80-95° C. The wet etchant removes exposed portions of filler layer 602 and etch-stop layer 158 to form at least one vertical gap between island portions of filler layer 602 that define features of the electrodes, proof mass, and dummy structures.

Figure 55:
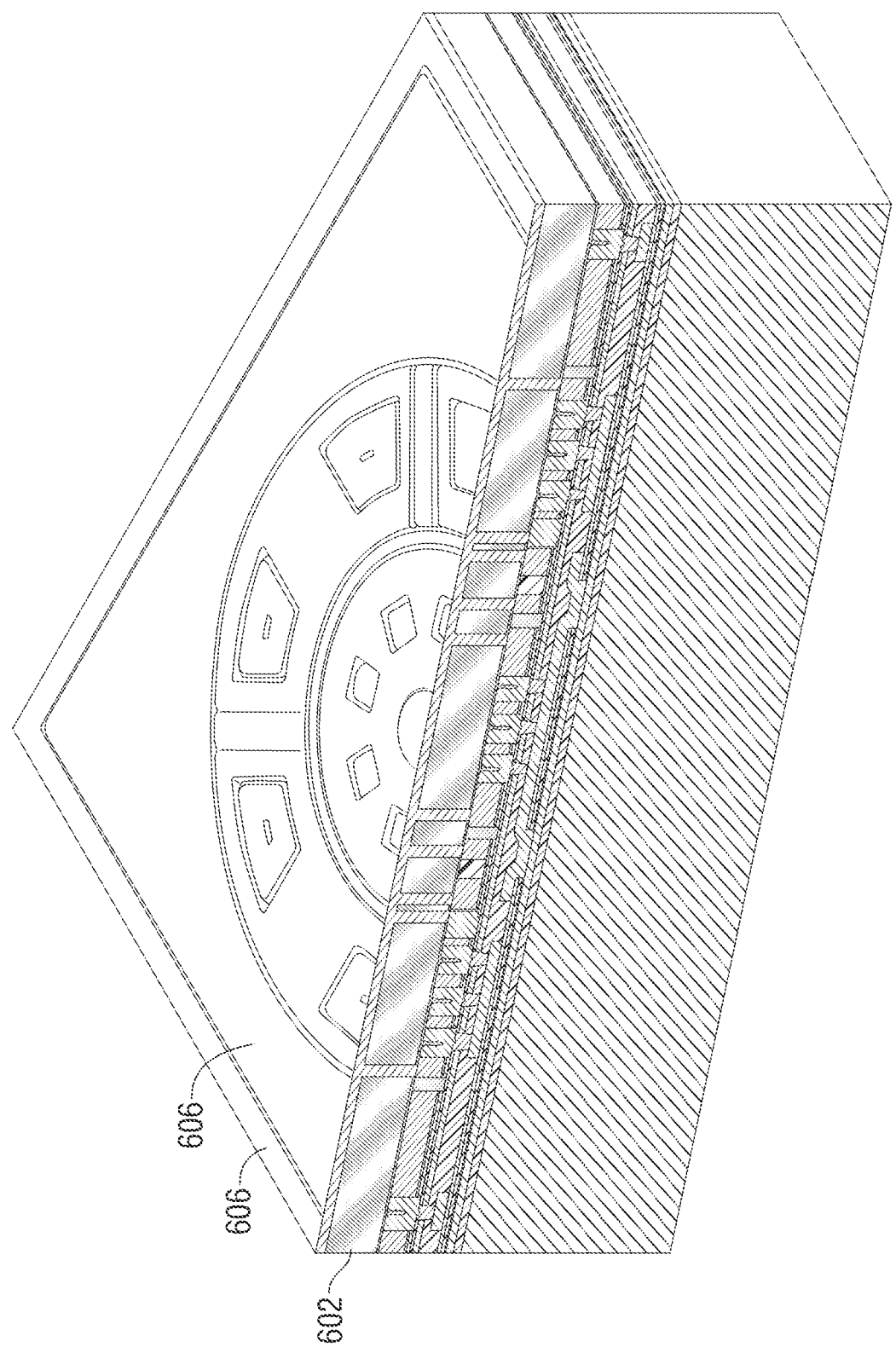

Referring to FIG. 55, in at least one embodiment of the manufacturing technique, a conformal coating layer (e.g., layer 606) is formed above the patterned filler layer 602 and fills in the gaps formed in filler layer 602. Layer 606 may be comprised of any suitable material described above in association with proof mass 180 and may have any thickness suitable to coat portions of filler layer 602. In at least one embodiment of the manufacturing technique, layer 606 is deposited by a process selected from the group consisting of chemical vapor deposition, physical vapor deposition, atomic layer deposition, electroplating and electro-less plating.

Layer 606 may be deposited by a low temperature deposition process. In one embodiment of the manufacturing technique, layer 606 is deposited by a chemical vapor deposition using the gases $SiH_4$, $GeH_4$ and $BCl_3$. In a at least one embodiment of the manufacturing technique, layer 606 is deposited by a low-pressure chemical vapor deposition process at a temperature less than 450° C. In at least one embodiment of the manufacturing technique, filler layer 602 is formed from a material having a higher density than layer 606. In at least one embodiment of the manufacturing technique, filler layer 602 is an approximately 5 µm germanium layer and layer 606 is an approximately 1 µm silicon-germanium layer. In at least one embodiment, filler layer 602 and layer 606 are doped with boron dopant impurity atoms.

Figure 56:
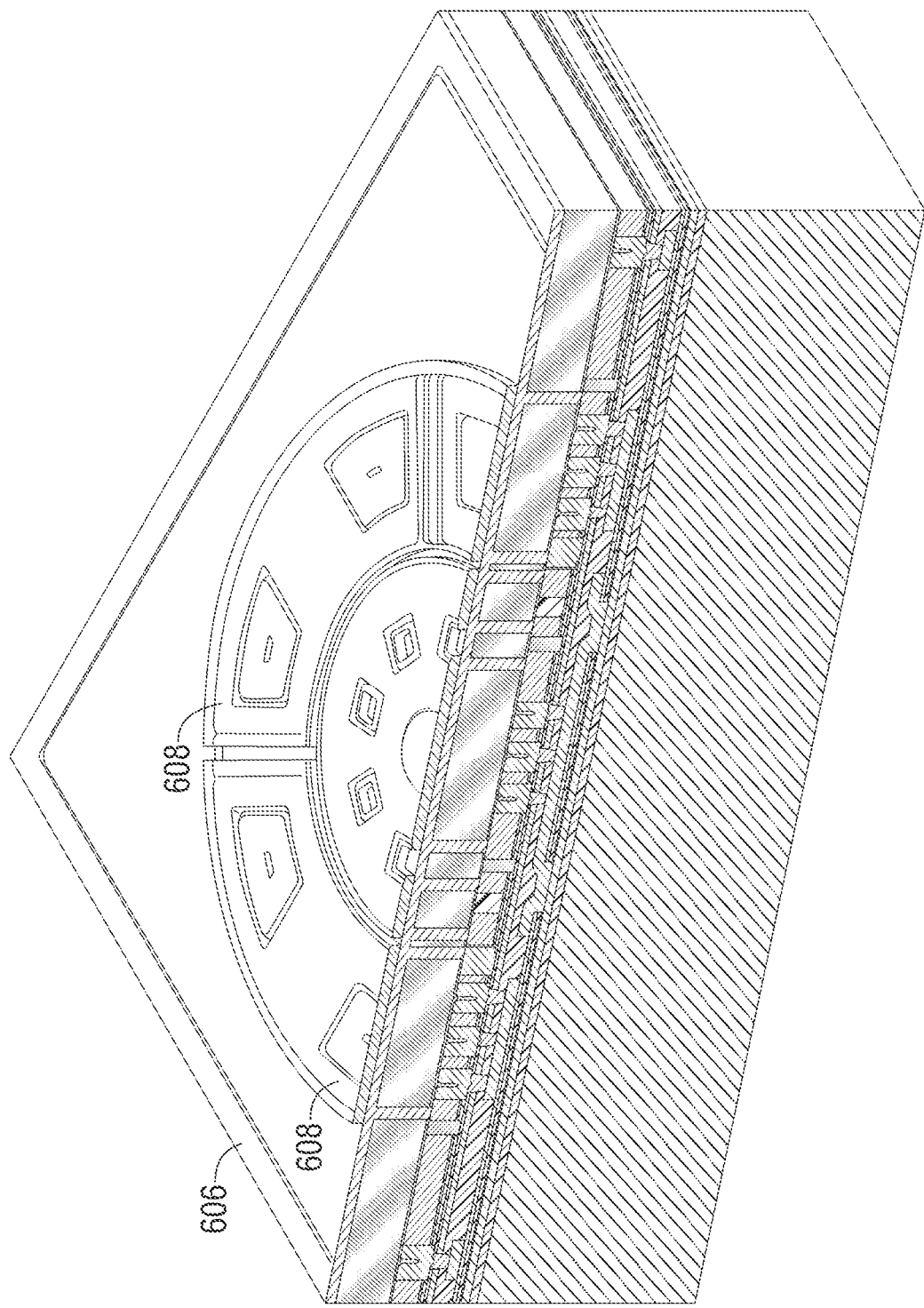
Figure 57:
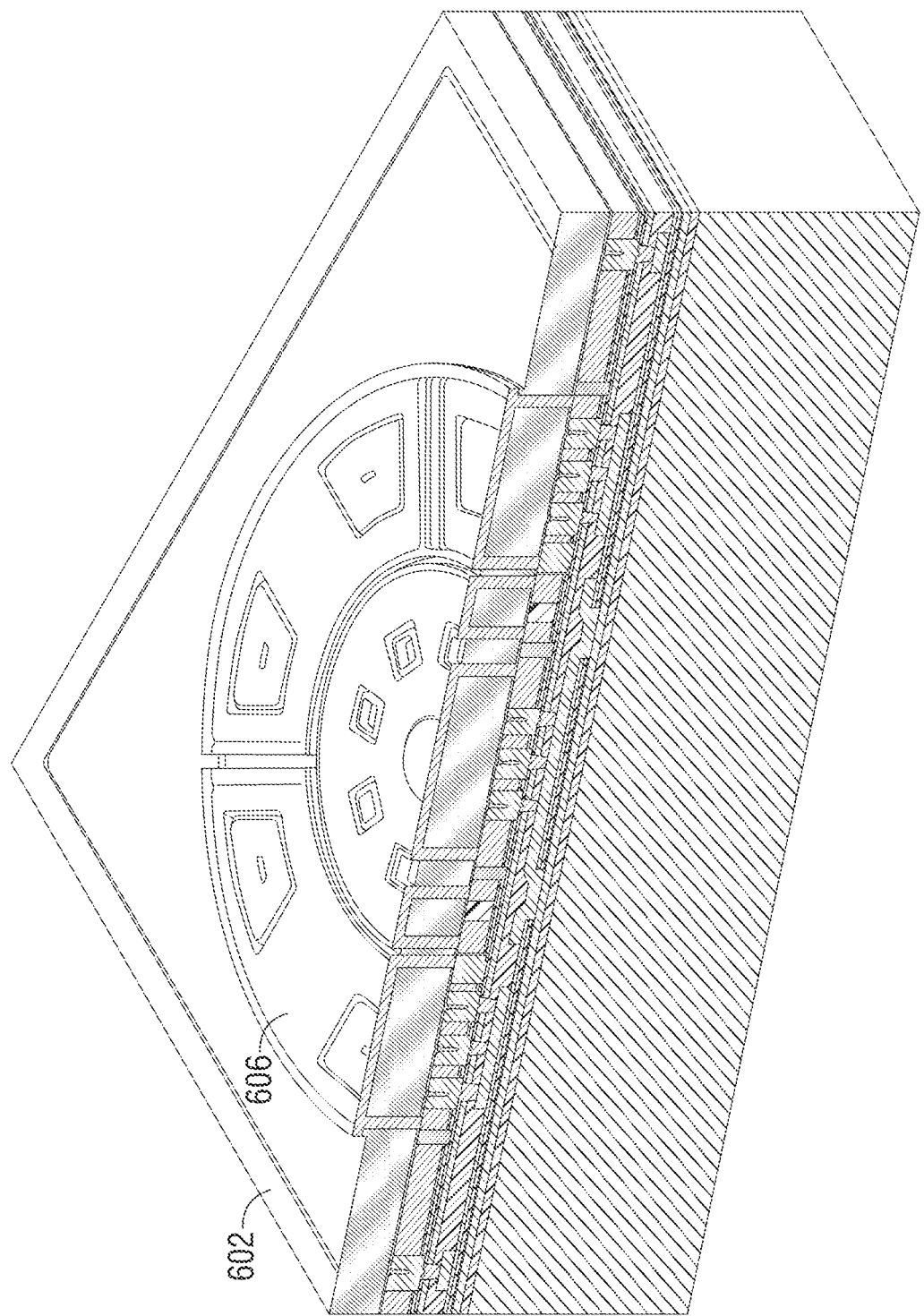

Referring to FIG. 56, in at least one embodiment of the manufacturing technique, layer 606 is patterned by first patterning a hard mask layer (e.g., layer 608), as described above. Referring to FIGS. 57 and 59, in at least one embodiment of the manufacturing technique, mask layer 604 is removed after an etch technique is used to pattern layer 606 to partially form release holes (e.g., release holes 650) and a gap (e.g., gap 690) that will be later used to define features of electrodes 682 and release proof mass 680. In at least one embodiment of the manufacturing technique, layer 606 is a layer of silicon-germanium and the etch technique used to pattern layer 606 is a deep reactive ion etch (DRIE) technique. Referring to FIG. 58 after patterning layer 606, an additional etch step is used to remove excess portions of filler layer 602 and define the MEMS structure including electrodes 682, proof mass 680, and dummy structures, which are included for improving manufacturability of the MEMS device. In at least one embodiment, the additional etch includes applying a wet etchant comprising an aqueous solution of hydrogen peroxide with an $H_2O_2$ concentration in the range of 25-35% by volume and a temperature in the range of 80-95° C. The etchant removes exposed portions of filler layer 602 and portions of sacrificial material in first structural region 22 to form at least one horizontal gap (e.g., gap 692) between a portion of first structural layer 136 and the material below (e.g. layer 122).

Thus various techniques for manufacturing a MEMS structure are described. Various embodiments of the manufacturing techniques described herein vary the dimensions of the second structural layer to satisfy needs of various applications. For example, the thickness of the second structural layer may be chosen to increase the mass of an inertial sensor, increase out-of-plane stiffness of a member of a MEMS structure, reduce a gradient of stress in a z-direction to generate flat films and structures, thereby improving the performance for out-of-plane MEMS devices, and/or provide a routing structure, which may facilitate higher current densities in the MEMS device (e.g., to drive a substantial current for a Lorentz force actuator). In addition, techniques described herein may be used to form one or more vertical transducers between the first and second structural layers.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., HDL, Verilog, Graphic Data System II (GDSII) data) of such circuits, systems, and methods, all as described herein, and as defined in the appended claims. In addition the computer readable media may store instructions as well as data that can be used to implement the invention. The instructions/data may be related to hardware, software, firmware or combinations thereof.

The description of the invention set forth herein is illustrative, and is not intended to limit the scope of the invention as set forth in the following claims. For example, while the invention has been described in an embodiment in which the manufacture of an inertial sensor is described, one of skill in the art will appreciate that the teachings herein can be utilized with other MEMS structures (e.g., MEMS resonators). Variations and modifications of the embodiments disclosed herein, may be made based on the description set forth herein, without departing from the scope and spirit of the invention as set forth in the following claims.

What is claimed is:

1. An apparatus formed on a substrate including at least one semiconductor device, the apparatus comprising:
    a microelectromechanical system (MEMS) device comprising a portion of a first structural layer and a portion of a second structural layer formed above the first structural layer, the second structural layer having a thickness greater than a thickness of the first structural layer,
    wherein the MEMS device comprises a member comprising the portion of the first structural layer and the portion of the second structural layer,
    wherein the portion of the second structural layer is an attachment attached to the first portion of the first structural layer.

2. The apparatus, as recited in claim 1, wherein the portion of the second structural layer increases the mass of the member of the MEMS device formed by the portion of the first structural layer.

3. The apparatus, as recited in claim 1, wherein the MEMS device comprises a first portion of the second structural layer and a second portion of the second structural layer, the MEMS device further comprising: a gap between the first portion of the second structural layer and the second portion of the second structural layer, the gap having a width at least one order of magnitude less than the thickness of the second structural layer.

4. The apparatus, as recited in claim 3, wherein the first and second portions of the second structural layer form electrically isolated, electrostatically coupled portions of the MEMS device.

5. The apparatus, as recited in claim 1, wherein the MEMS device comprises a first portion of the second structural layer and a second portion of the second structural layer, wherein an electrode of the MEMS device comprises the first portion of the second structural layer and a member of the MEMS device comprises the second portion of the second structural layer.

6. The apparatus, as recited in claim 5, wherein the member is a mass of an inertial sensor.

7. The apparatus, as recited in claim 6, wherein a first portion of the first structural layer forms an anchor for the mass and is electrically coupled to the mass.

8. The apparatus, as recited in claim 1, further comprising:
    at least one electrical contact coupling the MEMS device to a semiconductor device of the at least one semiconductor device.

9. The apparatus, as recited in claim 1, wherein the second structural layer has a thickness of at least two times the thickness of the first structural layer.

10. The apparatus, as recited in claim 1, wherein the second structural layer has a thickness of at least five times the thickness of the first structural layer.

11. The apparatus, as recited in claim 1, wherein the second structural layer comprises a plurality of layers of a first thickness of a first material, an interface between a first layer of the plurality of layers and a second layer of the plurality of layers comprising an oxide interface.

12. The apparatus, as recited in claim 1, wherein the portion of the second structural layer is in direct contact with the portion of the first structural layer.

13. The apparatus, as recited in claim 3, wherein the portion of the second structural layer is an attachment attached to the first portion of the first structural layer.

14. The apparatus, as recited in claim 1, wherein the attachment comprises a filler and a coating conforming to the filler.

15. An apparatus comprising:
    an electrode of a microelectromechanical system (MEMS) device formed above a substrate including a semiconductor device; and
    a member of the MEMS device, the member being formed above the substrate and electrostatically coupled to the electrode, the member including a portion of a first structural layer and a portion of a second structural layer formed above the first structural layer, wherein the portion of the second structural layer has a higher mass than the portion of the first structural layer,
    wherein the portion of the second structural layer is an attachment attached to the first portion of the first structural layer.

16. The apparatus, as recited in claim 15, further comprising:
    a gap between the electrode and the member, the gap having a width at least one order of magnitude less than the thickness of the second structural portion,
    wherein in operation of a microelectromechanical system (MEMS) device including the electrode and the member, the electrode is electrostatically coupled to the member across the gap.

17. The apparatus, as recited in claim 15, wherein the electrode comprises:
   a portion of the first structural layer; and
   a portion of the second structural layer, the second structural layer having a thickness greater than a thickness of the first structural layer.

18. The apparatus, as recited in claim 15, wherein the attachment comprises a filler and a coating conforming to the filler.

19. The apparatus, as recited in claim 15, wherein the attachment is conjoined with the first portion of the structural layer and the first portion of the structural layer and the attachment are operative to move in unison.

* * * * *